US012444466B2

(12) United States Patent
Tsuda et al.

(10) Patent No.: US 12,444,466 B2
(45) Date of Patent: Oct. 14, 2025

(54) MEMORY DEVICE AND METHOD FOR MANUFACTURING THE SAME

(71) Applicant: SEMICONDUCTOR ENERGY LABORATORY CO., LTD., Atsugi (JP)

(72) Inventors: Kazuki Tsuda, Kanagawa (JP); Hiromichi Godo, Kanagawa (JP); Satoru Ohshita, Kanagawa (JP); Hitoshi Kunitake, Kanagawa (JP); Satoru Okamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 596 days.

(21) Appl. No.: 17/791,326

(22) PCT Filed: Dec. 28, 2020

(86) PCT No.: PCT/IB2020/062472
§ 371 (c)(1),
(2) Date: Jul. 7, 2022

(87) PCT Pub. No.: WO2021/144648
PCT Pub. Date: Jul. 22, 2021

(65) Prior Publication Data
US 2023/0352090 A1    Nov. 2, 2023

(30) Foreign Application Priority Data
Jan. 16, 2020    (JP) .................................. 2020-005330

(51) Int. Cl.
*H10B 43/35*    (2023.01)
*G11C 16/04*    (2006.01)
(Continued)

(52) U.S. Cl.
CPC ...... *G11C 16/0483* (2013.01); *H01L 23/5283* (2013.01); *H01L 24/48* (2013.01);
(Continued)

(58) Field of Classification Search
CPC . G11C 16/0483; H01L 23/5283; H01L 24/48; H01L 2224/73265; H01L 2924/00;
(Continued)

(56) References Cited

U.S. PATENT DOCUMENTS 8,455,940 B2    6/2013    Lee et al.
8,877,626 B2    11/2014   Lee et al.
(Continued)

FOREIGN PATENT DOCUMENTS

JP    2018-157205 A    10/2018
JP    2018-157208 A    10/2018
(Continued)

OTHER PUBLICATIONS

International Search Report (Application No. PCT/IB2020/062472) Dated Mar. 23, 2021.
(Continued)

*Primary Examiner* — Michelle Mandala
(74) *Attorney, Agent, or Firm* — Nixon Peabody LLP; Jeffrey L. Costellia

(57) ABSTRACT

A highly reliable memory device is provided. The memory device includes a first conductor, a second conductor above the first conductor, a third conductor above the second conductor, a fourth conductor above the third conductor, a fifth conductor above the fourth conductor, a sixth conductor above the fifth conductor, a seventh conductor, a first insulator, a second insulator, a first semiconductor, and a second semiconductor. At least third conductor and the fourth conductor have an opening. The first insulator, the first semiconductor, the second insulator, and the second semi- (Continued)

conductor are provided in this order on an inner surface of the opening. The seventh conductor is provided between the first semiconductor and the second insulator in a region between the third conductor and the second insulator. The first semiconductor is electrically connected to the second conductor and the fifth conductor. The second semiconductor is electrically connected to the first conductor and the sixth conductor.

18 Claims, 54 Drawing Sheets

(51) Int. Cl.
  *H01L 23/00* (2006.01)
  *H01L 23/528* (2006.01)
  *H10B 41/30* (2023.01)
  *H10B 43/10* (2023.01)
  *H10B 43/27* (2023.01)
  *H10D 30/67* (2025.01)
  *H10B 41/10* (2023.01)
  *H10B 69/00* (2023.01)

(52) U.S. Cl.
  CPC ............ *H10B 41/30* (2023.02); *H10B 43/10* (2023.02); *H10B 43/27* (2023.02); *H10B 43/35* (2023.02); *H10D 30/6755* (2025.01); *H01L 2224/73265* (2013.01); *H01L 2924/00* (2013.01); *H01L 2924/00014* (2013.01); *H01L 2924/181* (2013.01); *H10B 41/10* (2023.02); *H10B 69/00* (2023.02)

(58) Field of Classification Search
  CPC .... H01L 2924/00014; H01L 2924/181; H10B 41/30; H10B 43/10; H10B 43/27; H10B 43/35; H10B 41/10; H10B 69/00; H10D 30/6755; H10D 84/00; H10D 84/0126; H10D 84/038
  See application file for complete search history.

(56) References Cited

U.S. PATENT DOCUMENTS

| | | | |
|---|---|---|---|
| 9,502,431 B2 | 11/2016 | Sakuma et al. | |
| 9,548,124 B1* | 1/2017 | Hazeghi | G11C 7/14 |
| 9,634,097 B2 | 4/2017 | Rabkin et al. | |
| 10,043,808 B1 | 8/2018 | Tezuka et al. | |
| 10,312,239 B2 | 6/2019 | Tezuka et al. | |
| 10,497,712 B2 | 12/2019 | Tezuka et al. | |
| 10,553,601 B2 | 2/2020 | Tezuka et al. | |
| 10,593,693 B2 | 3/2020 | Yamazaki et al. | |
| 10,600,469 B2 | 3/2020 | Kimura et al. | |
| 10,665,604 B2 | 5/2020 | Kimura et al. | |
| 10,839,883 B2 | 11/2020 | Kimura et al. | |
| 10,886,292 B2 | 1/2021 | Kimura et al. | |
| 11,133,336 B2 | 9/2021 | Yakubo et al. | |
| 11,329,065 B2 | 5/2022 | Kimura et al. | |
| 11,335,812 B2 | 5/2022 | Yamazaki et al. | |
| 11,374,012 B2 | 6/2022 | Asami | |
| 12,207,462 B2* | 1/2025 | Tsuda | H10B 43/27 |
| 2011/0065270 A1 | 3/2011 | Shim et al. | |
| 2011/0287612 A1 | 11/2011 | Lee et al. | |
| 2013/0252391 A1 | 9/2013 | Lee et al. | |
| 2015/0060993 A1 | 3/2015 | Lee et al. | |
| 2015/0146489 A1* | 5/2015 | Lee | H10B 43/27 365/185.29 |
| 2016/0079268 A1 | 3/2016 | Sakuma et al. | |
| 2018/0026218 A1 | 1/2018 | Kobayashi et al. | |
| 2018/0129556 A1 | 5/2018 | Aoki et al. | |
| 2018/0269210 A1 | 9/2018 | Tezuka et al. | |
| 2018/0331116 A1* | 11/2018 | Tezuka | G11C 7/18 |
| 2018/0350829 A1 | 12/2018 | Tezuka et al. | |
| 2018/0374529 A1 | 12/2018 | Kimura et al. | |
| 2019/0027493 A1 | 1/2019 | Kimura et al. | |
| 2020/0005878 A1* | 1/2020 | Lu | G11C 11/5642 |
| 2020/0105330 A1 | 4/2020 | Kimura et al. | |
| 2020/0144308 A1 | 5/2020 | Yakubo et al. | |
| 2020/0203339 A1 | 6/2020 | Yamazaki et al. | |
| 2021/0074346 A1 | 3/2021 | Kimura et al. | |
| 2021/0126008 A1* | 4/2021 | Tanabe | H01L 25/50 |
| 2022/0068967 A1 | 3/2022 | Yamazaki et al. | |

FOREIGN PATENT DOCUMENTS

| | | | | |
|---|---|---|---|---|
| JP | 2018-207038 A | | 12/2018 | |
| JP | 2019008862 A | * | 1/2019 | ............ G11C 11/40 |
| JP | 2019024087 A | * | 2/2019 | ............ H01L 29/24 |
| WO | WO-2018207048 A1 | * | 11/2018 | ......... H01L 27/1225 |
| WO | WO-2019/003042 | | 1/2019 | |

OTHER PUBLICATIONS

Written Opinion (Application No. PCT/IB2020/062472) Dated Mar. 23, 2021.

Kimizuka.N et al., "2.4.4 Discussion on Growth Mechanism", Physics and Technology of Crystalline Oxide Semiconductor CAAC-IGZO: Fundamentals, Sep. 15, 2016, pp. 94-97, Wiley.

* cited by examiner

FIG. 9A
|  | Intermediate state New crystalline phase |  |
|---|---|---|
| Amorphous | Crystalline | Crystal |
| ·completely amorphous | ·CAAC<br>·nc<br>·CAC<br><br>excluding single crystal and poly crystal | ·single crystal<br>·poly crystal |
FIG. 9B
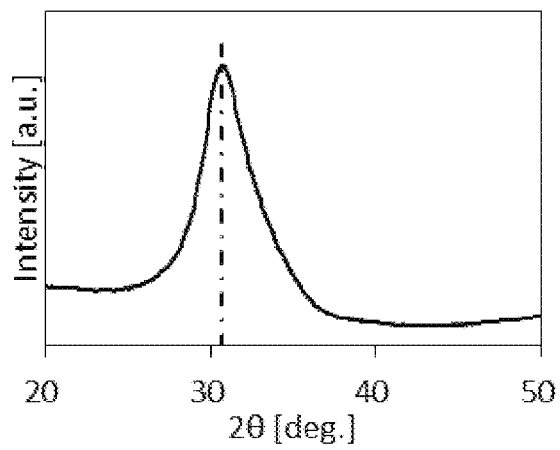
FIG. 9C
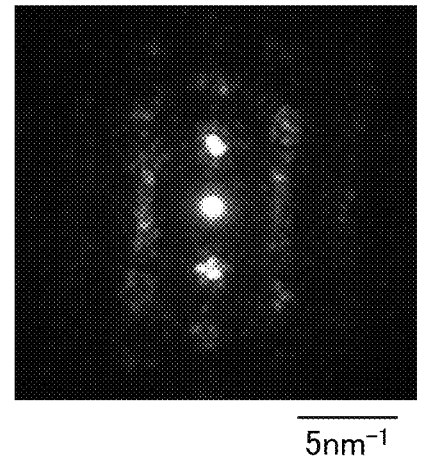

4000

FIG. 40A
FIG. 40B
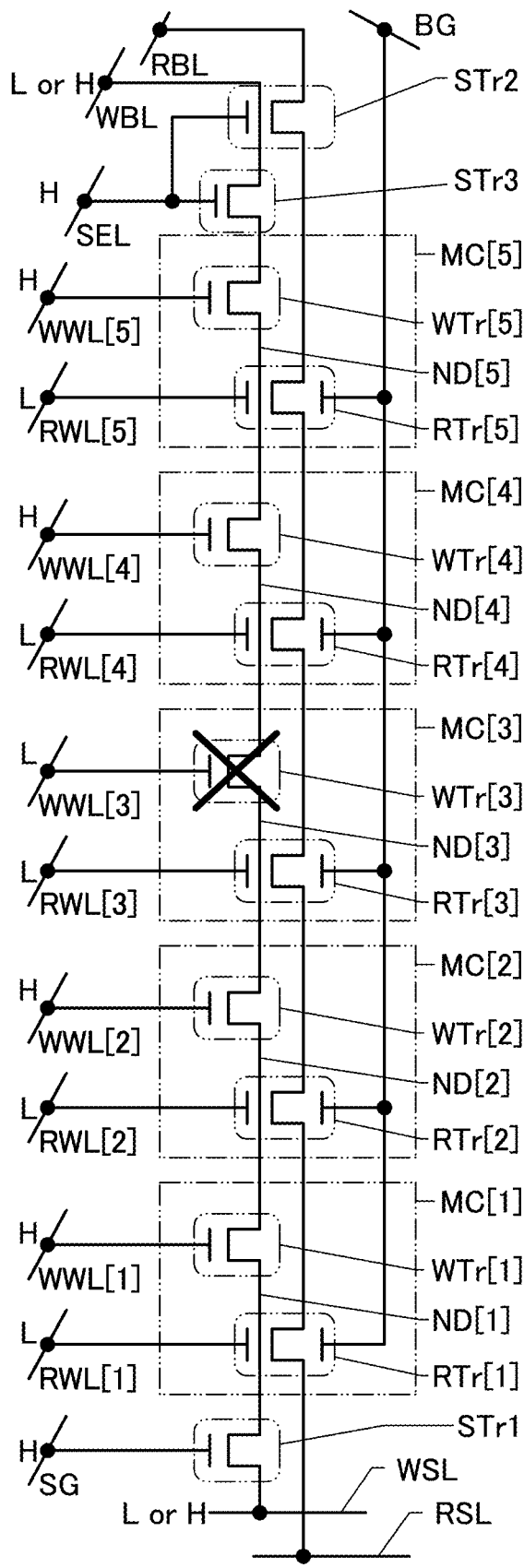
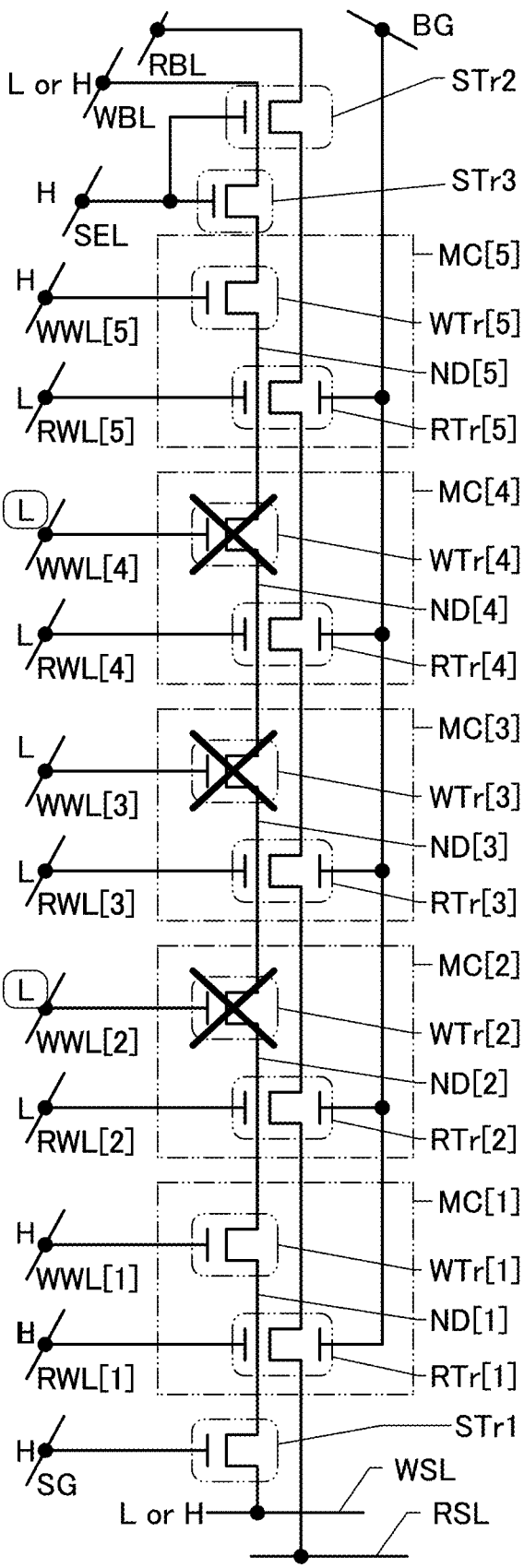

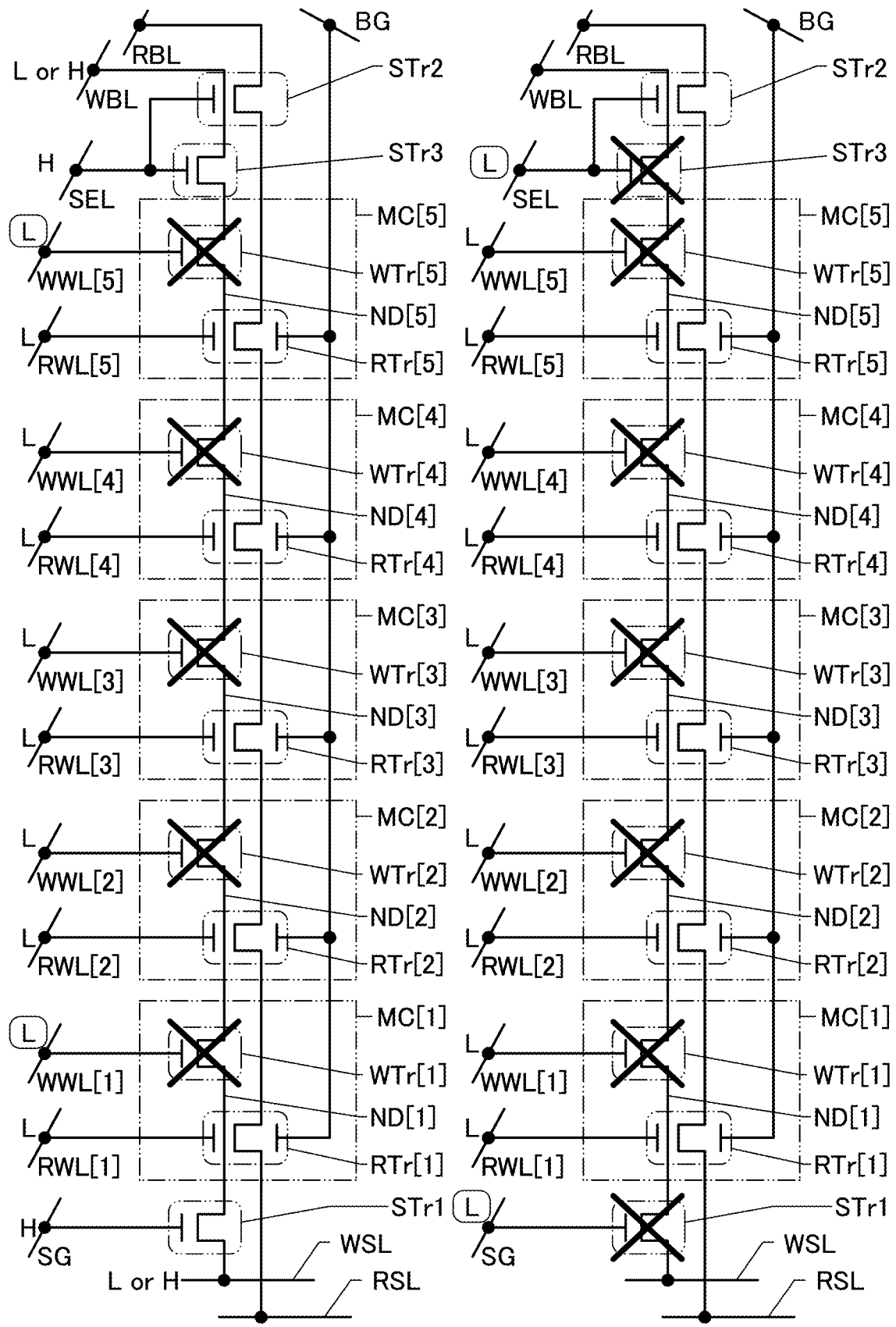

FIG. 43A
FIG. 43B
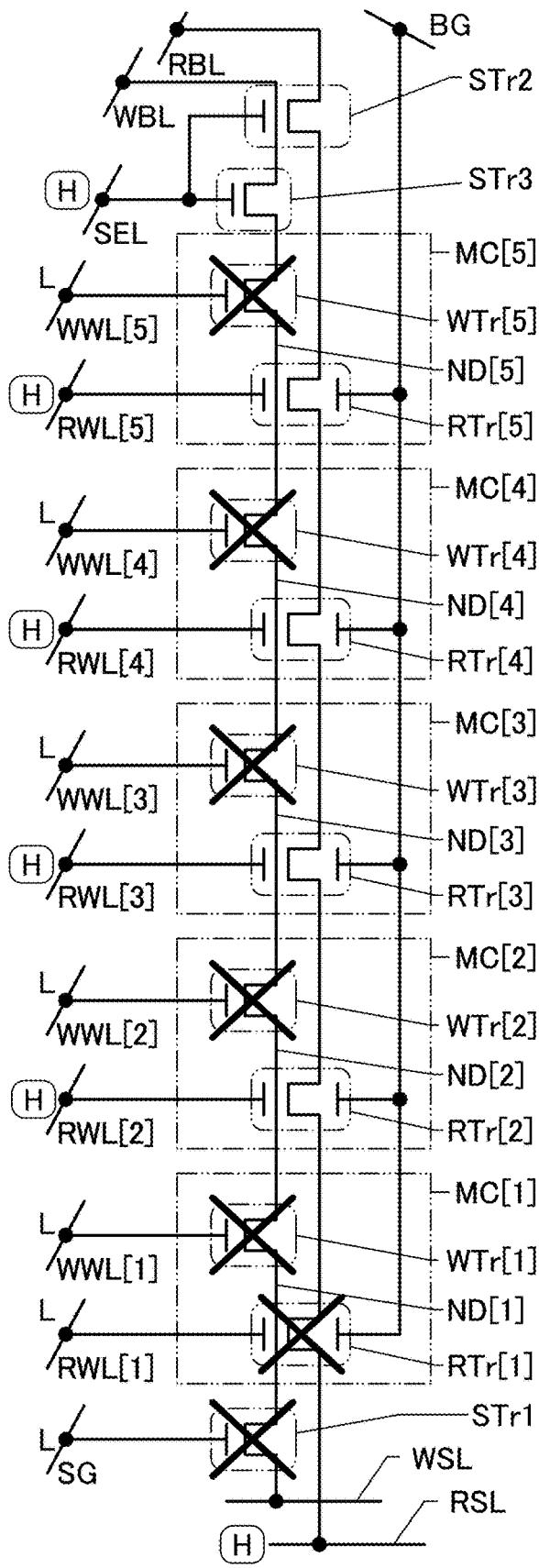
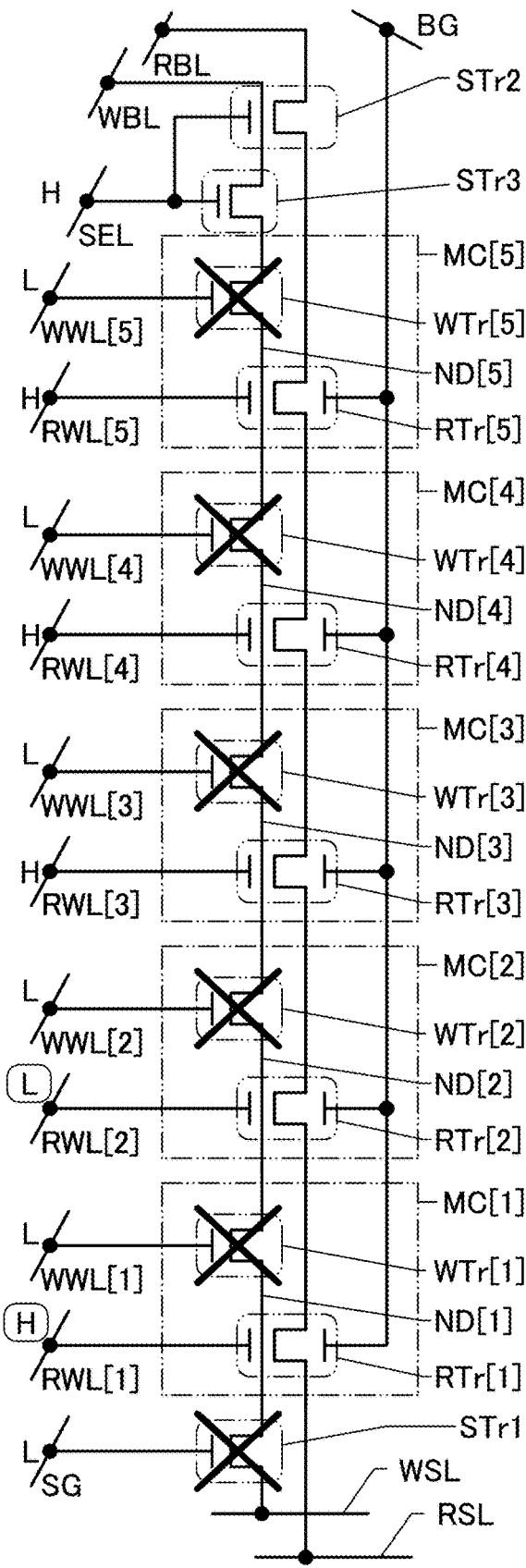

FIG. 44A
FIG. 44B
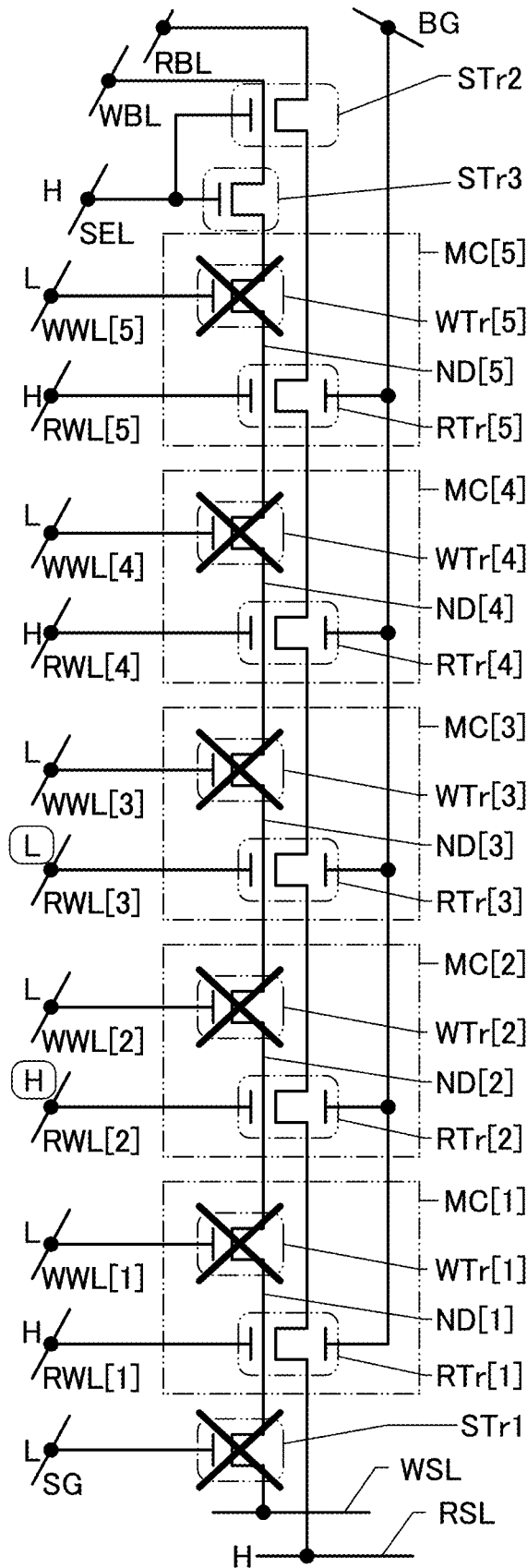
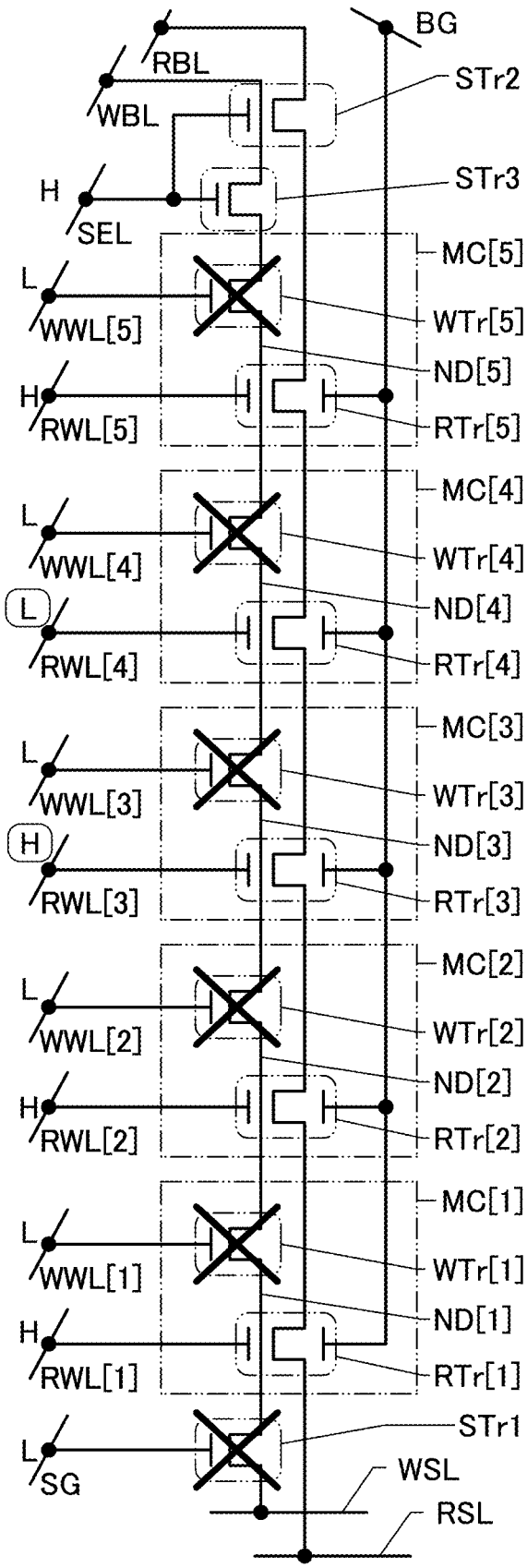

MEMORY DEVICE AND METHOD FOR MANUFACTURING THE SAME

TECHNICAL FIELD

One embodiment of the present invention relates to a semiconductor device and a manufacturing method thereof.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a memory device, an imaging device, a communication device, an electronic device, and the like may include a semiconductor element or a semiconductor circuit. A display device, a light-emitting device, a lighting device, an electro-optical device, a memory device, an imaging device, a communication device, an electronic device, and the like may be referred to as a semiconductor device. One embodiment of the present invention particularly relates to a memory device and a manufacturing method thereof.

BACKGROUND ART

In recent years, with an increasing amount of data subjected to processing, a semiconductor device having a larger storage capacity has been required. To increase storage capacity per unit area, stacking memory cells is effective (see Patent Document 1 and Patent Document 2). Stacking memory cells can increase storage capacity per unit area in accordance with the number of stacked memory cells. Patent Document 3 and Patent Document 4 disclose memory devices that use an oxide semiconductor. Patent Document 5 discloses a semiconductor memory that uses an oxide semiconductor as a charge storage layer.

Non-patent Document 1 discloses CAAC-IGZO as a crystalline oxide semiconductor. Non-patent Document 1 also discloses the growth mechanism and the like of the CAAC-IGZO.

REFERENCE

Patent Document

[Patent Document 1] United States Patent Application Publication No. 2011/0065270A1
[Patent Document 2] U.S. Pat. No. 9,634,097B2
[Patent Document 3] Japanese Published Patent Application No. 2018-207038
[Patent Document 4] Japanese Published Patent Application No. 2019-8862
[Patent Document 5] Japanese Published Patent Application No. 2018-157205

Non-Patent Document

[Non-Patent Document 1] Noboru Kimizuka and Shunpei Yamazaki, "PHYSICS AND TECHNOLOGY OF CRYSTALLINE OXIDE SEMICONDUCTOR CAAC-IGZO" FUNDAMENTALS (the United States), Wiley-SID Series in Display Technology, 2017, p. 94-97

SUMMARY OF THE INVENTION

Problems to be Solved by the Invention

In Patent Document 1 and Patent Document 2, a plurality of memory elements (also referred to as memory cells) are stacked and connected in series, so that a three-dimensional memory cell array (also referred to as a memory string) is formed.

In Patent Document 1, a semiconductor provided in a columnar shape is in contact with an insulator including a charge accumulation layer. In Patent Document 2, a semiconductor provided in a columnar shape is in contact with an insulator functioning as a tunnel dielectric. In both Patent Document 1 and Patent Document 2, writing of data to the memory cells is performed by extraction and injection of charge through the insulator. In this case, trap centers might be formed at the interface where the semiconductor and the insulator are in contact with each other. The trap centers can shift the threshold voltage of the transistor by trapping electrons, in some cases. In addition, one or both of the inside of the insulator and the interface where the semiconductor and the insulator are in contact with each other deteriorate due to the extraction and injection of charge, resulting in the leakage and loss of charge held in the charge accumulation layer in some cases. This can adversely affect the reliability of the memory device.

An object of one embodiment of the present invention is to provide a highly reliable memory device. Another object of one embodiment of the present invention is to provide a memory device with a large storage capacity. Another object of one embodiment of the present invention is to provide a memory device that occupies a small area. Another object of one embodiment of the present invention is to provide a memory device with low manufacturing cost. Another object of one embodiment of the present invention is to provide a highly reliable semiconductor device. Another object of one embodiment of the present invention is to provide a semiconductor device with low manufacturing cost. Another object of one embodiment of the present invention is to provide a novel semiconductor device.

Note that the description of these objects does not preclude the existence of other objects. In one embodiment of the present invention, there is no need to achieve all the objects. Other objects will be apparent from the descriptions of the specification, the drawings, the claims, and the like, and other objects can be derived from the descriptions of the specification, the drawings, the claims, and the like.

Means for Solving the Problems

One embodiment of the present invention is a memory device including a first conductor, a second conductor above the first conductor, a third conductor above the second conductor, a fourth conductor above the third conductor, a fifth conductor above the fourth conductor, a sixth conductor above the fifth conductor, a seventh conductor, a first insulator, a second insulator, a first semiconductor, and a second semiconductor. At least the third conductor and the fourth conductor have an opening. The first insulator, the first semiconductor, the second insulator, and the second semiconductor are provided in this order on an inner side surface of the opening. In a region between the third conductor and the second insulator, the seventh conductor is provided between the first semiconductor and the second insulator. The first semiconductor is electrically connected to the second conductor and the fifth conductor. The second semiconductor is electrically connected to the first conductor and the sixth conductor.

In the above, it is preferable that the first insulator, the first semiconductor, the seventh conductor, the second insulator, and the second semiconductor be each provided as a concentric layer inside the opening of the third conductor.

In the above, it is preferable that the first insulator, the first semiconductor, the second insulator, and the second semiconductor be each provided as a concentric layer inside the opening of the fourth conductor.

In the above, the first semiconductor is preferably a first oxide semiconductor.

In the above, the first oxide semiconductor preferably contains indium, an element M (the element M is one or more selected from aluminum, gallium, yttrium, tin, and titanium), and zinc.

In the above, the second semiconductor is preferably a second oxide semiconductor.

In the above, the first oxide semiconductor preferably contains indium, an element M (the element M is one or more selected from aluminum, gallium, yttrium, tin, and titanium), and zinc.

In the above, it is preferable that the second conductor and the fifth conductor also have the opening, so that the second insulator is provided between the second conductor and the second semiconductor and that the second insulator is provided between the fifth conductor and the second semiconductor.

Another embodiment of the present invention is a method for manufacturing a memory device including steps of forming a first conductor, forming a second conductor above the first conductor, forming a first semiconductor electrically connected to the second conductor, forming an opening in the first semiconductor and the second conductor, forming an insulator in the opening to cover a side surface of the first semiconductor and a side surface of the second conductor, and forming a second semiconductor electrically connected to the first conductor. The insulator is provided between the first semiconductor and the second semiconductor, and the insulator is provided between the second conductor and the second semiconductor.

In the above, the first semiconductor is preferably a first oxide semiconductor.

In the above, the first oxide semiconductor preferably contains indium, an element M (the element M is one or more selected from aluminum, gallium, yttrium, tin, and titanium), and zinc.

In the above, the second semiconductor is preferably a second oxide semiconductor.

In the above, the second oxide semiconductor preferably contains indium, an element M (the element M is one or more selected from aluminum, gallium, yttrium, tin, and titanium), and zinc.

Another embodiment of the present invention is a method for manufacturing a memory device including steps of forming a first conductor, forming a second conductor above the first conductor, processing the first conductor and the second conductor so that the second conductor has a smaller width than the first conductor, forming a third conductor above the second conductor, forming an opening in the third conductor, the second conductor, and the first conductor, forming an insulator in the opening, and forming a semiconductor in the opening. The insulator is provided between the first conductor and the semiconductor, and the insulator is provided between the second conductor and the semiconductor.

In the above, the semiconductor is preferably an oxide semiconductor.

In the above, the oxide semiconductor preferably contains indium, an element M (the element M is one or more selected from aluminum, gallium, yttrium, tin, and titanium), and zinc.

Effect of the Invention

In manufacture of a three-dimensional memory cell array in which a plurality of memory elements are stacked and connected in series, the total number of steps can be smaller than the product of the number of stacked memory elements and the number of steps for manufacturing one memory element, which is preferable. This means that, the number of manufacturing steps of the memory cell array is not proportional to the number of stacked memory elements. For example, when the number of manufacturing steps of a memory cell array A including 4 memory elements is compared with the number of manufacturing steps of a memory cell array B including 32 memory elements, the number of manufacturing steps of the memory cell array B can be significantly smaller than eight times the number of manufacturing steps of the memory cell array A in spite of the number of stacked memory elements eight times larger.

One embodiment of the present invention can provide a highly reliable memory device. One embodiment of the present invention can provide a memory device with a large storage capacity. One embodiment of the present invention can provide a memory device that occupies a small area. One embodiment of the present invention can provide a memory device with low manufacturing cost. One embodiment of the present invention can provide a highly reliable semiconductor device. One embodiment of the present invention can provide a semiconductor device with low manufacturing cost. One embodiment of the present invention can provide a novel semiconductor device.

Note that the description of these effects does not preclude the existence of other effects. One embodiment of the present invention does not have to have all these effects. Other effects will be apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 9A is a table showing a classification of crystal structures. FIG. 9B is a graph showing an XRD spectrum of a CAAC-IGZO film. FIG. 9C is an image showing a nanobeam electron diffraction pattern of a CAAC-IGZO film.

FIG. 40A and FIG. 40B are circuit diagrams each illustrating a writing operation example of a memory string.

FIG. 41A and FIG. 41B are circuit diagrams each illustrating a writing operation example of a memory string.

FIG. 43A and FIG. 43B are circuit diagrams each illustrating a reading operation example of a memory string.

FIG. 44A and FIG. 44B are circuit diagrams each illustrating a reading operation example of a memory string.

MODE FOR CARRYING OUT THE INVENTION

Figure 1A:
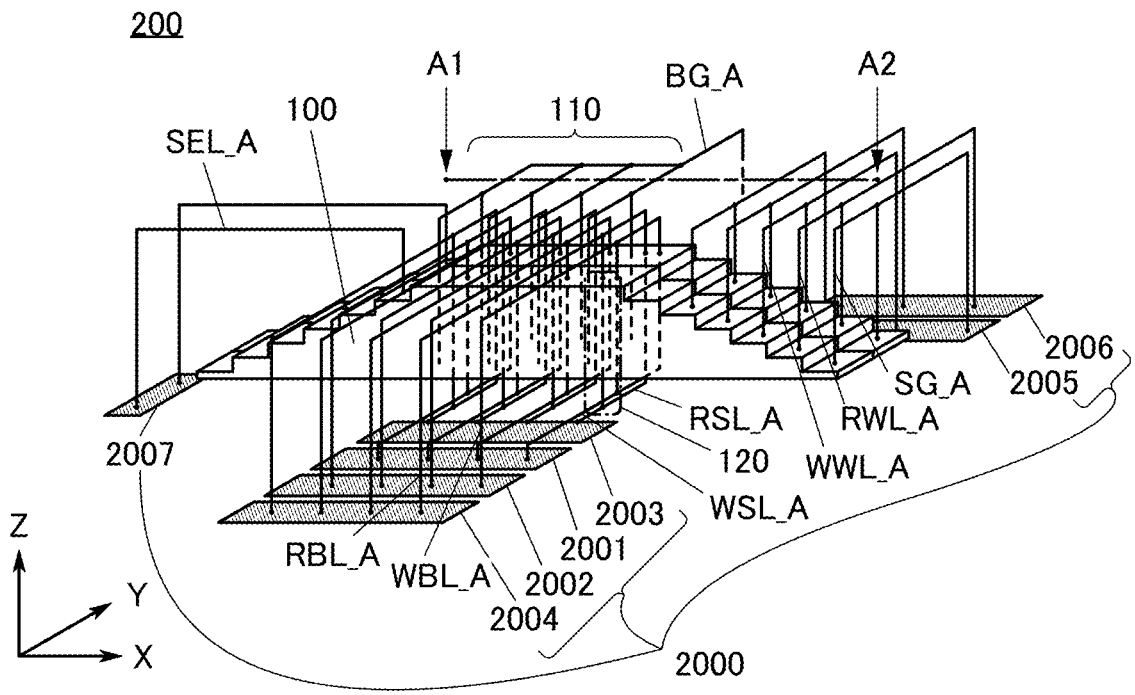
FIG. 1A and FIG. 1B are perspective views of a memory device.

Embodiments will be described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

In addition, the position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in drawings and the like. For example, in the actual manufacturing process, a resist mask or the like might be unintentionally reduced in size by treatment such as etching, which is not illustrated in some cases for easy understanding.

In drawings and the like, some components might be omitted for easy understanding of the explanation.

In addition, in this specification and the like, the terms "electrode" and "wiring" do not functionally limit these components. For example, an "electrode" is used as part of a wiring in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed on and in direct contact with the insulating layer A, and does not exclude the case where another component is provided between the insulating layer A and the electrode B.

In addition, functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values or in describing objects, methods, events, and the like that can be converted into calculation values or measurement values allow for a margin of error of ±20% unless otherwise specified.

In addition, a voltage refers to a potential difference between a certain potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" described in this specification can be replaced with each other in some cases.

Furthermore, a "semiconductor" has characteristics of a "conductor" when conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the SCOPE OF claims in order to avoid confusion among components. Furthermore, a term with an ordinal number in this specification and the like might be provided with a different ordinal number in the SCOPE OF CLAIMS. Furthermore, even when a term is provided with an ordinal number in this specification and the like, the ordinal number might be omitted in the SCOPE OF CLAIMS and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). VSS refers to a power supply potential at a potential lower than VDD. A ground potential (hereinafter, also simply referred to as "GND" or "GND potential") can be used as VDD or VSS. For example, in the case where VDD is a ground potential, VSS is a potential lower than the ground potential, and in the case where VSS is a ground potential, VDD is a potential higher than the ground potential.

Unless otherwise specified, transistors described in this specification and the like are enhancement (normally-off) n-channel field-effect transistors. Thus, the threshold voltage (also referred to as "Vth") is higher than 0 V. In addition, unless otherwise specified, the phrase "an H potential is supplied to a gate of a transistor" means that "the transistor is turned on" in some cases. Also, unless otherwise specified, the phrase "an L potential is supplied to a gate of a transistor" means that "the transistor is turned off" in some cases.

In addition, in this specification and the like, a gate refers to part or the whole of a gate electrode and a gate wiring. A gate wiring refers to a wiring for electrically connecting at least one gate electrode of a transistor to another electrode or another wiring.

Furthermore, in this specification and the like, a source refers to part or the whole of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

Moreover, in this specification and the like, a drain refers to part or the whole of a drain region, a drain electrode, or a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the potentials of a wiring, an electrode and the like, "H" representing an H potential or "L" representing an L potential is sometimes written near the wiring, the electrode, and the like. In addition, enclosed "H" or "L" is sometimes written near a wiring, an electrode, and the like whose potential changes. Moreover, a symbol "x" is sometimes written on a transistor in an off state.

In general, a "capacitor" has a structure where two electrodes face each other with an insulator (dielectric) therebetween. This specification and the like include a case where a "capacitor element" is the above-described "capacitor". That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, when a plurality of components are denoted by the same reference signs, and in particular need to be distinguished from each other, an identification sign such as "_1", "_2", "[n]", or "[m, n]" is sometimes added to the reference signs. For example, the second conductor WWL may be expressed as a conductor WWL[2].

Embodiment 1

FIG. 1A is a perspective view of a semiconductor device 200 including a memory device 100 of one embodiment of the present invention and a driver circuit 2000. The memory device 100 is a memory device having a three-dimensional stacked-layer structure.

The driver circuit 2000 includes a WSL driver 2001, a WBL driver 2002, an RSL driver 2003, an RBL driver 2004, and a WWL driver 2005, an RWL driver 2006, an SEL driver 2007, and the like. Note that the RBL driver 2004 may have a function of a sense amplifier. The RSL driver 2003 may be connected to a ground.

The WSL driver 2001 is connected to the memory device 100 through a wiring WSL_A. The WBL driver 2002 is connected to the memory device 100 through a wiring WBL_A. The RSL driver 2003 is connected to the memory device 100 through a wiring RSL_A. The RBL driver 2004 is connected to the memory device 100 through a wiring RBL_A. The WWL driver 2005 is connected to the memory device 100 through one or both of a wiring WWL_A and a wiring SG_A. The RWL driver 2006 is connected to the memory device 100 through a wiring RWL_A. The SEL driver 2007 is connected to the memory device 100 through a wiring SEL_A. A wiring BG A is connected to a back gate of the memory device 100.

Figure 1B:
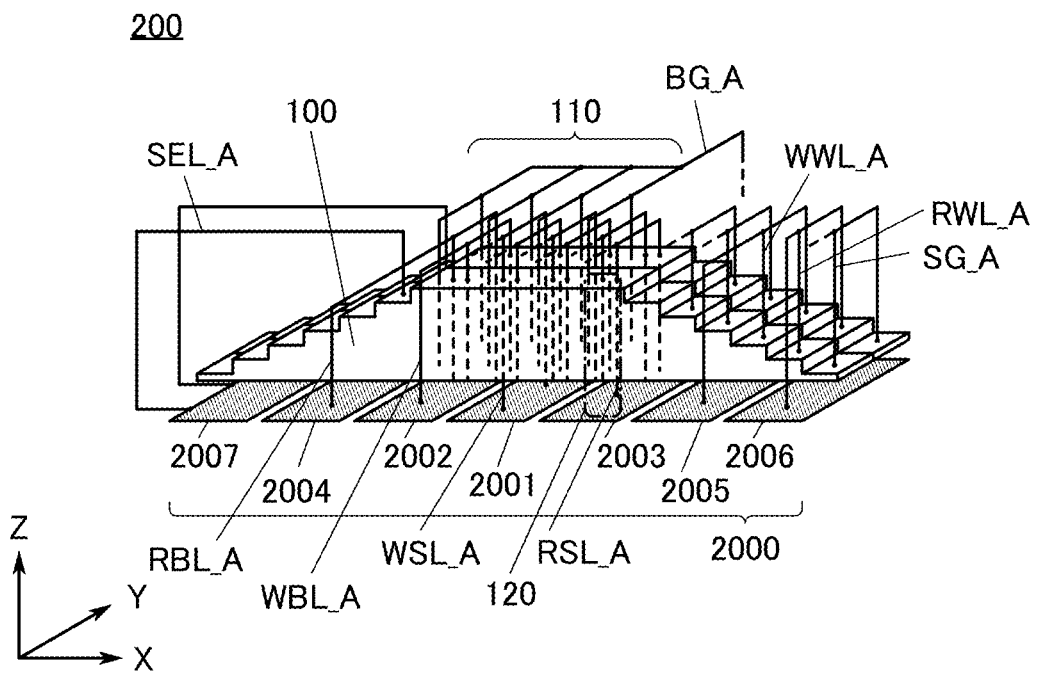

The memory device 100 is preferably provided above a layer where the driver circuit 2000 is provided. It is preferable to provide the memory device 100 to partly overlap with the driver circuit as illustrated in FIG. 1B, in which case the area occupied by the semiconductor device 200 can be reduced. In the case where the memory device 100 and the driver circuit overlap with each other, the memory device 100 may overlap with the whole of the driver circuit or part thereof. Furthermore, the memory device 100 may overlap with a specific circuit included in the driver circuit. For example, a sense amplifier may be located so that the memory device 100 can overlap with the sense amplifier.

One of features of the semiconductor device 200 of one embodiment of the present invention is to include the wiring WSL_A that functions as a writing source line and the wiring RSL_A that functions as a reading source line; however, it is not limited thereto. The wiring WSL_A and the wiring RSL_A may be connected to each other and connected to a driver circuit that functions as a source line driver.

One of features of the semiconductor device 200 of one embodiment of the present invention is to include the wiring WBL_A that functions as a writing bit line and the wiring RBL_A that functions as a reading bit line; however, it is not limited thereto. The wiring WBL_A and the wiring RBL_A may be connected to each other and connected to a driver circuit that functions as a bit line driver.

Note that arrows indicating the X direction, the Y direction, and the Z direction are illustrated in FIG. 1A and the like. The X direction, the Y direction, and the Z direction are directions orthogonal to each other. In this specification and the like, one of the X direction, the Y direction, and the Z direction may be referred to as a "first direction". Another one of the directions may be referred to as a "second direction". The remaining one of the directions may be referred to as a "third direction". In this specification and the like, a direction perpendicular to a top surface of a base 121 described later is the Z direction.

Figure 2:
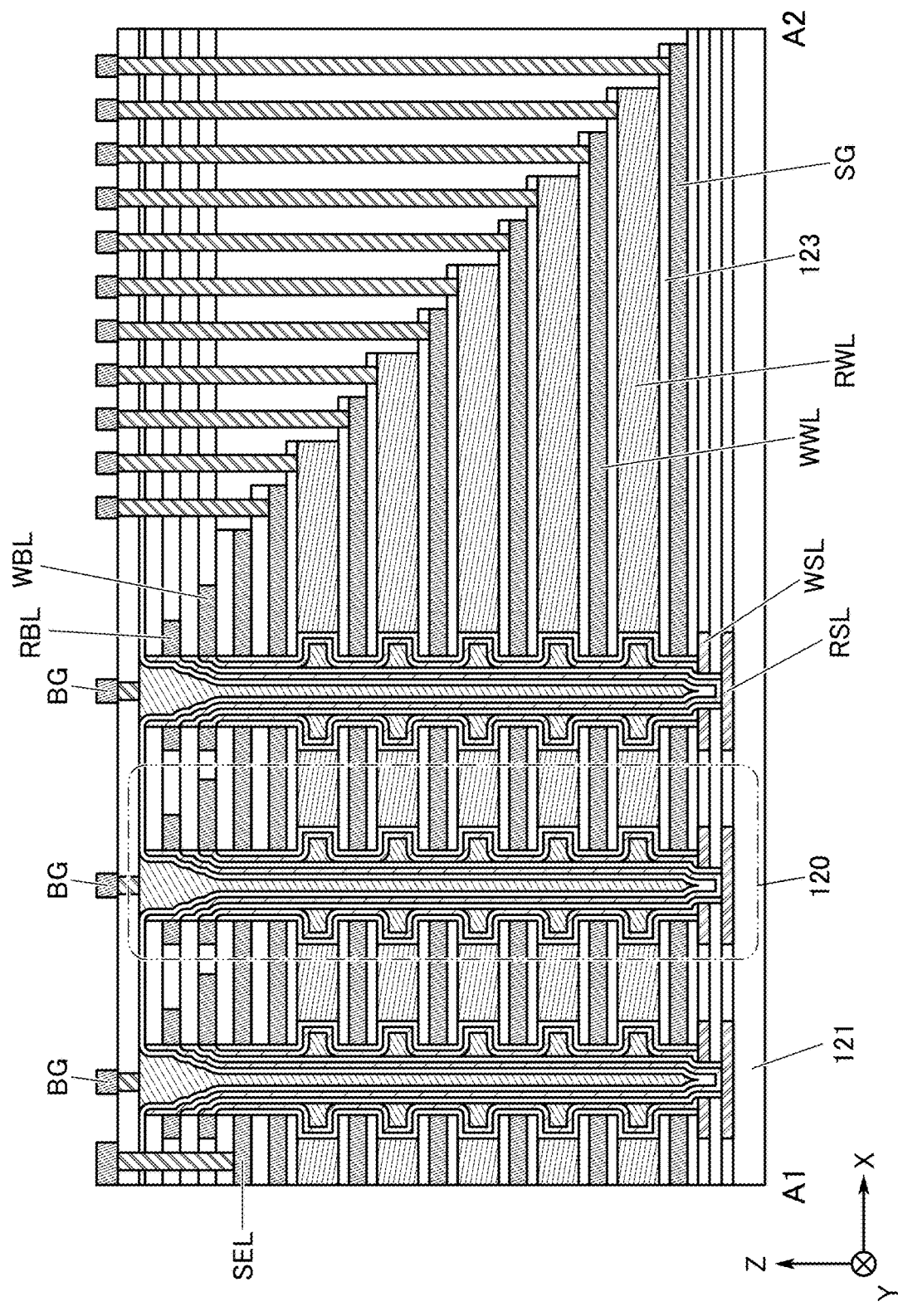
FIG. 2 is a cross-sectional view of a memory device.

FIG. 2 illustrates a cross section along the X-Z plane. FIG. 2 is a cross-sectional view of a portion A1-A2 indicated by a dashed-dotted line in FIG. 1 and a connection portion between a conductor SEL and a wiring. As described above, some components might be omitted in FIG. 1, FIG. 2, and the like for easy understanding of the explanation.

<Structure Example of Memory Device>

The memory device 100 of one embodiment of the present invention includes a memory cell array 110. The memory cell array 110 includes a plurality of memory strings 120. The memory strings 120 extend in the Z direction and are arranged in a matrix on the X-Y plane.

Figure 3:
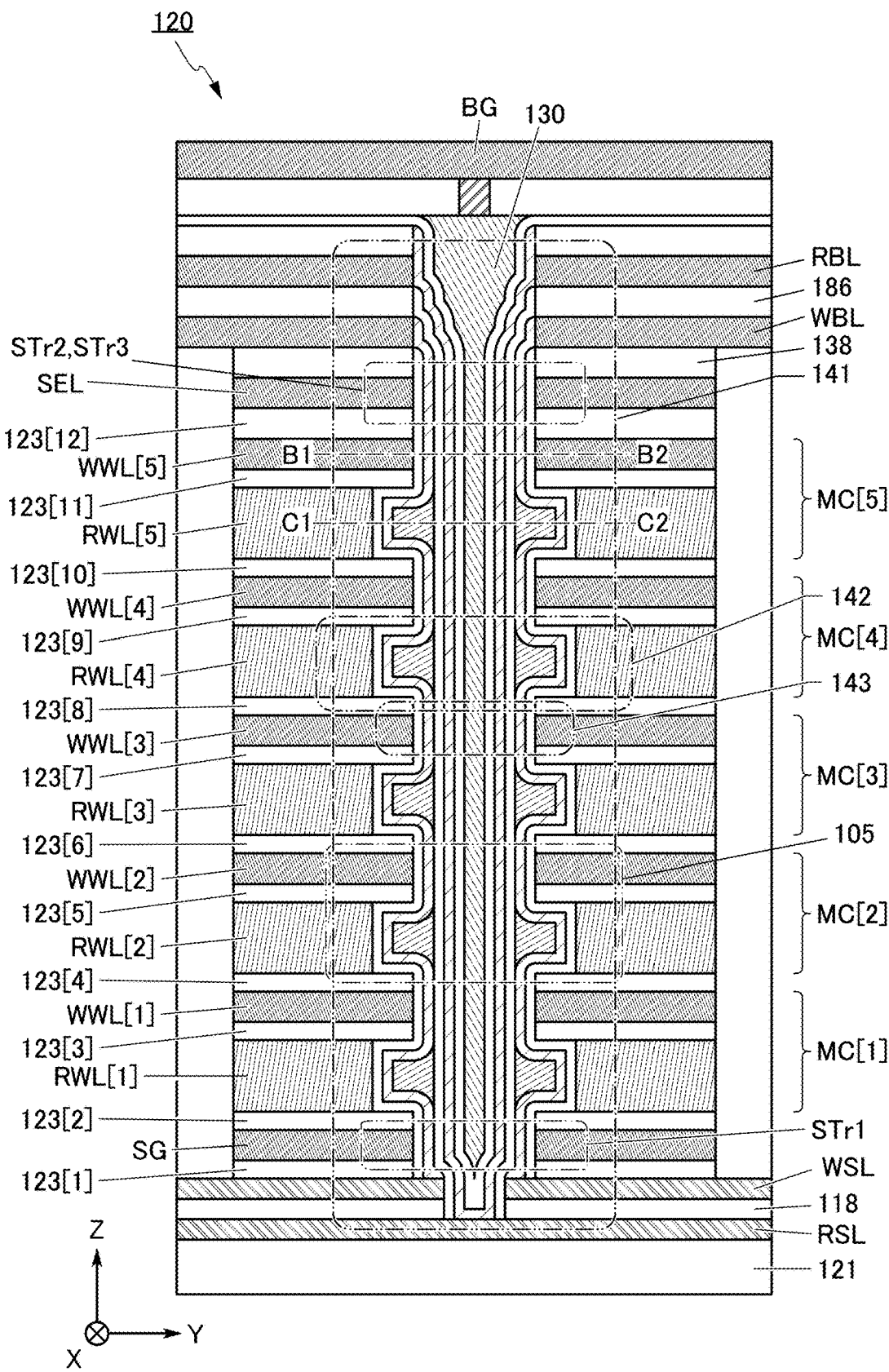
FIG. 3 is a cross-sectional view of a memory string.
Figure 4:
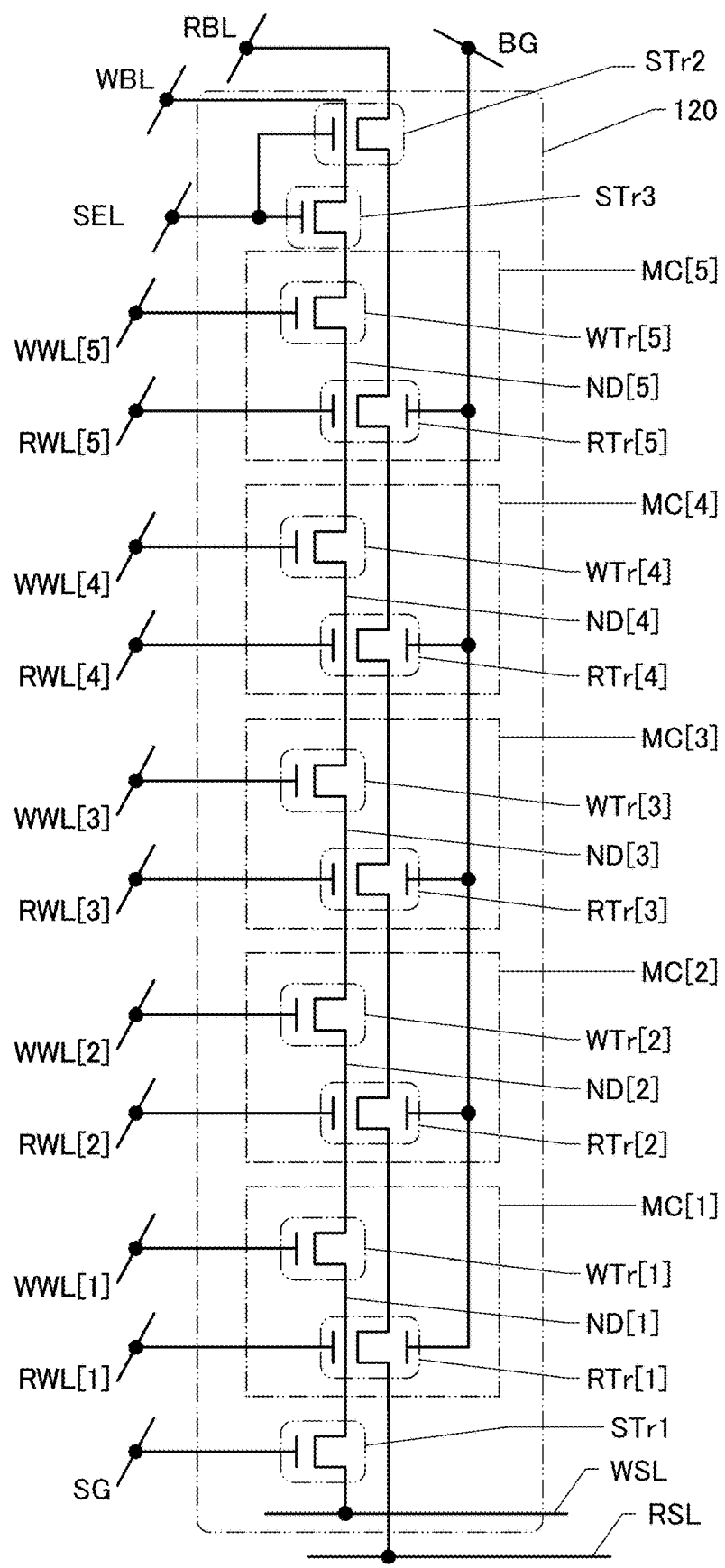
FIG. 4 is a circuit diagram of a memory string.

FIG. 3 illustrates a cross-sectional structure example of the memory string 120 of one embodiment of the present invention. FIG. 4 illustrates a circuit diagram corresponding thereto. The memory string 120 has a structure in which a plurality of memory elements MC (also referred to as "memory cells") are connected in series. Although the case where five memory elements MC are connected in series is described in this embodiment, the number of memory elements MC provided in the memory string 120 is not limited to five. Given that the number of memory elements MC provided in the memory string 120 is n, n is an integer of 2 or more.

Furthermore, the memory string 120 includes a plurality of conductors WWL, a plurality of conductors RWL, a conductor SG, and a conductor SEL. The conductor WWL functions as part of the wiring WWL_A, the conductor RWL functions as part of the wiring RWL_A, the conductor SG functions as part of the wiring SG_A, and the conductor SEL functions as part of the wiring SEL_A. The plurality of conductors WWL and the plurality of conductors RWL are alternately stacked with insulators 123 therebetween. The conductor SG is provided in a layer below the plurality of conductors WWL and the plurality of conductors RWL. A conductor WSL is provided below the conductor SG, and a conductor RSL is provided below the conductor WSL. The conductor SEL is provided in a layer above the plurality of conductors WWL and the plurality of conductors RWL. A conductor WBL is provided in a layer above the conductor SEL, and a conductor RBL is provided in a layer above the conductor WBL.

FIG. 3 and FIG. 4 illustrate the five memory elements MC as a memory element MC[1] to a memory element MC[5]. Note that the memory element MC[1] to the memory element MC[5] are simply referred to as the "memory element MC" when matters common to these memory elements are explained. The same applies to other components such as the conductor WWL, the conductor RWL, and the insulator 123.

The memory string 120 includes a transistor STr1 connected to the memory element MC[1] and a transistor STr2 connected to the memory element MC[5].

The conductor WWL, the conductor RWL, the conductor SG, and the conductor SEL extend beyond the memory cell array 110 into the X-axis direction. Furthermore, the conductor WWL, the conductor RWL, the conductor SG, and the conductor SEL are stacked stepwise outside the memory cell array 110 (see FIG. 1 and FIG. 2). On the other hand, the conductor WSL, the conductor RSL, the conductor WBL, and the conductor RBL extend beyond the memory cell array 110 into the Y-axis direction (see FIG. 1 and FIG. 3).

Figure 5A:
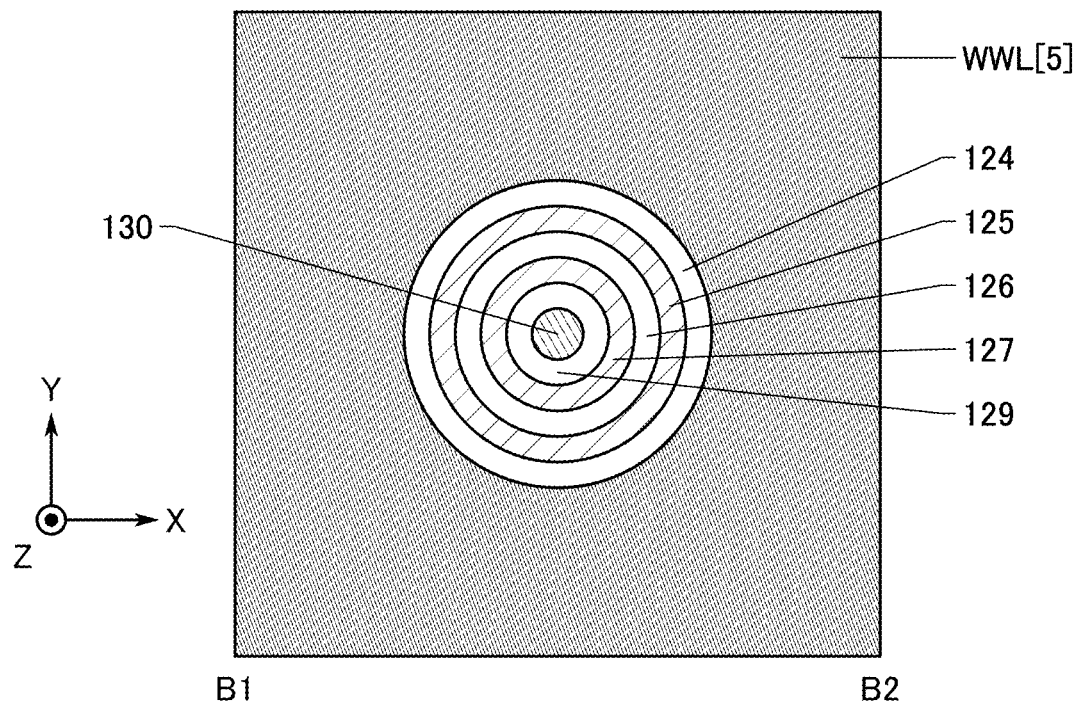
FIG. 5A and FIG. 5B are cross-sectional views of a memory string.
Figure 5B:
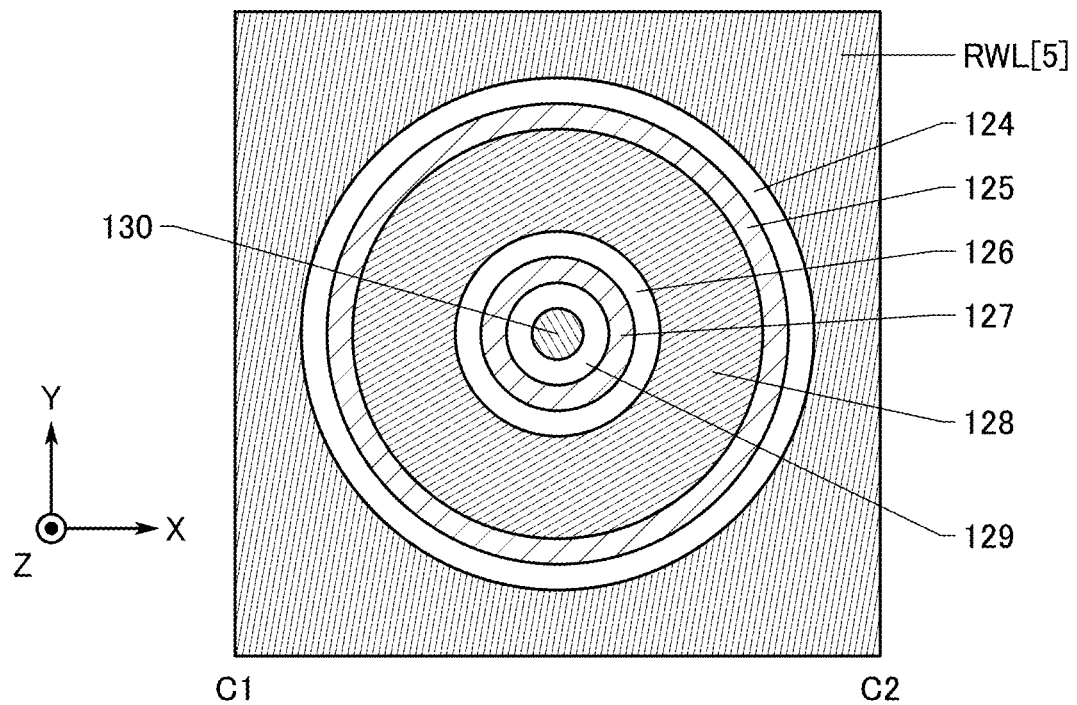
Figure 6:
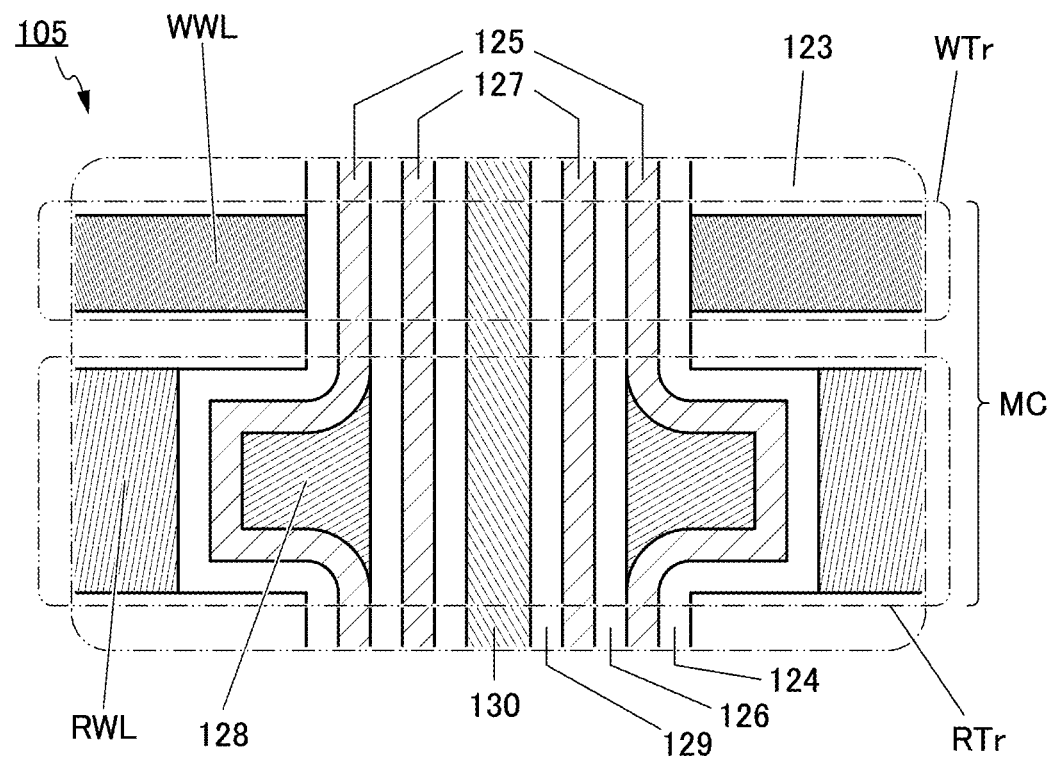
FIG. 6 is a cross-sectional view of a memory element.

FIG. 5A illustrates a cross section of the X-Y plane including a portion B1-B2 indicated by a dashed-dotted line in FIG. 3 when seen from the Z direction. FIG. 5B illustrates a cross section of the X-Y plane including a portion C1-C2 indicated by a dashed-dotted line in FIG. 3 when seen from the Z direction. FIG. 6 is an enlarged view of a region 105 indicated by a dashed double-dotted line in FIG. 3. FIG. 6 corresponds to a cross-sectional view of the memory element MC.

The memory string 120 includes the conductor RSL that functions as part of the wiring RSL_A over the base 121 and the conductor WSL that functions as part of the wiring WSL_A over the conductor RSL with an insulator 118 therebetween. As the base 121, an insulator is used, for example. In addition, an insulator 123[1], the conductor SG, an insulator 123[2], a conductor RWL[1], an insulator 123[3], a conductor WWL[1], an insulator 123[4], a conductor RWL[2], an insulator 123[5], a conductor WWL[2], an insulator 123[6], a conductor RWL[3], an insulator 123[7], a conductor WWL[3], an insulator 123[8], a conductor RWL[4], an insulator 123[9], a conductor WWL[4], an insulator 123[10], a conductor RWL[5], an insulator 123[11], a conductor WWL[5], an insulator 123[12], and the conductor SEL are included over the conductor WSL (see FIG. 3). Furthermore, the memory string 120 includes the conductor WBL that functions as part of the wiring WBL_A over the conductor SEL with an insulator 138 therebetween and the conductor RBL that functions as part of the wiring RBL_A over the conductor WBL with an insulator 186 therebetween.

Furthermore, the memory string 120 includes an opening 141 which is formed by removing part of each of the insulator 118, the conductor WSL, the insulator 123[1], the conductor SG, the insulator 123[2], the conductor RWL[1], the insulator 123[3], the conductor WWL[1], the insulator 123[4], the conductor RWL[2], the insulator 123[5], the conductor WWL[2], the insulator 123[6], the conductor RWL[3], the insulator 123[7], the conductor WWL[3], the insulator 123[8], the conductor RWL[4], the insulator 123[9], the conductor WWL[4], the insulator 123[10], the conductor RWL[5], the insulator 123[11], the conductor WWL[5], the insulator 123[12], and the conductor SEL, the insulator 138, the conductor WBL, the insulator 186, and the conductor RBL.

The opening 141 extends in the Z direction and reaches the conductor WSL and the conductor RSL. In the opening 141, the diameter of a region 142 overlapping with the conductor RWL is larger than the diameter of a region 143 overlapping with the conductor WWL. Thus, a side surface of the opening 141 has projections and depressions.

An insulator 124 and a semiconductor 125 are provided along the side surface of the opening 141. The semiconductor 125 includes a region overlapping with the side surface of the opening 141 with the insulator 124 therebetween.

Furthermore, the memory string 120 includes a conductor 130 extending in the Z direction. The conductor 130 is provided in or in the vicinity of the center of the opening 141. A region of the conductor 130 overlapping with the side surface of the opening 141 is provided with an insulator 129, a semiconductor 127, and an insulator 126. The semiconductor 127 includes a region overlapping with a side surface of the conductor 130 with the insulator 129 therebetween. The insulator 126 includes a region overlapping with the side surface of the conductor 130 with the insulator 129 and the semiconductor 127 therebetween. The semiconductor 127 includes a region electrically connected to the conductor RSL in a bottom portion of the opening 141 and a region electrically connected to the conductor RBL in an upper portion of the opening 141. The semiconductor 125 includes a region electrically connected to the conductor WSL in the bottom portion of the opening 141 and a region electrically connected to the conductor WBL in the upper portion of the opening 141. In the bottom portion of the opening 141, the conductor 130 includes a region overlapping with the conductor RSL with the insulator 129 and the semiconductor 127 therebetween. In a region where the conductor RWL and the conductor 130 overlap with each other, a conductor 128 is provided between the semiconductor 125 and the insulator 126.

The insulator 124, the semiconductor 125, the insulator 126, the semiconductor 127, and the insulator 129 are provided in this order from the conductor WWL side between the conductor WWL and the conductor 130 (see FIG. 5A). Between the conductor RWL and the conductor 130, the insulator 124, the semiconductor 125, the conductor 128, the insulator 126, the semiconductor 127, and the insulator 129 are provided in this order from the conductor RWL side (see FIG. 5B).

The memory element MC includes a transistor WTr and a transistor RTr (see FIG. 6). A region where the conductor WWL and the conductor 130 overlap with each other functions as the transistor WTr. The conductor WWL functions as a gate electrode of the transistor WTr, and the conductor 130 functions as a back gate electrode of the transistor WTr. Part of the semiconductor 125 functions as a semiconductor layer where a channel of the transistor WTr is formed. The semiconductor layer where the channel of the transistor WTr is formed overlaps with the gate electrode (the conductor WWL) with part of the insulator 124 therebetween. Note that although part of the conductor WWL functions as the gate electrode in the example described in this embodiment and the like, the gate electrode and the conductor WWL may be provided independently and they may be electrically connected to each other.

A region where the conductor 128, the conductor RWL, and the conductor 130 overlap with one another functions as the transistor RTr. The conductor RWL functions as a gate electrode of the transistor RTr. The conductor 130 functions as a back gate electrode of the transistor RTr. Part of the semiconductor 127 functions as a semiconductor layer where a channel of the transistor RTr is formed. The semiconductor layer where the channel of the transistor RTr is formed overlaps with the gate electrode (the conductor RWL) with part of each of the insulator 126, the conductor 128, the semiconductor 125, and the insulator 124 therebetween. The semiconductor layer where the channel of the transistor RTr is formed overlaps with the back gate electrode (the conductor 130) with part of the insulator 129 therebetween.

One of a source and a drain of the transistor STr1 is electrically connected to the semiconductor 125 included in the transistor WTr. The other of the source and the drain of the transistor STr1 is electrically connected to the conductor WSL. One of the source and the drain of the transistor STr2 is electrically connected to the semiconductor 127 included in the transistor RTr. The other of the source and the drain of the transistor STr2 is electrically connected to the conductor RBL. One of the source and the drain of the transistor STr3 is electrically connected to the semiconductor 125 included in the transistor WTr. The other of the source and the drain of the transistor STr3 is electrically connected to the conductor WBL. Here, the conductor SEL functions as gates of the transistor STr2 and the transistor STr3 (see FIG. 3 and FIG. 4). Part of the semiconductor 127 functions as a semiconductor layer where a channel is formed in the transistor STr2, and part of the semiconductor 125 functions as a semiconductor layer where a channel is formed in the transistor STr3.

Here, a back gate is described. A gate and a back gate are positioned so as to overlap with each other with a channel formation region of a semiconductor layer therebetween. The back gate can function like the gate. By changing the potential of the back gate, the threshold voltage of the transistor can be changed. One of the gate and the back gate is referred to as a "first gate" and the other is referred to as a "second gate," in some cases.

The gate and the back gate are formed using conductive layers, semiconductor layers with low resistivity, or the like and thus each have a function of preventing an electric field generated outside the transistor from influencing the semiconductor layer where a channel is formed (particularly, a function of preventing static electricity). Specifically, a variation in the electrical characteristics of the transistor due to the influence of an external electric field such as static electricity can be prevented.

Controlling the potential of the back gate can control the threshold voltage of the transistor. The potential of the back gate may be the same as the potential of the gate or may be a ground potential (GND potential) or a given potential.

For the semiconductor layers where the channels of the transistor WTr and the transistor RTr are formed, a single crystal semiconductor, a polycrystalline semiconductor, a microcrystalline semiconductor, an amorphous semiconductor, or the like can be used alone or in combination. As a semiconductor material, silicon and germanium can be used, for example. A compound semiconductor such as silicon germanium, silicon carbide, gallium arsenide, an oxide semiconductor, or a nitride semiconductor may be used. The same applies to the transistor STr1, the transistor STr2, and the transistor Str3.

Note that the semiconductor layers may be stacked in the transistor. In that case, the stacked semiconductor layers may include different semiconductor materials or semiconductors with different crystal states.

The semiconductor layers used for the transistor WTr, the transistor RTr, the transistor STr1, the transistor STr2, and the transistor Str3 are preferably oxide semiconductors including a metal oxide. A transistor that uses a metal oxide in its semiconductor layer achieves a higher field effect mobility than a transistor that uses amorphous silicon in its semiconductor layer. Furthermore, in a transistor that uses polycrystalline silicon in its semiconductor layer, a grain boundary might be generated in the semiconductor layer. It is highly probable that the grain boundary traps carriers and thus decreases the on-state current and field-effect mobility of the transistor, for example. By contrast, although the details are described later, an oxide semiconductor can achieve a crystal structure in which a clear grain boundary is not observed or a crystal structure in which the number of grain boundaries is extremely small. Using such an oxide semiconductor in a semiconductor layer is preferable to obtain a transistor with favorable electrical characteristics such as a high on-state current and a high field-effect mobility.

In this embodiment, as the oxide semiconductor, an oxide with an atomic ratio where In:Ga:Zn=1:3:4, In:Ga:Zn=4:2:3, In:Ga:Zn=1:1:1, In:Ga:Zn=1:1:1, or In:Ga:Zn=1:1:0.5 or a composition in the neighborhood thereof is used.

Moreover, an oxide semiconductor, particularly a CAAC-IGZO, which is a crystalline oxide semiconductor, has a characteristic structure where nanoclusters of several nanometers (e.g., 1 to 3 nm) with a c-axis alignment in the direction vertical to a surface on which the oxide semiconductor is deposited are connected to each other. Therefore, a crystal structure in which a clear grain boundary is not observed can be formed also in an opening extending in the Z direction.

In particular, the transistor WTr is preferably a transistor including an oxide semiconductor, which is a kind of metal oxide, in its semiconductor layer where a channel is formed (also referred to as an "OS transistor"). An oxide semiconductor has a band gap of 2 eV or more and thus has an extremely low off-state current. A node where the conductor 128 and one of a source and a drain of the transistor WTr are electrically connected to each other is referred to as a node ND. When an OS transistor is used as the transistor Wtr, the charge written to the node ND can be retained for a long period. When an OS transistor is used as the transistor included in the memory element MC, the memory element MC can be referred to as an "OS memory". The memory string 120 including such a memory element MC can also be referred to as an "OS memory". The memory device 100 can also be referred to as an "OS memory".

The OS memory can retain data written thereto for one year or longer, or ten years or longer even after power supply is stopped. Hence, the OS memory can be regarded as a nonvolatile memory.

In the OS memory, the amount of written charge is less likely to change over a long period of time; hence, the OS memory can retain multilevel (multibit) data as well as binary (1-bit) data.

Furthermore, an OS memory employs a method in which charge is written to a node through the transistor; hence, a high voltage, which is required for a conventional flash memory, is unnecessary and a high-speed writing operation is possible. The OS memory does not require an erasing operation before data rewriting, which is performed in a flash memory. Furthermore, the OS memory does not conduct charge injection and extraction to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level. Hence, the OS memory has higher rewrite endurance than the magneto-resistive memory and the resistance-change memory.

The off-state current of the OS transistor hardly increases even in a high-temperature environment. Specifically, the off-state current hardly increases even at an environment temperature ranging from room temperature to 200° C. In addition, the on-state current is unlikely to decrease even in a high-temperature environment. A memory device including the OS memory achieves a stable operation and high reliability even in a high-temperature environment. Furthermore, the breakdown voltage between the source and the drain of the OS transistor is high. When OS transistors are used as transistors included in a semiconductor device, the semiconductor device achieves stable operation and high reliability even in a high temperature environment.

The semiconductor 127 is preferably an n-channel semiconductor. A region of the semiconductor 125 that overlaps with the conductor WWL is preferably an i-type or substantially i-type semiconductor. In that case, the transistor WTr is an enhancement (normally-off) transistor, and the transistor RTr is a depletion (normally-on) transistor.

Note that the semiconductor 125 and the semiconductor 127 may include the same material or different materials. For example, the semiconductor 125 and the semiconductor 127 may each be an oxide semiconductor. The semiconductor 125 and the semiconductor 127 may each be a semiconductor including silicon. The semiconductor 125 may be an oxide semiconductor, and the semiconductor 127 may be a semiconductor including silicon. The semiconductor 125 may be a semiconductor including silicon, and the semiconductor 127 may be an oxide semiconductor.

Note that FIG. 5A corresponds to the X-Y plane of the center of the transistor WTr or the vicinity of the center, and FIG. 5B corresponds to the X-Y plane of the center of the transistor RTr or the vicinity of the center. In the case where the cross-sectional shape of the conductor 130 is a circular shape in FIG. 5A and FIG. 5B, the insulator 129 is provided as a concentric layer outside the conductor 130, the semiconductor 127 is provided as a concentric layer outside the insulator 129, the insulator 126 is provided as a concentric layer outside the semiconductor 127, the semiconductor 125 is provided as a concentric layer outside the insulator 126, and the insulator 124 is provided as a concentric layer outside the semiconductor 125. Furthermore, the conductor 128 is provided as a concentric layer between the insulator 126 and the semiconductor 125.

Figure 7A:
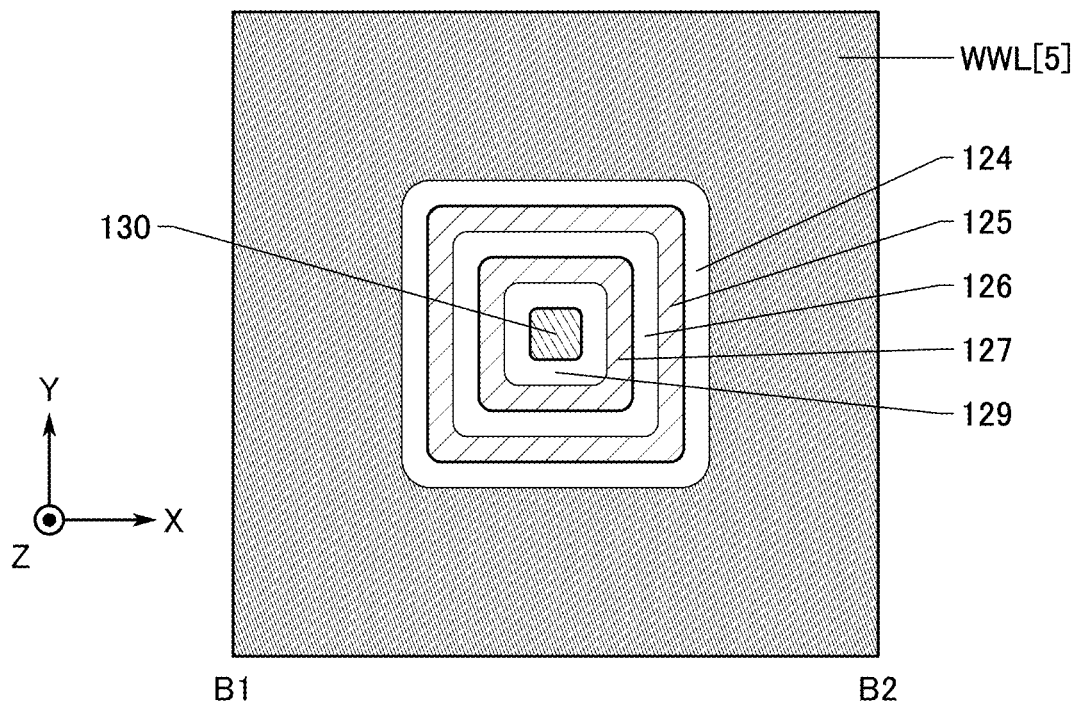
FIG. 7A and FIG. 7B are cross-sectional views of memory strings.
Figure 7B:
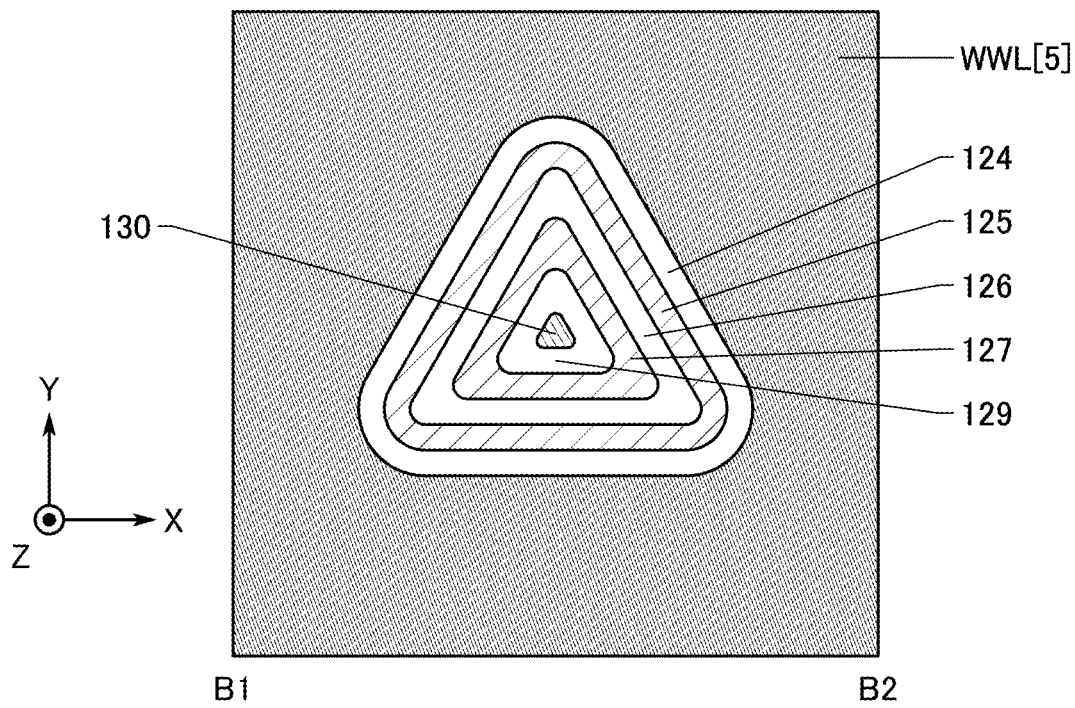

The cross-sectional shape of the conductor 130 is not limited to a circular shape. As illustrated in FIG. 7A, the cross-sectional shape of the conductor 130 may be a rectangular shape. Alternatively, as illustrated in FIG. 7B, the cross-sectional shape of the conductor 130 may be a triangular shape.

In the above, the example where the semiconductor 125 and the semiconductor 127 are electrically connected to the conductor WSL and the conductor RSL, respectively, in the bottom portion of the memory string 120; however, one embodiment of the present invention is not limited thereto.

Figure 8:
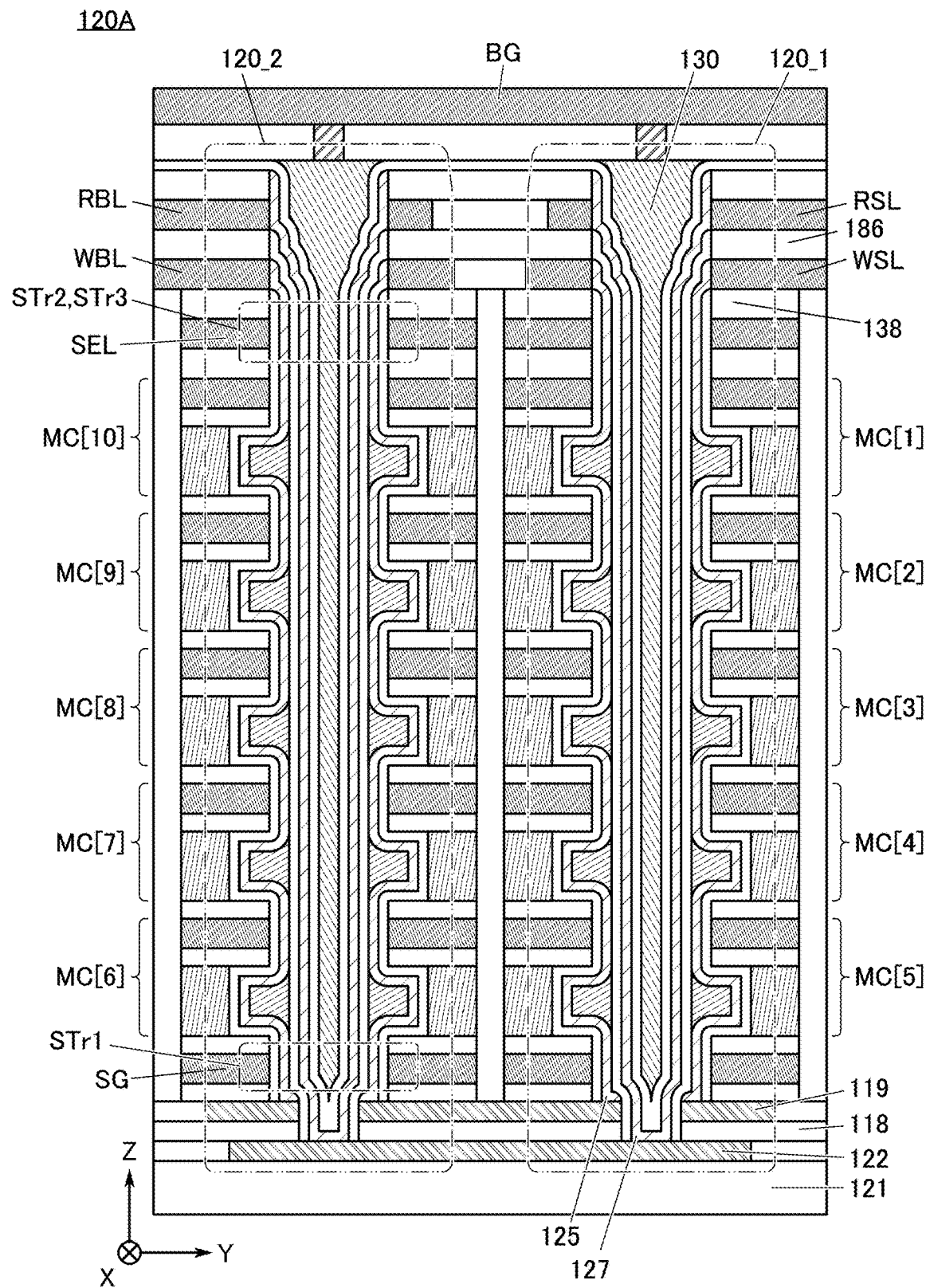
FIG. 8 is a cross-sectional view of a memory string.

As illustrated in FIG. 8, two memory strings adjacent in the Y-axis direction can be electrically connected to each other, thereby being formed as one memory string 120A. In the memory string 120A, a memory string 120_1 and a memory string 120_2 are electrically connected to each other with a conductor 119 and a conductor 122.

In an upper portion of the memory string 120_1, the semiconductor 125 is electrically connected to the conductor WSL, and the semiconductor 127 is electrically connected to the conductor RSL. In addition, in an upper portion of the memory string 120_2, the semiconductor 125 is electrically connected to the conductor WBL, and the semiconductor 127 is electrically connected to the conductor RBL. In bottom portions of the memory string 120_1 and the memory string 120_2, the semiconductors 125 of the two memory strings are electrically connected to each other through the conductor 119, and the semiconductors 127 of the two memory strings are electrically connected to each other through the conductor 122.

The memory string 120A includes the memory element MC[1] to a memory element MC[10] arranged from the side where the conductor WSL and conductor RSL are provided toward the side where the conductor WBL and conductor RBL are provided. The memory element MC[5] and the memory element MC[6] are electrically connected to each other through the conductor 119 and the conductor 122.

Note that the memory string 120 can also be referred to as a memory device, and the memory element MC can also be referred to as a memory device.

[Constituent Materials of Semiconductor Device]

Next, constituent materials that can be used for the memory device 100 are described.

[Substrate]

The memory device 100 is provided over the base 121. Note that a substrate that can be used as the base 121, an insulator substrate, a semiconductor substrate, or a conductive substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example includes a semiconductor substrate in which an insulator region is provided in the above semiconductor substrate, such as an SOI (Silicon On Insulator) substrate. Examples of the conductor substrate include a graphite substrate, a metal substrate, an alloy substrate, and a conductive resin substrate. Other examples include a substrate containing a nitride of a metal and a substrate containing an oxide of a metal. Other examples include an insulator substrate provided with a conductor or a semiconductor, a semiconductor substrate provided with a conductor or an insulator, and a conductor substrate provided with a semiconductor or an insulator. Alternatively, any of these substrates provided with an element may be used. Examples of the element provided over the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

Note that in this specification and the like, "oxynitride" refers to a material that contains more oxygen than nitrogen as its main component. For example, "silicon oxynitride" refers to a material that contains more oxygen than nitrogen and contains silicon, nitrogen, and oxygen. In this specification and the like, "nitride oxide" refers to a material that contains more nitrogen than oxygen as its main component. For example, "aluminum nitride oxide" refers to a material that contains more nitrogen than oxygen and contains aluminum, nitrogen, and oxygen.

With miniaturization and high integration of a transistor, for example, a problem such as leakage current may arise because of a thinner gate insulator. When a high-k material is used for an insulator functioning as a gate insulator, the voltage during operation of the transistor can be lowered while the physical thickness of the gate insulator is maintained. On the other hand, when a material having a low dielectric constant is used for an insulator functioning as an interlayer film, the parasitic capacitance between wirings can be reduced. A material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When an OS transistor is surrounded by an insulator that has a function of inhibiting passage of oxygen and impurities such as hydrogen, the transistor can have stable electrical characteristics. As the insulator having a function of inhibiting the passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

In the case where an oxide semiconductor is used as the semiconductor 125 and/or the semiconductor 127, the insulator functioning as a gate insulator preferably includes a region containing oxygen that is released by heating. For example, when a structure is employed in which silicon oxide or silicon oxynitride including a region containing oxygen that is released by heating is in contact with the semiconductor 125 and/or the semiconductor 127, oxygen vacancies included in the semiconductor 125 and/or the semiconductor 127 can be compensated for.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing any of the above metal elements and a conductive material containing oxygen may be used. A stacked-layer structure combining a material containing any of the above metal elements and a conductive material containing nitrogen may be used. Furthermore, a stacked-layer structure combining a material containing any of the above metal elements, a conductive material containing oxygen, and a conductive material containing nitrogen may be used.

When an oxide semiconductor, which is a type of metal oxide, is used for the channel formation region of the transistor, the conductor functioning as the gate electrode preferably employs a stacked-layer structure combining a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the oxide semiconductor in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With use of such a material, hydrogen contained in the oxide semiconductor in which the channel is formed can be captured in some cases. Hydrogen entering from an external insulator or the like can be captured in some cases.

[Oxide Semiconductor]

A metal oxide functioning as a semiconductor (oxide semiconductor) is preferably used for the semiconductor 125 and the semiconductor 127. An oxide semiconductor that can be used for the semiconductor 125 and the semiconductor 127 will be described below.

An oxide semiconductor preferably contains at least indium or zinc. In particular, indium and zinc are preferably contained. In addition, aluminum, gallium, yttrium, tin, or the like is preferably contained. Furthermore, one or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the oxide semiconductor is an In-M-Zn oxide that contains indium, an element M, and zinc is considered. Note that the element M represents one or more selected from aluminum, gallium, yttrium, tin, and titanium. Examples of other elements that can be used as the element M include boron, iron, nickel, germanium, zirconium, molybdenum, lanthanum, cerium, neodymium, hafnium, tantalum, tungsten, magnesium, and cobalt. Note that two or more of the above elements can be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Classification of Crystal Structure]

First, the classification of crystal structures of an oxide semiconductor will be described with reference to FIG. 9A. FIG. 9A is a diagram showing the classification of crystal structures of an oxide semiconductor, typically IGZO (a metal oxide containing In, Ga, and Zn).

As shown in FIG. 9A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 9A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 9B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 9B and obtained by GIXD measurement is hereinafter simply referred to as an XRD spectrum. The CAAC-IGZO film in FIG. 9B has a composition in the vicinity of In:Ga:Zn=4:2:3 [atomic ratio]. The CAAC-IGZO film in FIG. 9B has a thickness of 500 nm.

As shown in FIG. 9B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 9B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 9C shows a diffraction pattern of the CAAC-IGZO film. FIG. 9C shows a diffraction pattern obtained by the NBED method in which an electron beam is incident in the direction parallel to the substrate. The CAAC-IGZO film in FIG. 9C has a composition in the vicinity of In:Ga:Zn=4:2:3 [atomic ratio]. In the nanobeam electron diffraction method, electron diffraction is performed with a probe diameter of 1 nm.

As shown in FIG. 9C, a plurality of spots indicating c-axis alignment are observed in the diffraction pattern of the CAAC-IGZO film.

[Structure of Oxide Semiconductor]

Oxide semiconductors might be classified in a manner different from that in FIG. 9A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide, the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including a CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has a higher hydrogen concentration in the film than the nc-OS and the CAAC-OS.

[Composition of Oxide Semiconductor]

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. The CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, the case where the above oxide semiconductor is used for a transistor is described.

When the above oxide semiconductor is used for a transistor, a transistor with high field-effect mobility can be achieved. In addition, a transistor having high reliability can be fabricated.

Furthermore, an oxide semiconductor with a low carrier concentration is preferably used for a channel formation region of the transistor. For example, the carrier concentration of the channel formation region of the oxide semiconductor is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor. A highly purified intrinsic or substantially highly purified intrinsic state may be referred to as an i-type or a substantially i-type.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurities]

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the channel formation region of the oxide semiconductor and the concentration of silicon or carbon in the vicinity of an interface with the channel formation region of the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the channel formation region of the oxide semiconductor, which is measured by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the channel formation region of the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor containing hydrogen is likely to have normally-on characteristics. Accordingly, hydrogen in the channel formation region of the oxide semiconductor is preferably reduced as much as possible. Specifically, the hydrogen concentration in the channel formation region of the oxide semiconductor, which is obtained by SIMS, is set lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, further preferably lower than $1\times10^{18}$ atoms/cm$^3$.

When an oxide semiconductor with sufficiently reduced impurities is used for the channel formation region of the transistor, stable electrical characteristics can be given.

[Other Semiconductor Materials]

Semiconductor materials that can be used for the semiconductor 125 and the semiconductor 127 are not limited to the above-described oxide semiconductors. A semiconductor material having a bandgap (a semiconductor material that is not a zero-gap semiconductor) may be used for the semiconductor 125 and the semiconductor 127. For example, a single element semiconductor such as silicon, a compound semiconductor such as gallium arsenide, or a layered material functioning as a semiconductor (also referred to as an atomic layered material or a two-dimensional material) may be used as a semiconductor material. In particular, a layered material functioning as a semiconductor is preferably used as a semiconductor material.

In this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the semiconductor 125 and the semiconductor 127, a transition metal chalcogenide functioning as a semiconductor is preferably used, for example. Specific examples of the transition metal chalcogenide that can be used as the semiconductor 125 and the semiconductor 127 include molybdenum sulfide (typically $MoS_2$), molybdenum selenide (typically $MoSe_2$), molybdenum telluride (typically $MoTe_2$), tungsten sulfide ($WS_2$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

<Example of Manufacturing Method of Memory Device>

Next, an example of a method for manufacturing the memory device according to the present invention will be described with reference to FIG. 10A to FIG. 31C. Note that in FIG. 10A to FIG. 31C, A is a top view seen from the Z direction and B is a cross-sectional view of a portion indicated by a dashed-dotted line A1-A2 in A. Furthermore, C is a cross-sectional view of a portion indicated by a dashed-dotted line A3-A4 in A. Although an example of manufacturing two memory strings 120 including two (two stages of) memory elements MC is described in this manufacturing method, this embodiment is not limited to the example. The memory string 120 may include three or more stages of memory elements MC. For example, the memory string 120 preferably includes 32 or more, preferably 64 or more, further preferably 128 or more, still further preferably 256 or more stages of memory elements MC.

Figure 10A:
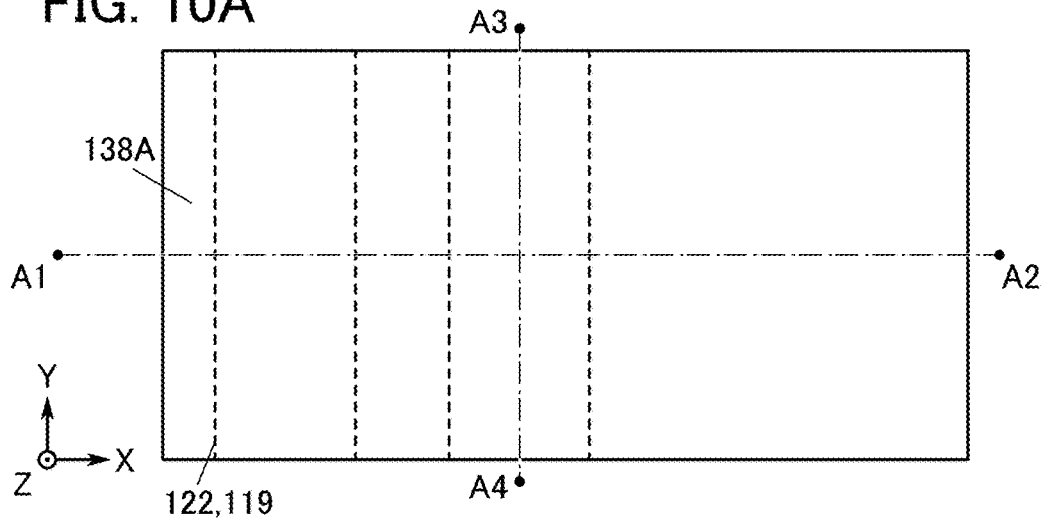
FIG. 10A to FIG. 10C are cross-sectional views illustrating a manufacturing step of a semiconductor device according to one embodiment of the present invention.
Figure 10B:
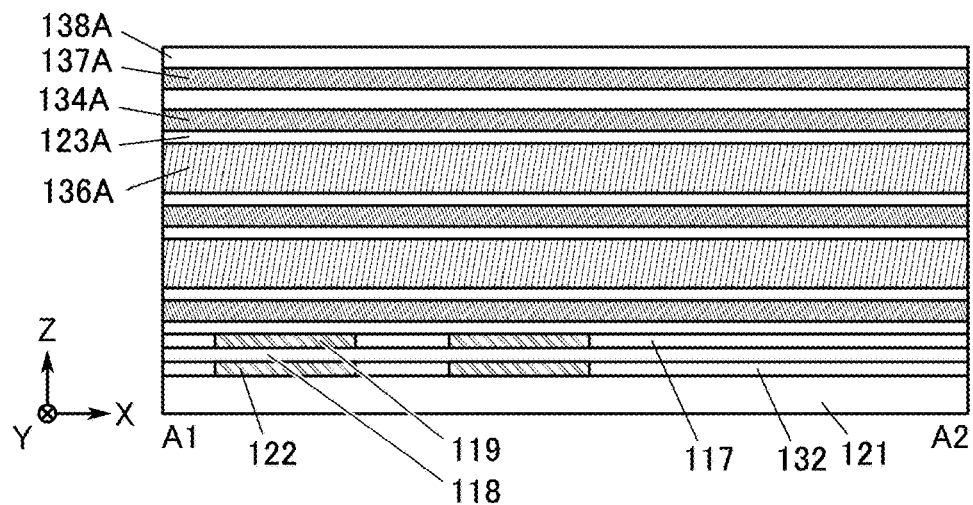
Figure 10C:
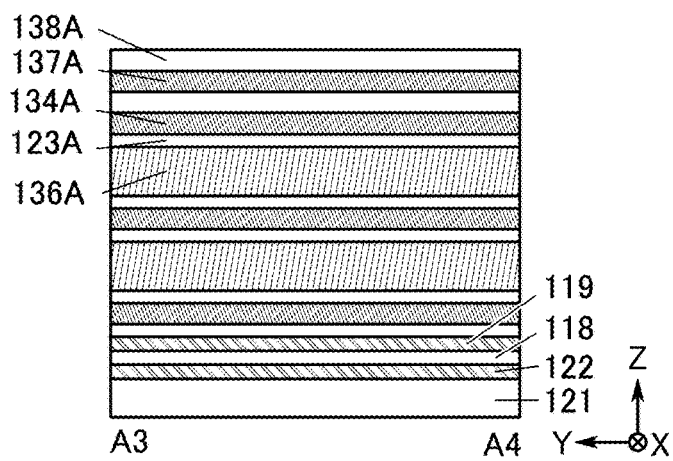

First, the conductor 122 is formed over the base 121 having an insulating surface, and an insulator 132 is formed around the conductor 122 (see FIG. 10A to FIG. 10C).

Specifically, a conductive film is formed and processed by a lithography method, whereby the conductor 122 is formed. Then, an insulating film is formed over the base 121 so as to cover the conductor 122. Next, the insulating film is preferably subjected to planarization treatment. In the planarization treatment, the insulating film is preferably polished until a surface of the conductor 122 is exposed. By the above-described method, the insulator 132 can be formed. Note that the method for forming the conductor 122 and the insulator 132 is not limited to this method. The insulator 132 may be formed over the base 121 and an unnecessary portion of the insulator 132 may be removed to form a groove or an opening, and the conductor 122 may be embedded in the groove or the opening. Such a formation method of the conductor is referred to as a damascene method (a single damascene method or a dual damascene method) in some cases. By the above-described method, the structure illustrated in FIG. 10A to FIG. 10C can be obtained.

The conductor 122 and the insulator 132 can be formed by a sputtering method, a CVD method, a molecular beam epitaxy (MBE) method, a pulsed laser deposition (PLD) method, an atomic layer deposition (ALD) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma CVD method. A thermal CVD method is a deposition method that does not use plasma and thus enables less plasma damage to a processed object. For example, a wiring, an electrode, an element (a transistor, a capacitor, or the like), or the like included in a semiconductor device might be charged up by receiving charge from plasma. In that case, accumulated charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. The use of plasma in a PEALD method is sometimes preferable because deposition at a lower temperature is possible.

Unlike a deposition method in which particles ejected from a target or the like are deposited, a CVD method and an ALD method are deposition methods in which a film is formed by reaction at a surface of a processed object. Thus, a CVD method and an ALD method are deposition methods that enable favorable step coverage almost regardless of the shape of a processed object. In particular, an ALD method enables excellent step coverage and excellent thickness uniformity and thus is suitable for covering a surface of an opening portion with a high aspect ratio, for example. Meanwhile, an ALD method has a relatively low deposition rate, and thus is preferably used in combination with another deposition method with a high deposition rate, such as a CVD method, in some cases.

A CVD method enables control of the composition of a film to be obtained with a flow rate ratio of source gases. With a CVD method, for example, a film with a certain composition can be deposited depending on the flow rate ratio of the source gases. Moreover, with a CVD method, by changing the flow rate ratio of the source gases during the deposition, a film in which the composition is continuously changed can be deposited. In the case of forming a film while changing the flow rate ratio of the source gases, as compared with the case of forming a film with use of a plurality of deposition chambers, the time taken for the deposition can be shortened because the time taken for transfer and pressure adjustment is omitted. Thus, the productivity of the semiconductor device can be increased in some cases.

In an ALD method, a plurality of precursors with different compositions are introduced concurrently, or the cycle number of each of precursors with different compositions is controlled, so that a film with a given composition can be deposited.

Note that in the lithography method, first, a resist is exposed to light through a photomask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed, for example, by exposing the resist to KrF excimer laser light, ArF excimer laser light, or EUV (Extreme Ultraviolet) light. A liquid immersion technique may be employed in which a gap between a substrate and a projection lens is filled with a liquid (e.g., water) to perform light exposure. An electron beam or an ion beam may be used instead of the above-mentioned light. Note that a photomask is not necessary in the case of using an electron beam or an ion beam. Note that for removal of the resist mask, dry etching treatment such as ashing, wet etching treatment, a combination of the dry etching and wet etching treatments may be performed. In the case of using a combination of the dry etching treatment and the wet etching treatment, the wet etching treatment may be performed after the dry etching treatment, or the dry etching treatment may be performed after the wet etching treatment.

A hard mask formed of an insulator or a conductor may be used instead of the resist mask. In the case where a hard mask is used, a hard mask with a desired shape can be formed in the following manner: an insulating film or a conductive film that is the hard mask material is formed over a conductive film, a resist mask is formed thereover, and then the hard mask material is etched.

A dry etching method or a wet etching method can be employed for the processing. A dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. A dry etching apparatus including a high-density plasma source can be used. As the dry etching apparatus including a high-density plasma source, an inductively coupled plasma (ICP) etching apparatus can be used, for example.

In the case where a hard mask is used for etching of the conductive film, the etching treatment may be performed after the resist mask used for the formation of the hard mask is removed or with the resist mask left. In the latter case, the resist mask is sometimes removed during the etching. The hard mask may be removed by etching after the etching of the conductive film. Meanwhile, the hard mask is not necessarily removed when the hard mask material does not affect subsequent steps or can be utilized in subsequent steps.

As a conductive film to be the conductor 122, a conductive film containing a metal element is preferably formed by a sputtering method. The conductive film can also be formed by a CVD method.

A surface of the insulator 132 is preferably subjected to planarization treatment as needed. A chemical mechanical polishing (CMP) method or a reflow method can be used as the planarization treatment.

The insulator 118 is formed over the conductor 122 and the insulator 132. The insulator 118 can be formed using a material that can be used for the insulator 132 and a method that can used for formation of the insulator 132.

The conductor 119 and an insulator 117 are formed over the insulator 118 (see FIG. 10A to FIG. 10C). The conductor 119 and the insulator 117 can be formed using materials and method that can be used for the formation of the conductor 122 and the insulator 132.

An insulating film 123A, a conductive film 134A, and a conductive film 136A are alternately stacked over the conductor 119 and the insulator 117. In this embodiment, an example where the insulating film 123A is formed over the conductor 119 and the insulator 117, the conductive film 134A is formed over the insulating film 123A, another insulating film 123A is formed over the conductive film 134A, and the conductive film 136A is formed over the insulating film 123A is described (see FIG. 10A to FIG. 10C). A CVD method can be used for the formation of the conductive films 134A, the conductive films 136A, and the insulating films 123A. Alternatively, a sputtering method may be employed.

As the conductor 122, the conductor 119, the conductive film 134A, and the conductive film 136A, a conductive material such as silicon to which an impurity is added or a metal can be used. The conductive film 136A is preferably formed using a material different from those of the conductor 122, the conductor 119, and the conductive film 134A since a conductor 136 is needed to be etched selectively with respect to the conductor 119 and a conductor 134 in a subsequent step. Meanwhile, the conductor 122, the conductor 119, and the conductive film 134A may be formed using the same material or different materials. In the case where silicon to which an impurity is added is used for the conductor 122, the conductor 119, the conductive film 134A, or the conductive film 136A, amorphous silicon or polysilicon can be used. As the impurity added with silicon, p-type impurities or n-type impurities can be used. As a conductive material containing silicon, silicide containing titanium, cobalt, or nickel can be used for the conductor 122, the conductive film 134A, or the conductive film 136A. In the case where a metal material is used for the conductor 122, the conductive film 134A, or the conductive film 136A, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

One of the conductive film 134A and the conductive film 136A may be a dummy layer. The dummy layer is preferably formed using a material that can be selectively etched with respect to the conductor 122, the insulator 118, the conductor 119, the insulator 123, and the other of the conductive film 134A and the conductive film 136A. For example, silicon nitride or silicon nitride oxide can be used. In a subsequent step, the dummy layer is removed and a conductor is formed in the region where the dummy layer is removed, so that one of the conductor 134 and the conductor 136 can be formed.

An insulating oxide, an insulating nitride, an insulating oxynitride, an insulating nitride oxide, an insulating metal oxide, an insulating metal oxynitride, an insulating metal nitride oxide, or the like can be used for the insulator 132, insulator 118, the insulator 117, and the insulating film 123A. It is possible to use silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, aluminum oxide, gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like.

The conductive film 136A is preferably formed using a material that can be selectively etched with respect to the conductive film 134A, the conductive film 134A, the insulator 138, and the insulating film 123A since the conductor 136 is needed to be etched selectively with respect to a conductor 137, the conductor 134, the conductor 119, the insulator 138, the insulator 123, and the like in a subsequent step. For example, the conductive film 136A is formed using a material different from that of the conductive film 134A, and the insulator 138 and the insulating film 123A are preferably formed using silicon oxide or silicon oxynitride.

Although an example where six insulating films 123A, three conductive films 134A, and two conductive films 136A are formed is described in this embodiment, the number of stacked layers is not limited thereto. Each of the films can be formed in accordance with the required performance of the semiconductor device. Assuming that the number of stacked conductive films 134A is m (m is an integer greater than or equal to 2), the number of stacked insulating films 123A is 2×m and the number of stacked conductive films 136A is m−1. For example, m can be greater than or equal to 33, preferably greater than or equal to 65, further preferably greater than or equal to 129, still further preferably greater than or equal to 257.

A conductive film 137A is formed over the uppermost insulating film 123A, and an insulating film 138A is formed over the conductive film 137A. The conductor film 137A can be formed using a method and a material similar to those of the conductive films 134A. Furthermore, the insulating film 138A can be formed using a method and a material similar to those of the insulating film 123A.

Figure 11A:
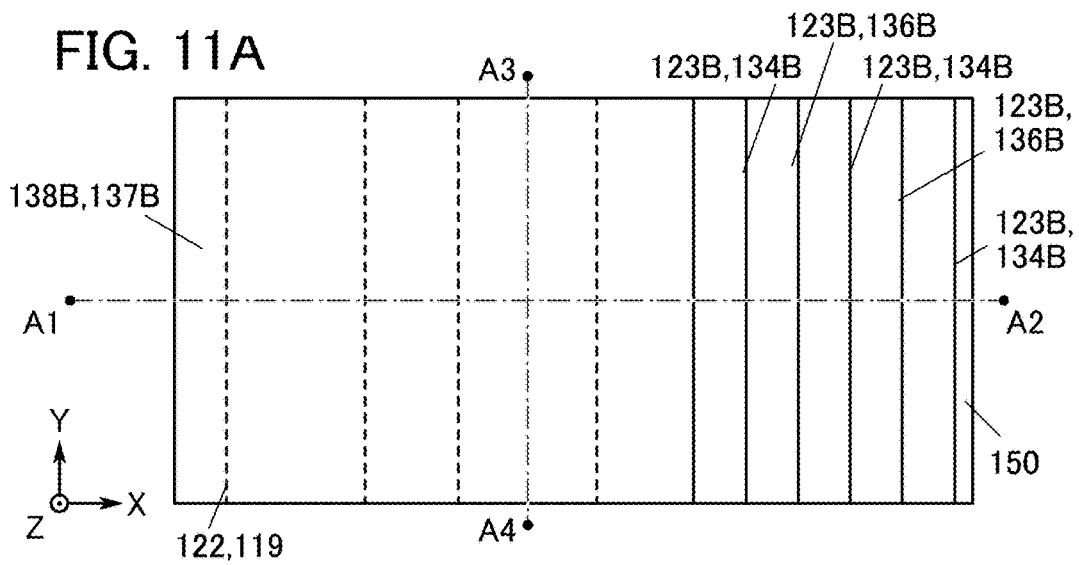
FIG. 11A to FIG. 11C are cross-sectional views illustrating a manufacturing step of a semiconductor device according to one embodiment of the present invention.
Figure 11B:
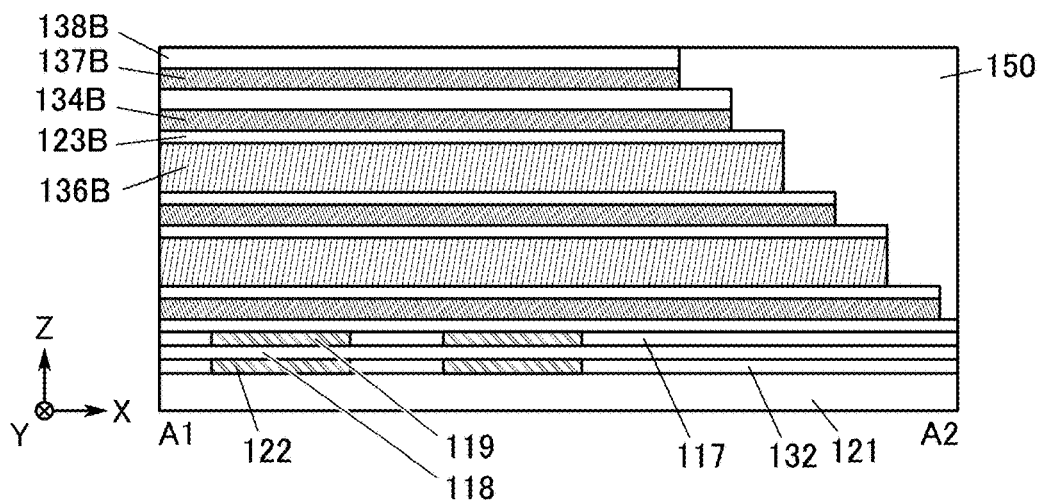
Figure 11C:
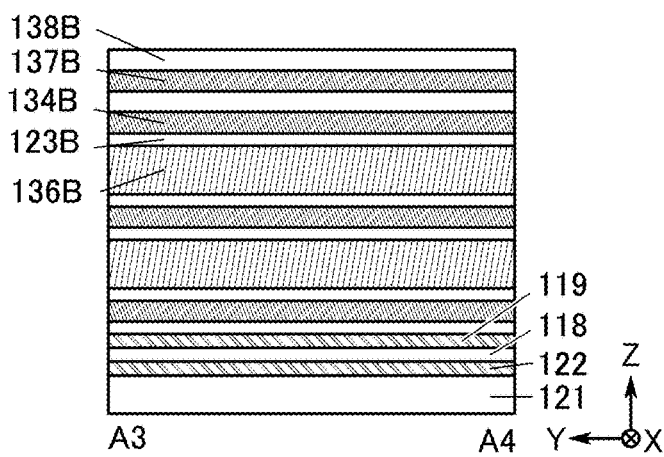

Next, the insulating film 138A, the conductive film 137A, the insulating films 123A, the conductive films 134A and the conductive films 136A are processed, so that an insulator 138B, a conductor 137B, insulators 123B, conductors 134B, and conductors 136B having a step-like shape as illustrated in FIG. 11B are formed (see FIG. 11A to FIG. 11C). In the processing of the insulating film 138A, the conductive film 137A, the insulating films 123A, the conductive films 134A, and the conductive films 136A, etching of the insulating film 138A, the conductive film 137A, the insulating films 123A, the conductive films 134A, and the conductive films 136A and slimming of a mask are alternately performed, whereby the insulator 138B, the conductor 137B, the insulators 123B, the conductors 134B, and the conductors 136B having a step-like shape can be formed.

Next, an insulator 150 is formed (see FIG. 11A to FIG. 11C). The insulator 150 can be formed by a CVD method. The insulator 150 is preferably subjected to planarization treatment by a CMP method or a reflow method.

Figure 12A:
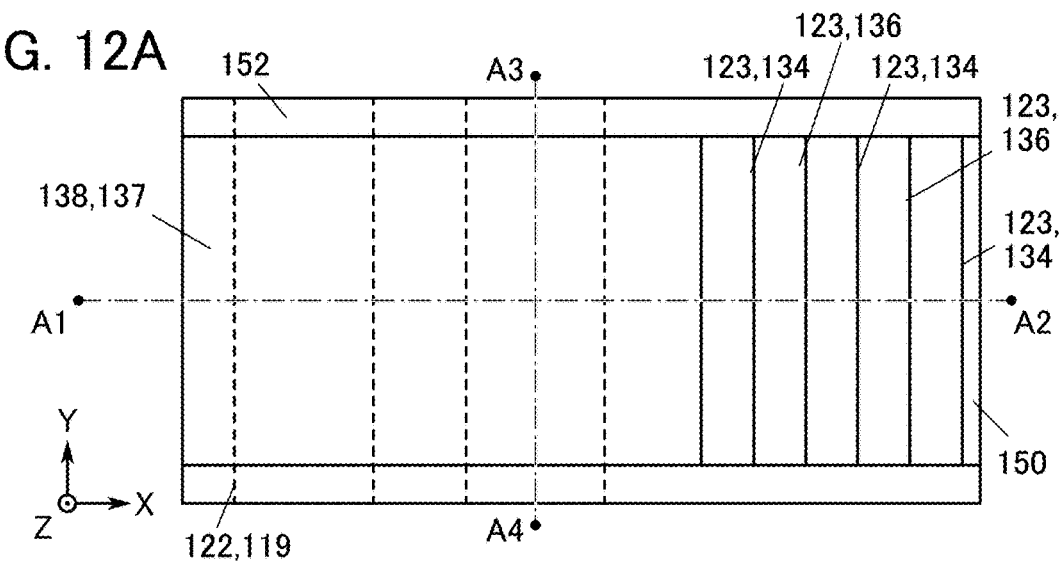
FIG. 12A to FIG. 12C are cross-sectional views illustrating a manufacturing step of a semiconductor device according to one embodiment of the present invention.
Figure 12B:
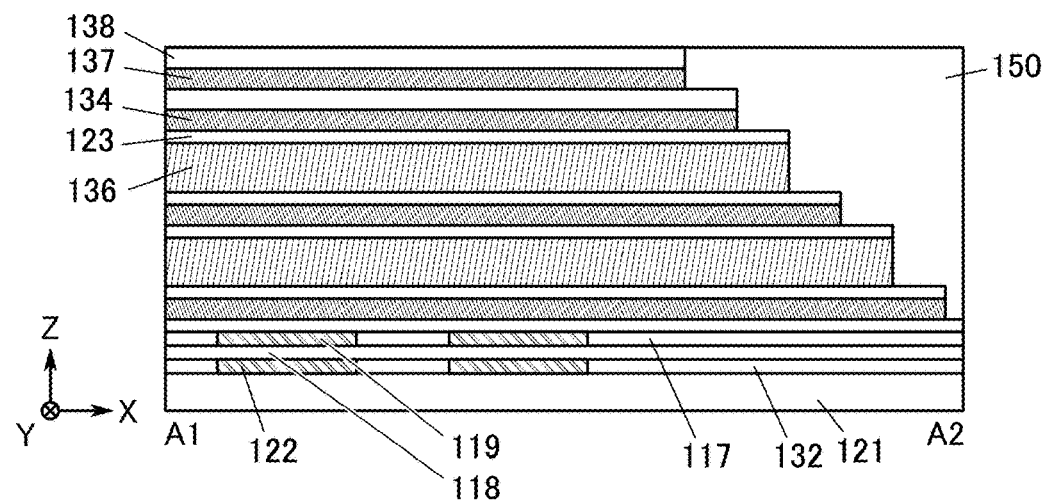
Figure 12C:
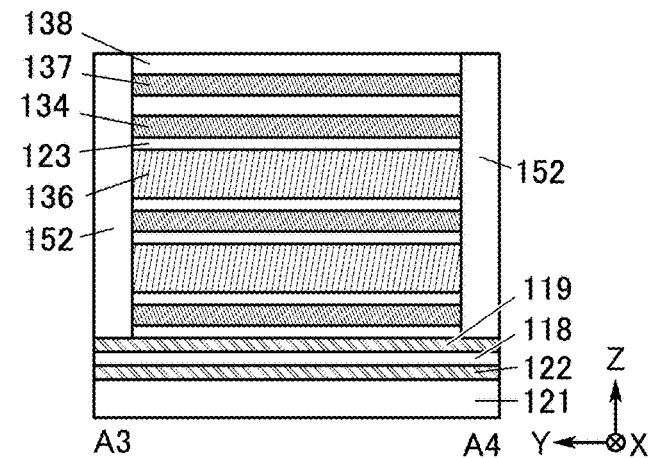

Next, the insulator 150, the insulator 138B, the conductor 137B, the insulators 123B, the conductors 134B, and the conductors 136B are processed to have grooves, so that the insulator 138, the conductor 137, the insulators 123, the conductors 134, and the conductors 136 are obtained (see FIG. 12A to 12C).

In the case where a dummy layer is used as one of the conductive film 134A and the conductive film 136A, removal of the dummy layer may be performed from a side surface exposed by the above processing, and a conductor may be formed in a region where the dummy layer is removed. In the case where the conductor is formed also in the above grooves at this time, the conductor is removed. Note that the removal of the dummy layer and the formation of the conductor may be performed in a later step.

Next, insulators 152 are formed so as to be embedded in the grooves (see FIG. 12A to FIG. 12C). The insulators 152 can be formed by a CVD method or an ALD method. It is particularly preferable to employ an ALD method, in which case a film with a uniform thickness can be formed even in a groove or an opening portion having a high aspect ratio. Alternatively, the insulators 152 may be formed by a combination of an ALD method and a CVD method. The insulators 152 are preferably subjected to planarization treatment by a CMP method or a reflow method.

Figure 13A:
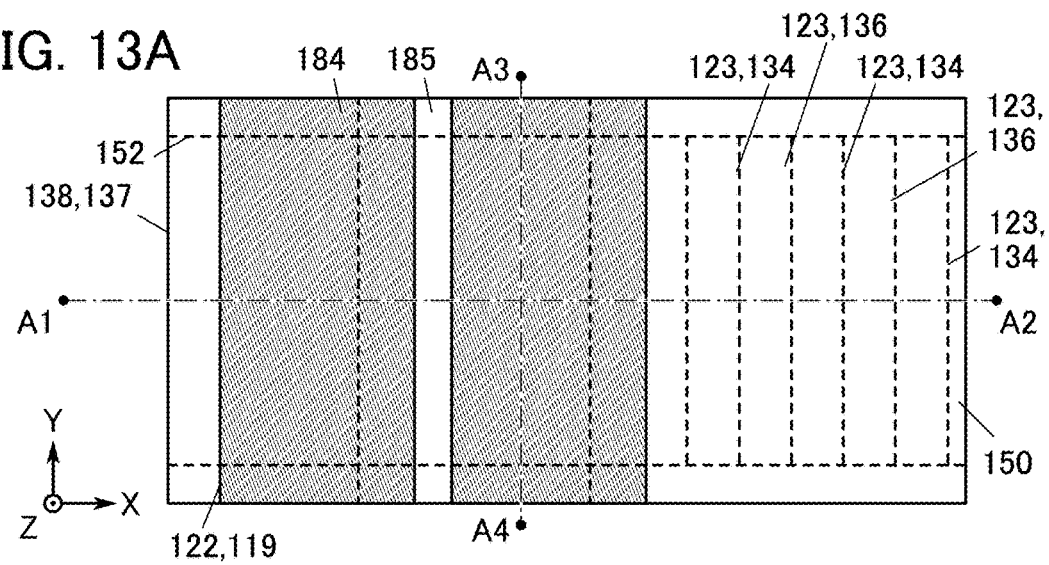
FIG. 13A to FIG. 13C are cross-sectional views illustrating a manufacturing step of a semiconductor device according to one embodiment of the present invention.
Figure 13B:
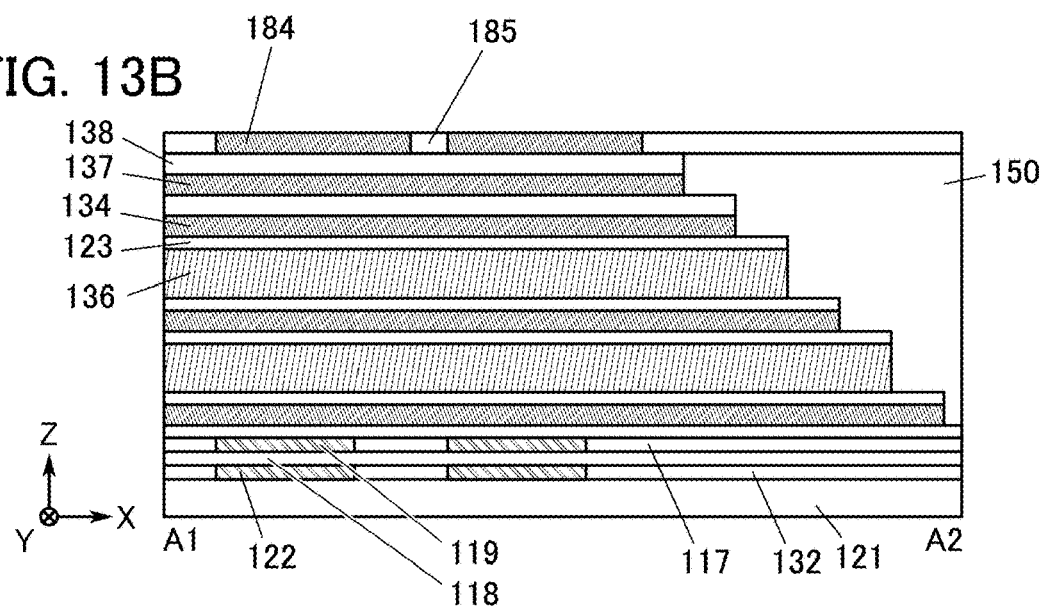
Figure 13C:
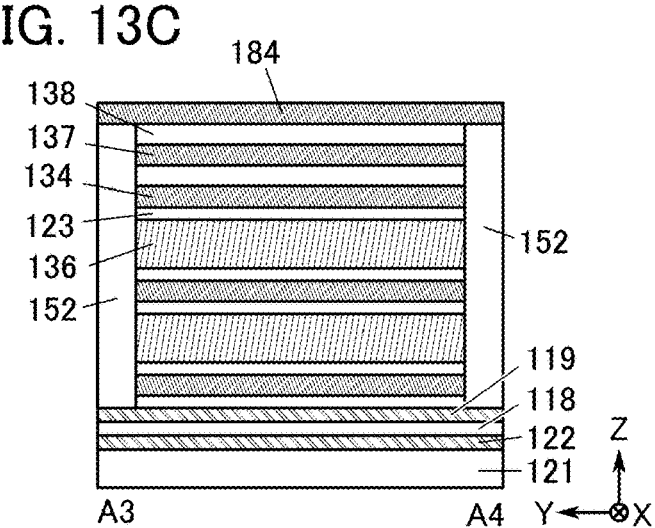

Next, a conductor 184 and an insulator 185 are formed over the insulator 138, the insulator 150, the insulator 152 (see FIG. 13A to FIG. 13C). The conductor 184 and the insulator 185 can be formed using a material and a method that can be used for the formation of the conductor 122 and the insulator 132, respectively.

Figure 14A:
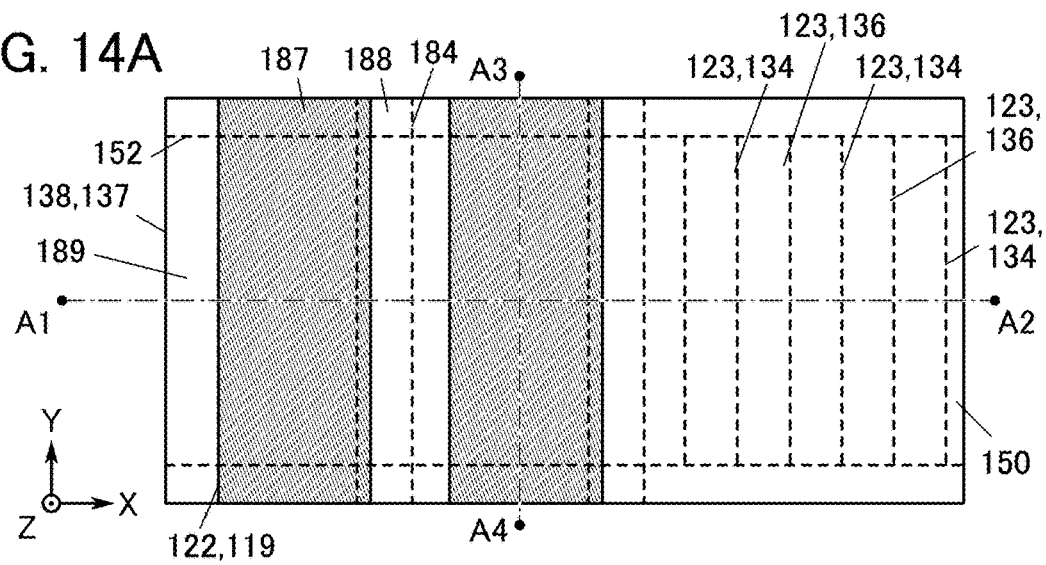
FIG. 14A to FIG. 14C are cross-sectional views illustrating a manufacturing step of a semiconductor device according to one embodiment of the present invention.
Figure 14B:
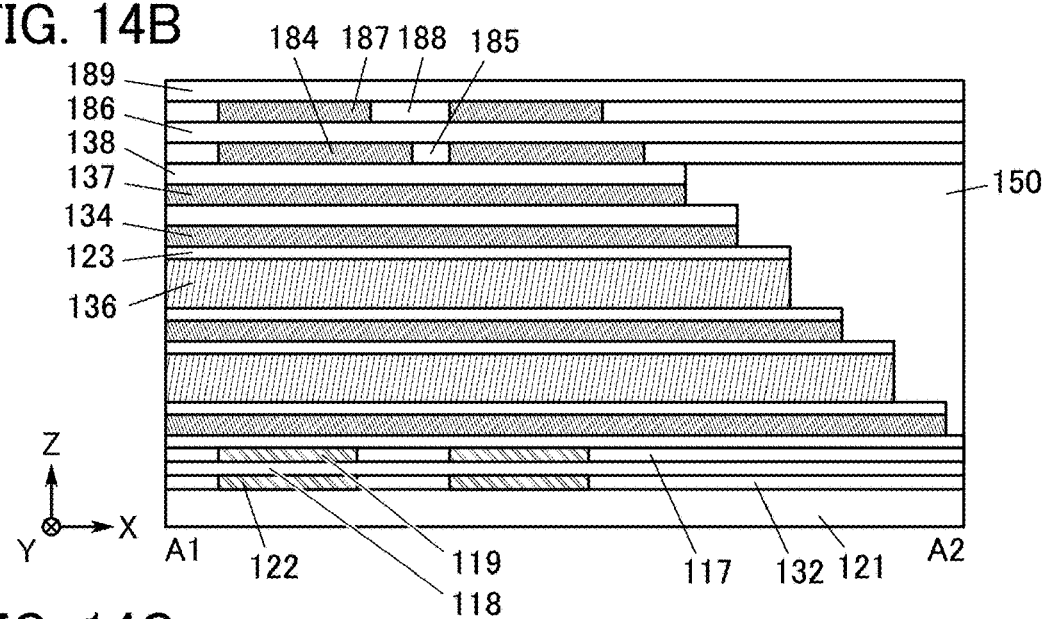
Figure 14C:
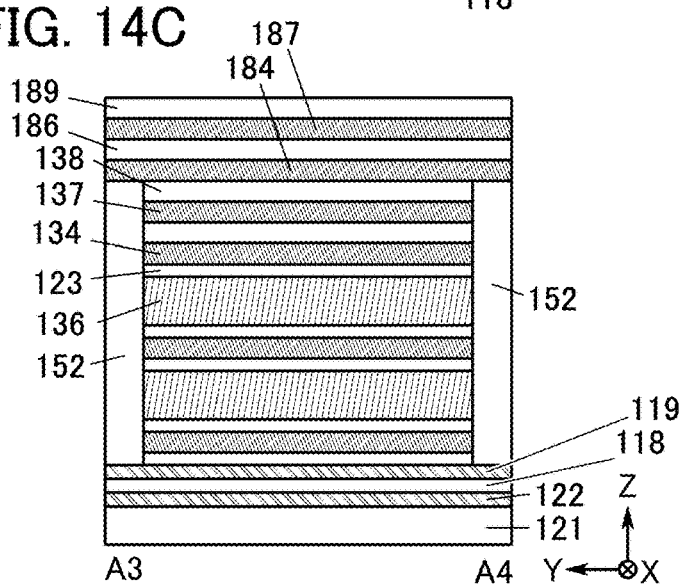

Next, the insulator 186 is formed over the conductor 184 and the insulator 185 (see FIG. 14A to FIG. 14C). The insulator 186 can be formed using a material and a method that can be used for the formation of the insulator 132.

Next, a conductor 187 and an insulator 188 are formed over the insulator 186 (see FIG. 14A to FIG. 14C). The conductor 187 and the insulator 188 can be formed using a material and a method that can be used for the formation of the conductor 122 and the insulator 132, respectively.

Next, an insulator 189 is formed over the conductor 187 and the insulator 188 (see FIG. 14A to FIG. 14C). The insulator 189 can be formed using a material and a method that can be used for the formation of the insulator 132.

Figure 15A:
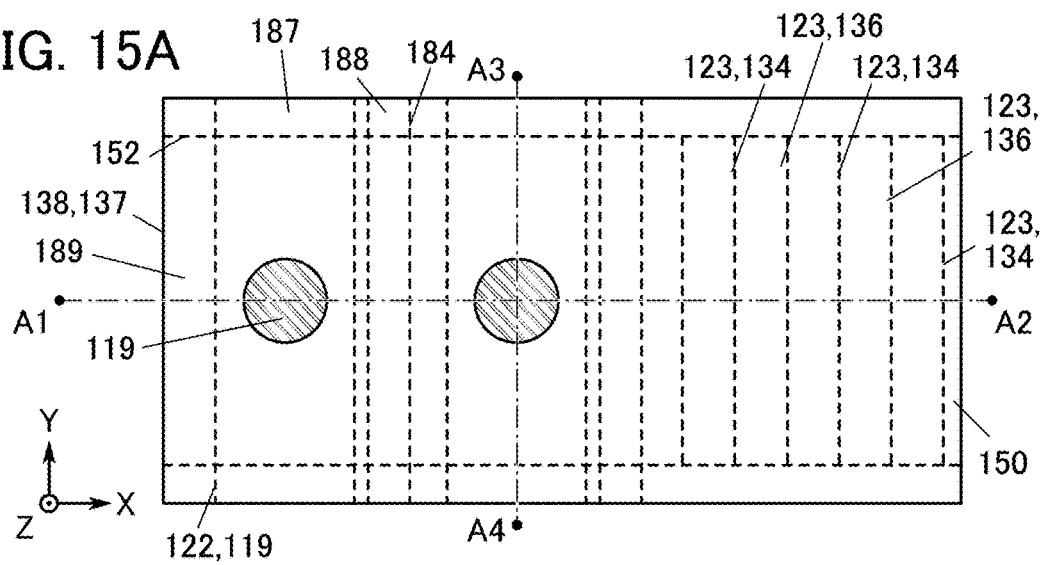
FIG. 15A to FIG. 15C are cross-sectional views illustrating a manufacturing step of a semiconductor device according to one embodiment of the present invention.
Figure 15B:
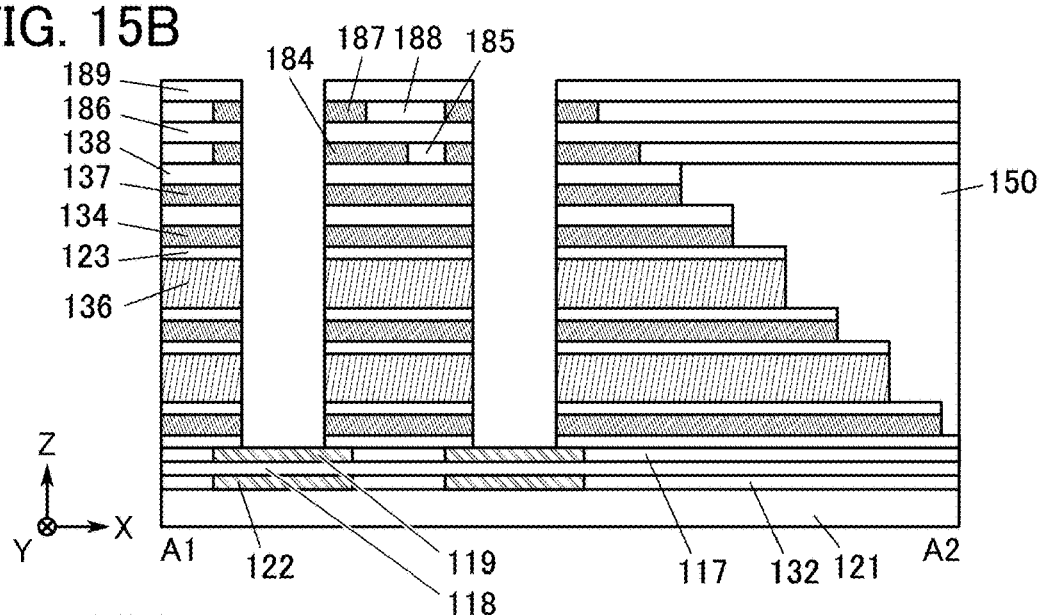
Figure 15C:
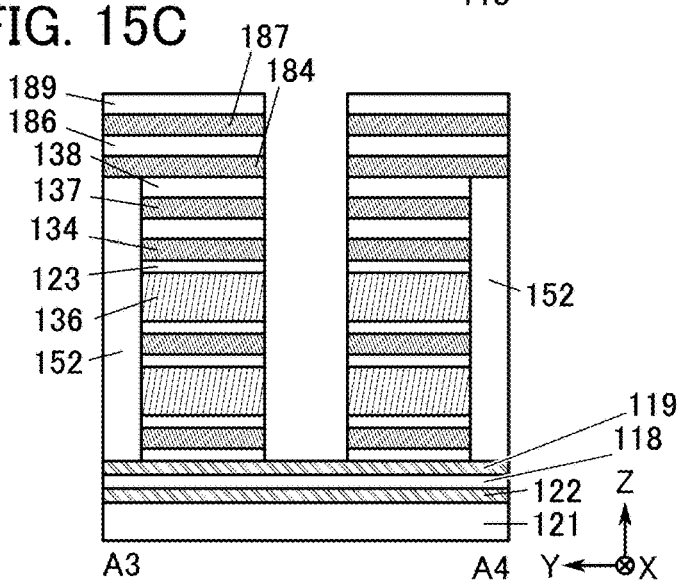

Next, a mask is formed over the insulator 189, and the insulator 189, the conductor 187, the insulator 186, the conductor 184, the insulator 138, the conductor 137, the insulator 123, the conductor 134, and the conductor 136 are processed by a lithography method, whereby a first opening is formed to expose the conductor 119 (see FIG. 15A to FIG. 15C).

In the case where a dummy layer is used as one of the conductor 134 and the conductor 136, removal of the dummy layer is performed from a side surface exposed by the above processing, and a conductor may be formed in a region where the dummy layer is removed. In the case where a conductor is formed also in the first opening in this step, the conductor is removed.

Figure 16A:
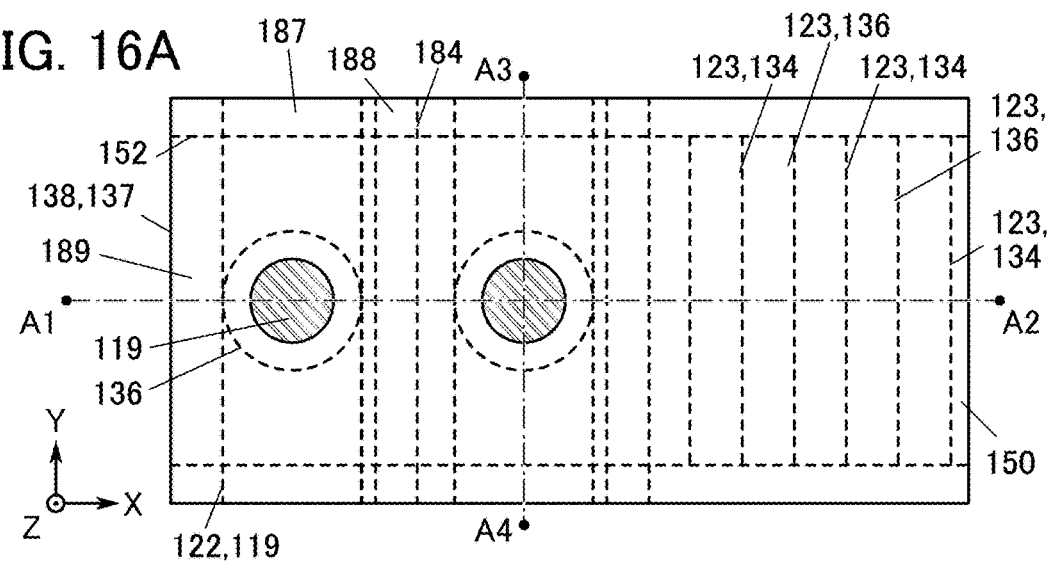
FIG. 16A to FIG. 16C are cross-sectional views illustrating a manufacturing step of a semiconductor device according to one embodiment of the present invention.
Figure 16B:
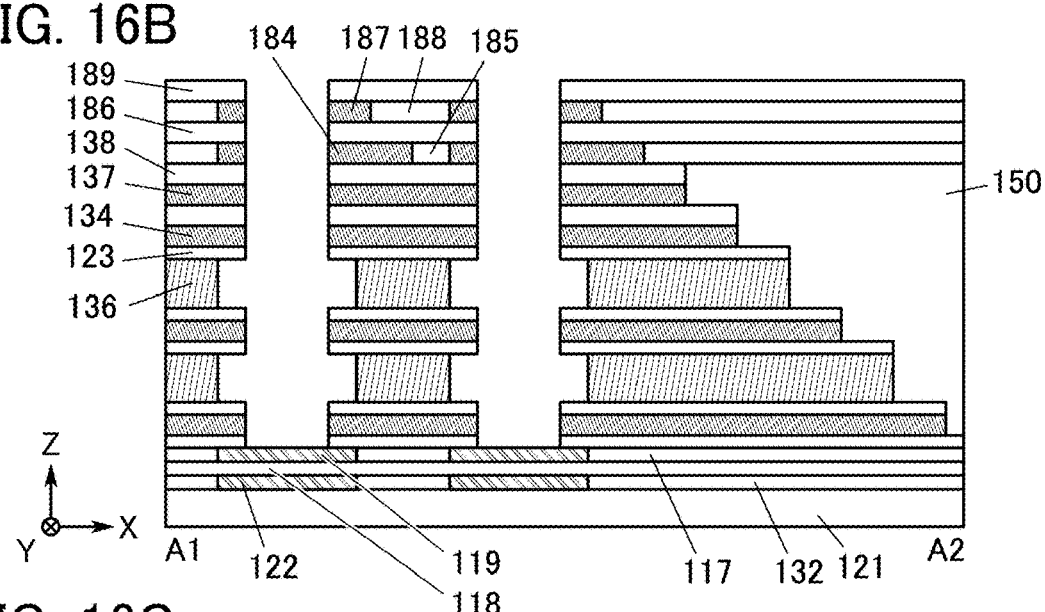
Figure 16C:
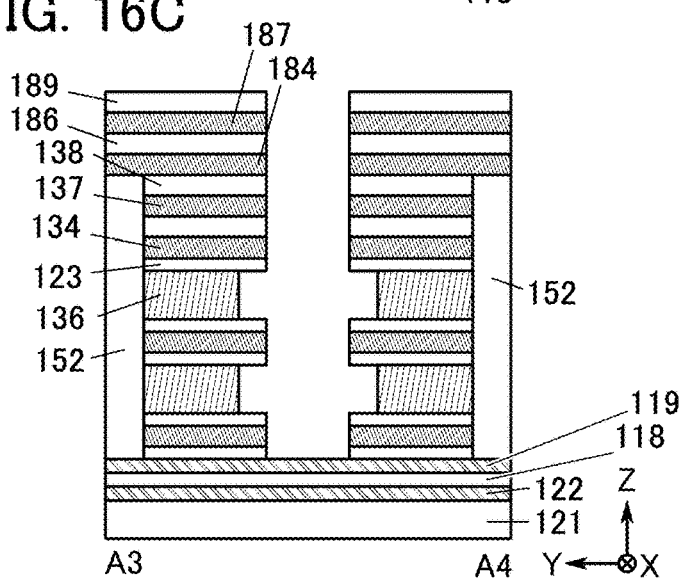

Next, isotropic etching is performed on the conductor 136 to increase the diameter of an opening of the conductor 136 (see FIG. 16A to FIG. 16C). By this treatment, the diameter of the opening of the conductor 136 becomes larger than the diameters of the openings of the insulator 138, the conductor 137 the insulator 123, and the conductor 134. The conductor 136 can be regarded as being recessed against a side surface of the insulator 138, the conductor 137, the insulator 123, or the conductor 134. As such processing, isotropic etching using dry etching with a gas, a radical, plasma, or the like, or isotropic etching using wet etching with a liquid can be used. A liquid used in wet etching may be referred to as an etchant. In the case where isotropic etching is performed using dry etching, a gas, a radical, plasma, or the like containing at least one of chlorine, bromine, and fluorine can be used. Isotropic etching is preferably performed without removal of the mask used for the formation of the first opening. The first opening obtained by the above treatment corresponds to the opening 141 illustrated in FIG. 3.

Figure 17A:
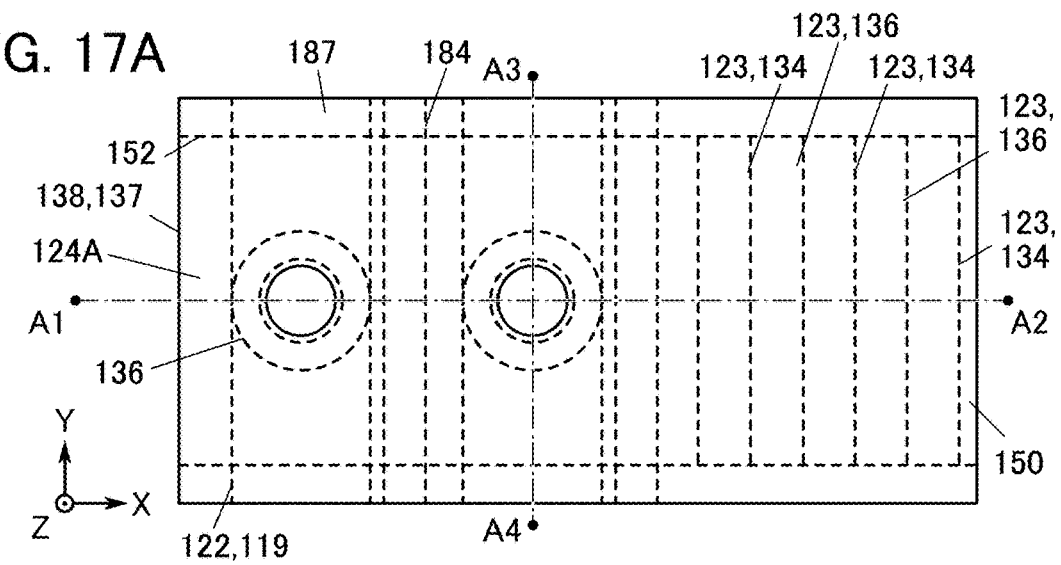
FIG. 17A to FIG. 17C are cross-sectional views illustrating a manufacturing step of a semiconductor device according to one embodiment of the present invention.
Figure 17B:
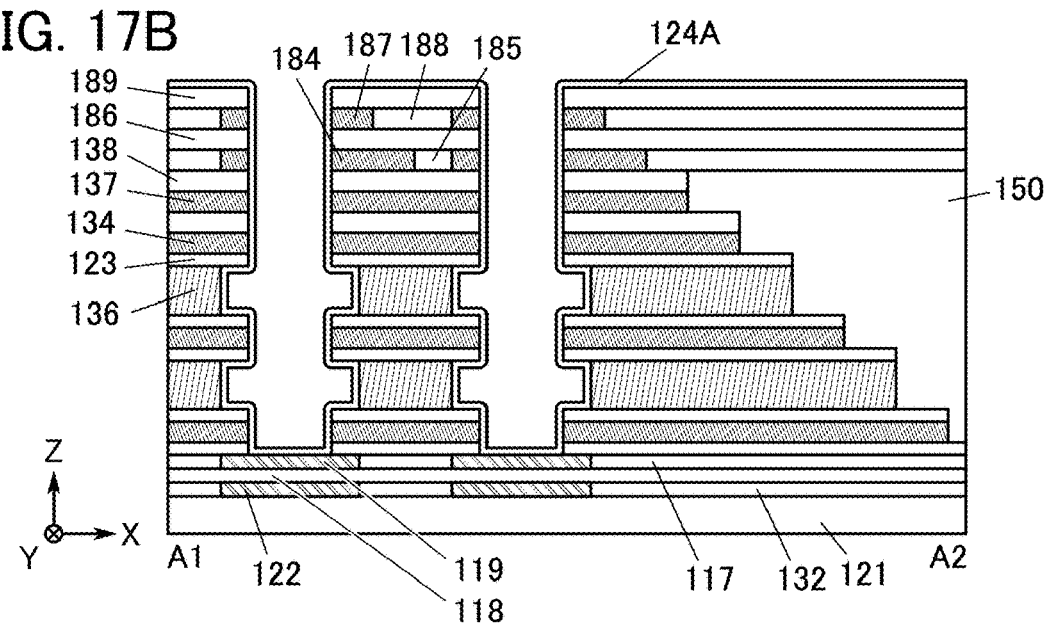
Figure 17C:
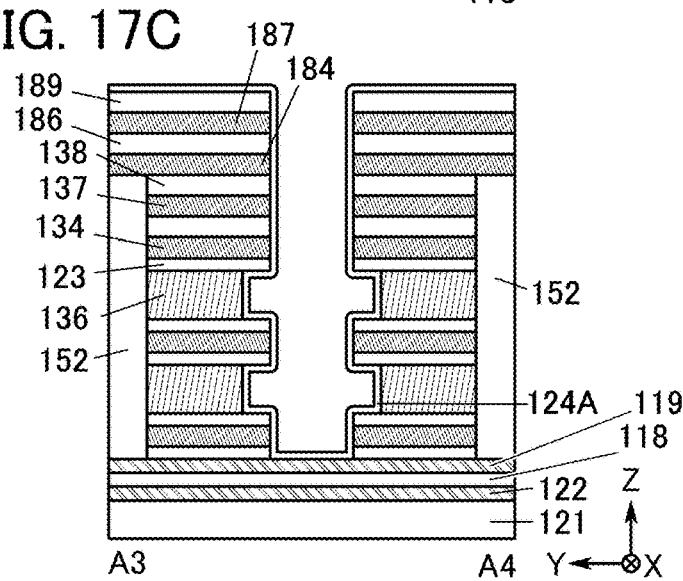

Next, an insulating film 124A is formed over the insulator 189 and inside the first opening (see FIG. 17A to FIG. 17C). Although not illustrated, the insulating film 124A may have a stacked-layer structure. The insulating film 124A can be formed by a CVD method or an ALD method. It is particularly preferable to employ an ALD method, in which case a film with a uniform thickness can be formed even in a groove or an opening portion having a high aspect ratio. In particular, the use of plasma in a PEALD method is sometimes preferable because deposition at a lower temperature is possible. Alternatively, the insulating film 124A may be formed by a combination of an ALD method and a CVD method. In the case where the insulating film 124A has a stacked-layer structure, insulating films may be formed in the same deposition apparatus or different deposition apparatuses.

The insulating film 124A formed by the above-described method has high coverage and can also be formed in the recessed portion of the conductor 136. In other words, the insulating film 124A can be formed in contact with not only the side surfaces of the insulator 123, the conductor 134, and the conductor 136 but also part of a top surface and part of a bottom surface of the insulator 123.

Then, the insulating film 124A formed in a bottom portion of the first opening is removed to obtain an insulator 124B. Anisotropic etching is preferably used to remove the insulating film 124A. At this time, the insulating film 124A over the insulator 189 is also removed; thus, the insulator 124B is provided only on a sidewall of the first opening (see FIG. 18A to FIG. 18C). The conductor 119 is exposed again by removal of the insulating film 124A in the bottom portion of the first opening.

Figure 18A:
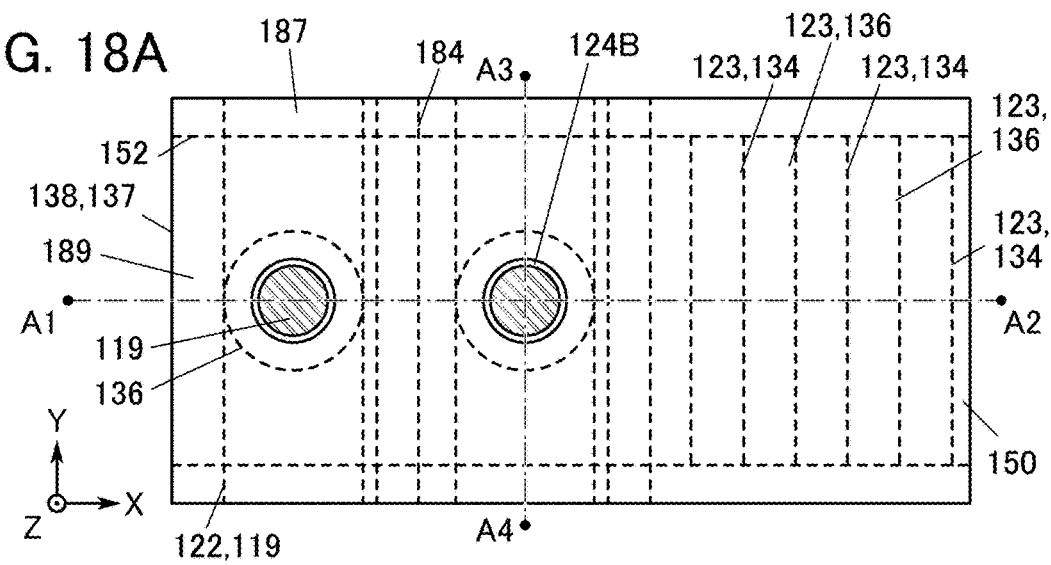
FIG. 18A to FIG. 18C are cross-sectional views illustrating a manufacturing step of a semiconductor device according to one embodiment of the present invention.
Figure 18B:
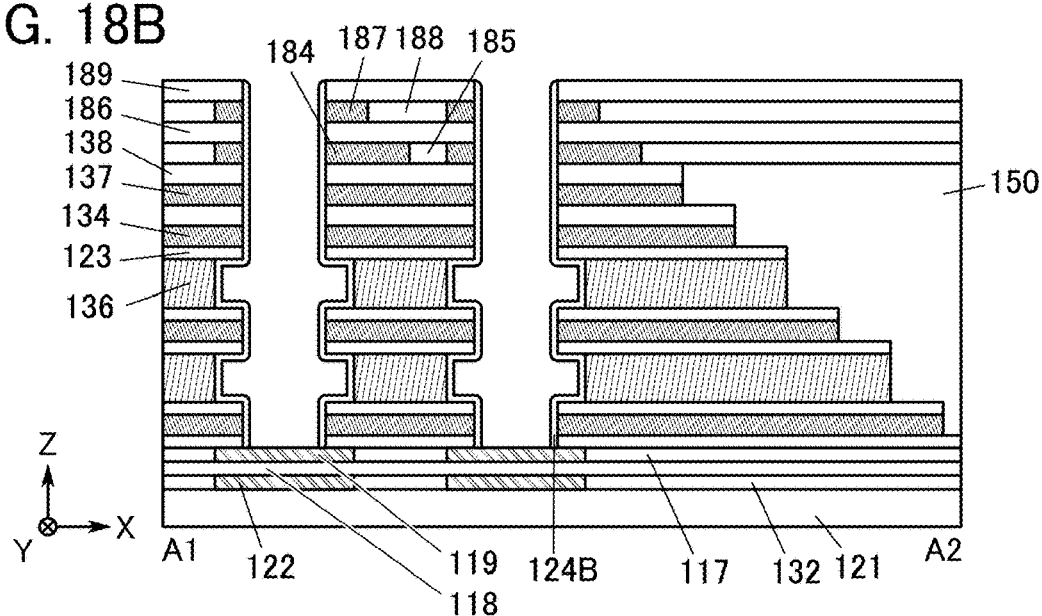
Figure 18C:
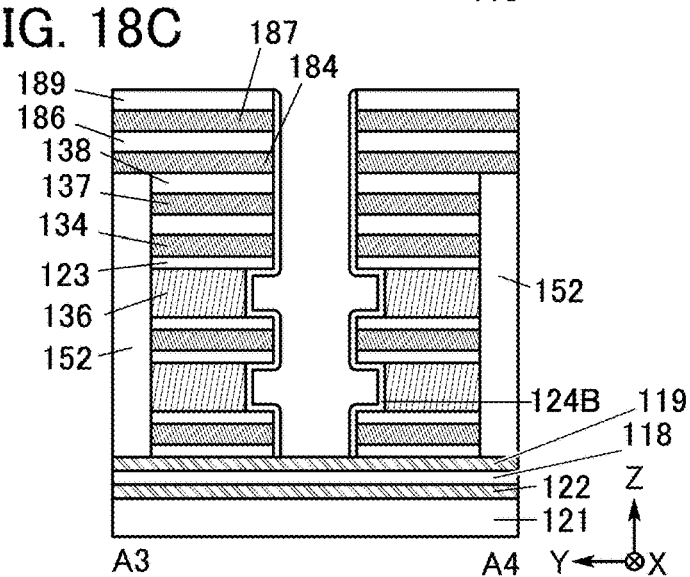
Figure 19A:
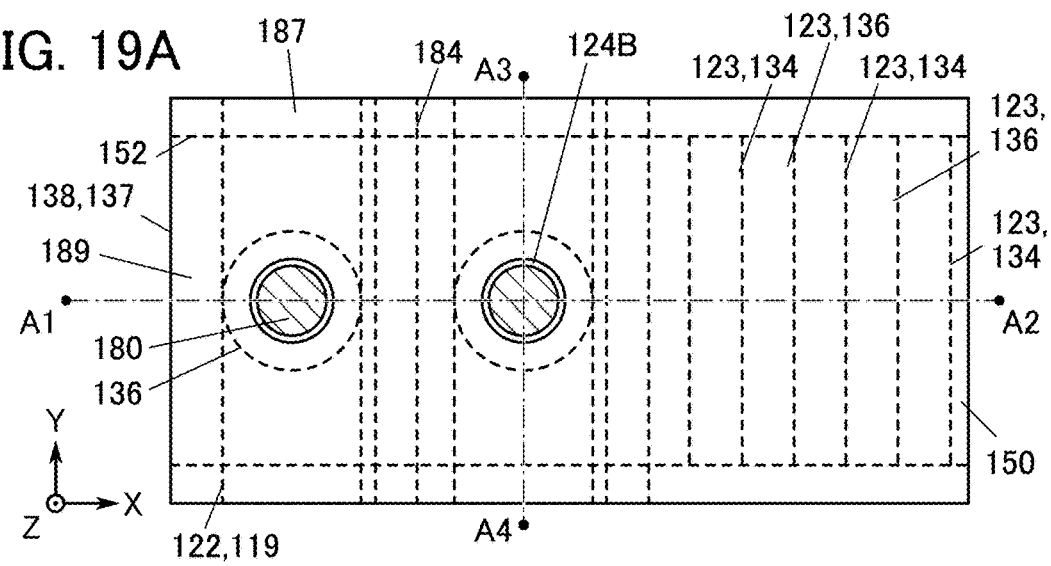
FIG. 19A to FIG. 19C are cross-sectional views illustrating a manufacturing step of a semiconductor device according to one embodiment of the present invention.
Figure 19B:
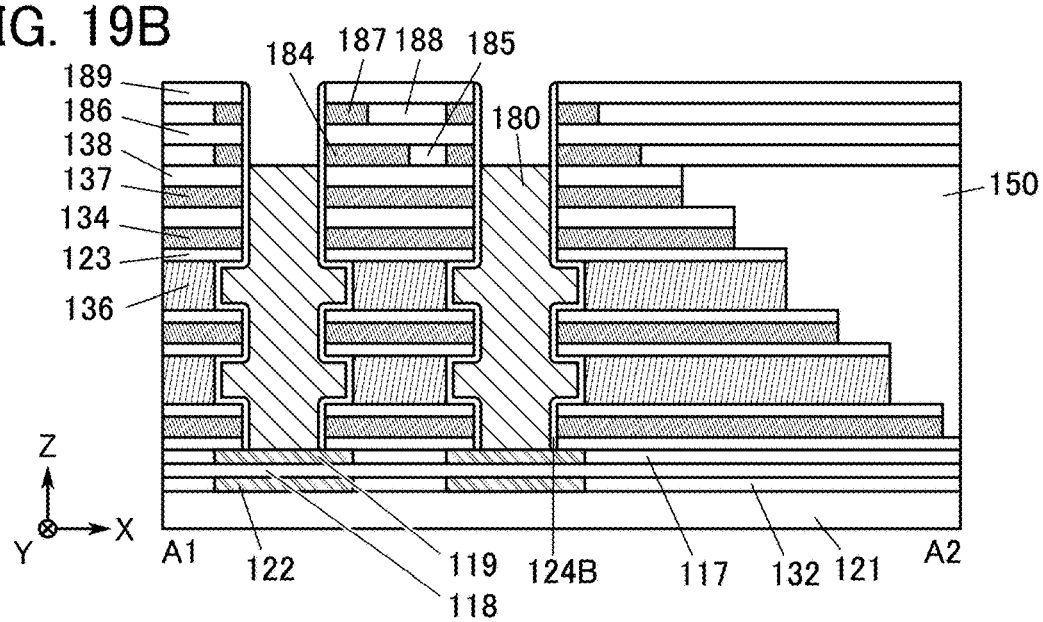
Figure 19C:
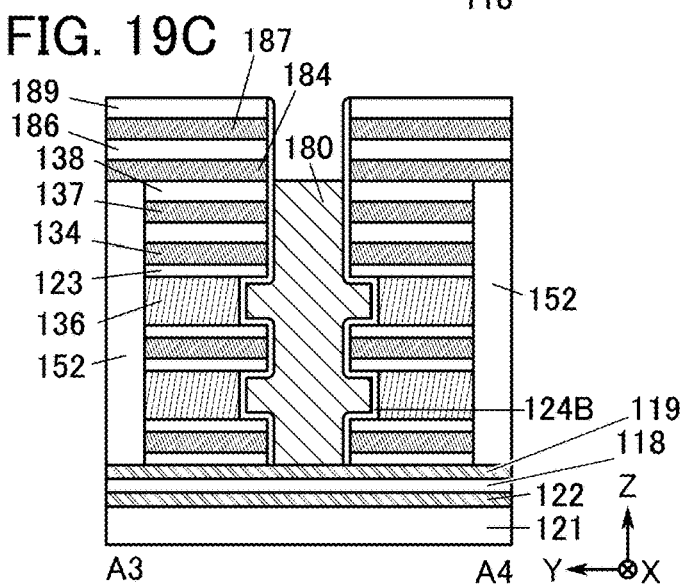
Figure 20A:
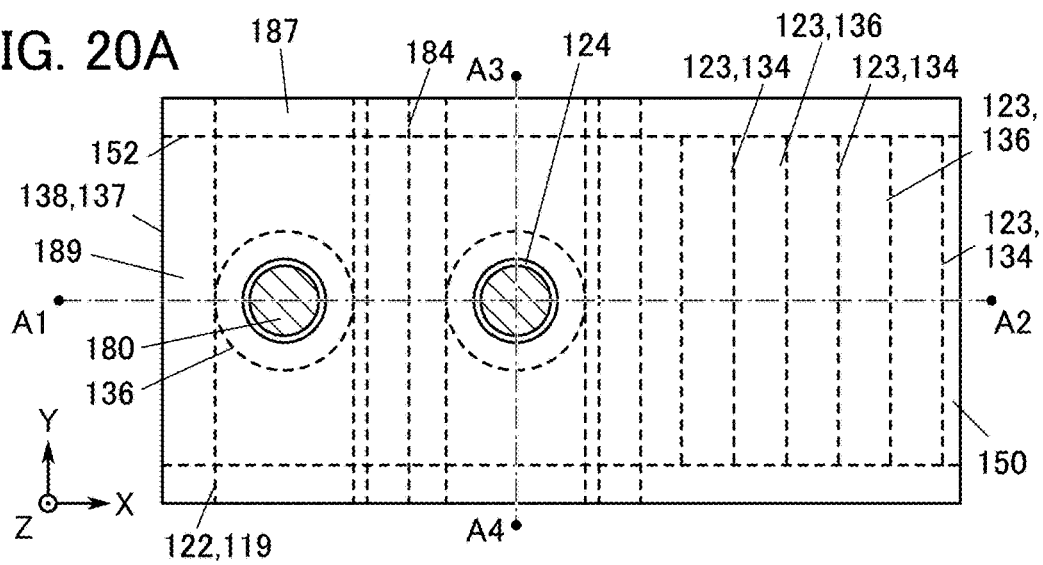
FIG. 20A to FIG. 20C are cross-sectional views illustrating a manufacturing step of a semiconductor device according to one embodiment of the present invention.
Figure 20B:
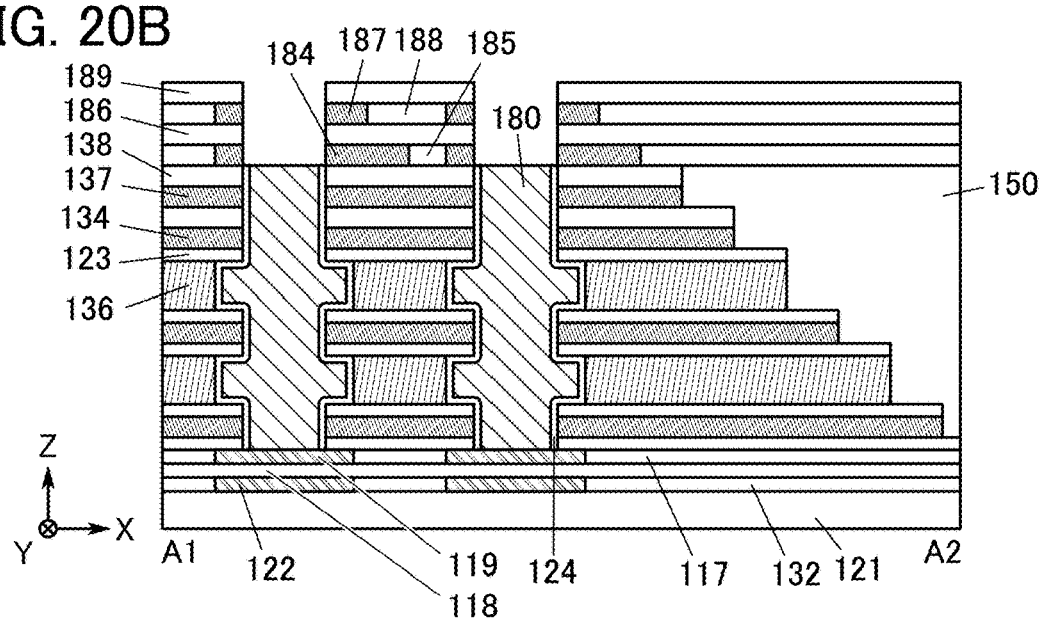
Figure 20C:
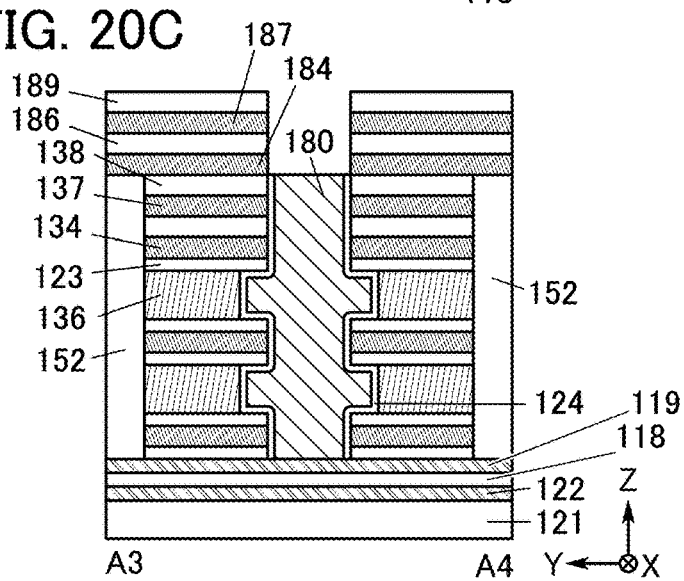

Next, the insulator 124B overlapping with the conductor 184 and the conductor 187 in the X-Y plane illustrated in FIG. 18A to FIG. 18C is removed. For the removal of the insulator 124B, first, a material 180 (also referred to as a sacrificial layer) that is easily removable in a later step is formed to be embedded in the first opening, and the material 180 is removed by etching or the like to a desired depth in the first opening (see FIG. 19A to FIG. 19C). Next, the insulator 124B exposed by the etching is removed using the material 180 as a mask, so that the insulator 124 is obtained (see FIG. 20A to FIG. 20C). After the removal of the insulator 124B, the material 180 is removed.

Figure 21A:
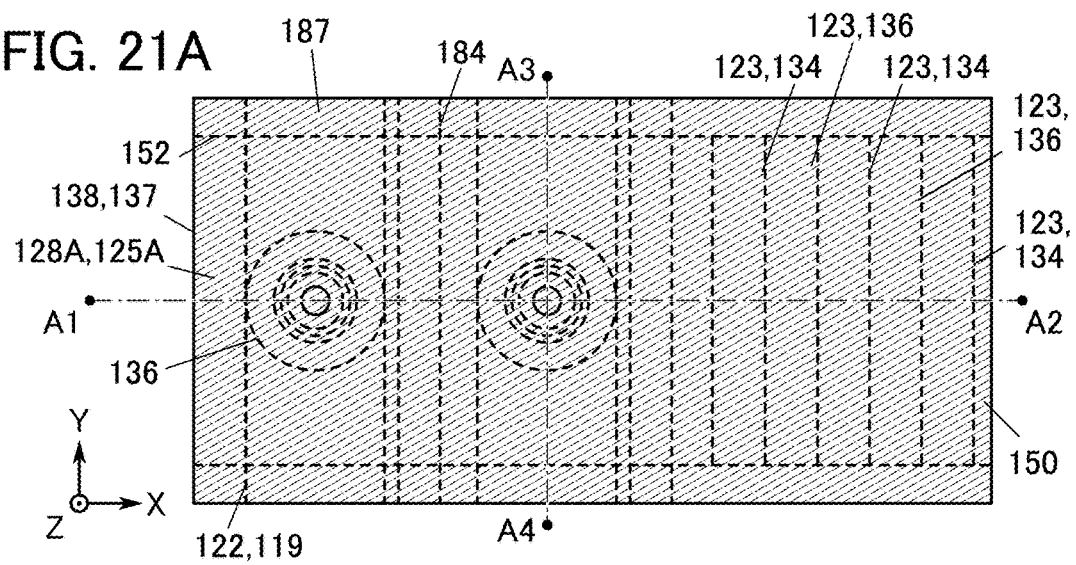
FIG. 21A to FIG. 21C are cross-sectional views illustrating a manufacturing step of a semiconductor device according to one embodiment of the present invention.
Figure 21B:
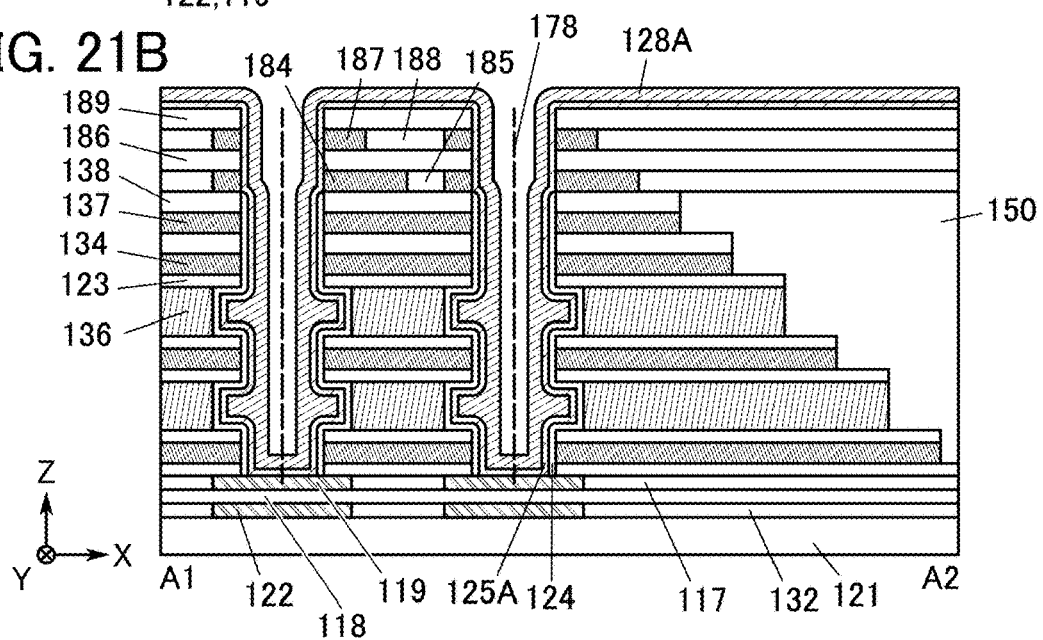
Figure 21C:
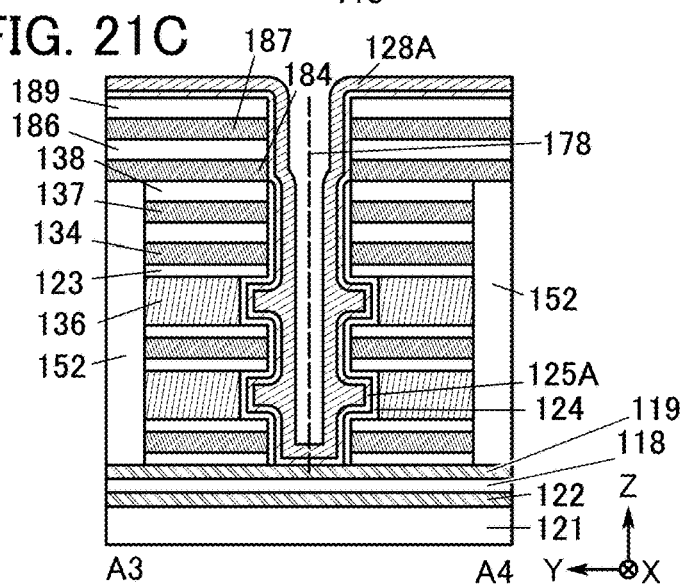

Next, a semiconductor film 125A and a conductive film 128A are formed over the insulator 189 and in the first opening (see FIG. 21A to FIG. 21C). The semiconductor film 125A is preferably provided to be in contact with at least the conductor 119, the insulator 124, and the conductor 184 in the first opening.

The semiconductor film 125A can be formed by a CVD method or an ALD method. It is particularly preferable to employ an ALD method, in which case a film with a uniform thickness can be formed even in a groove or an opening portion having a high aspect ratio. In particular, the use of plasma in a PEALD method is sometimes preferable because deposition at a lower temperature is possible. Alternatively, the semiconductor film 125A may be formed by a combination of an ALD method and a CVD method. The semiconductor film 125A is preferably an oxide semiconductor having a CAAC structure. In the case where the semiconductor film 125A is an oxide semiconductor having a CAAC structure, c-axes of the semiconductor film 125A are aligned in the direction normal to a surface on which the semiconductor film 125A is formed, in the first opening. In this case, the c-axes of the semiconductor film 125A positioned over the side surfaces of the insulator 138, the conductor 137, the insulator 123, the conductor 134, and the conductor 136 with the insulator 124 therebetween are aligned from the surface where the semiconductor film 125A is deposited toward an axis 178 illustrated in FIG. 21B and FIG. 21C. Note that the axis 178 can be referred to as a central axis of the first opening. Thus, the c-axes of the semiconductor 125 positioned as described above are aligned toward the axis 178 from the surface on which the semiconductor 125 is formed.

Here, in the case where a metal oxide is formed as the semiconductor film 125A by an ALD method, an In—Ga—Zn oxide is preferably formed using a precursor containing indium, a precursor containing gallium, and a precursor containing zinc.

As the precursor containing indium, triethylindium, tris (2,2,6,6-tetramethyl-3,5-heptanedione acid)indium, cyclopentadienylindium, indium(III) chloride, or the like can be used. As the precursor containing gallium, trimethylgallium, triethylgallium, tris(dimethylamide)gallium, gallium(III) acetylacetonate, tris(2,2,6,6-tetramethyl-3,5-heptanedione acid)gallium, dimethylchlorogallium, diethylchlorogallium, indium(III) chloride, or the like can be used. As the precursor containing zinc, dimethylzinc, diethylzinc, bis(2,2,6,6, tetramethyl-3,5-heptanedione acid)zinc, zinc chloride, or the like can be used.

The conductive film 128A is at least formed to fill the depressions of the conductor 136 with the insulator 124 and the semiconductor film 125A positioned between the conductive film 128A and the conductor 136, and need not entirely fill the inside of the first opening. The insulating film 128A can be formed by a CVD method or an ALD method. It is particularly preferable to employ an ALD method, in which case a film with a uniform thickness can be formed even in a groove or an opening portion having a high aspect ratio. In particular, the use of plasma in a PEALD method is sometimes preferable because deposition at a lower temperature is possible. Alternatively, the conductive film 128A may be formed by a combination of an ALD method and a CVD method.

Figure 22A:
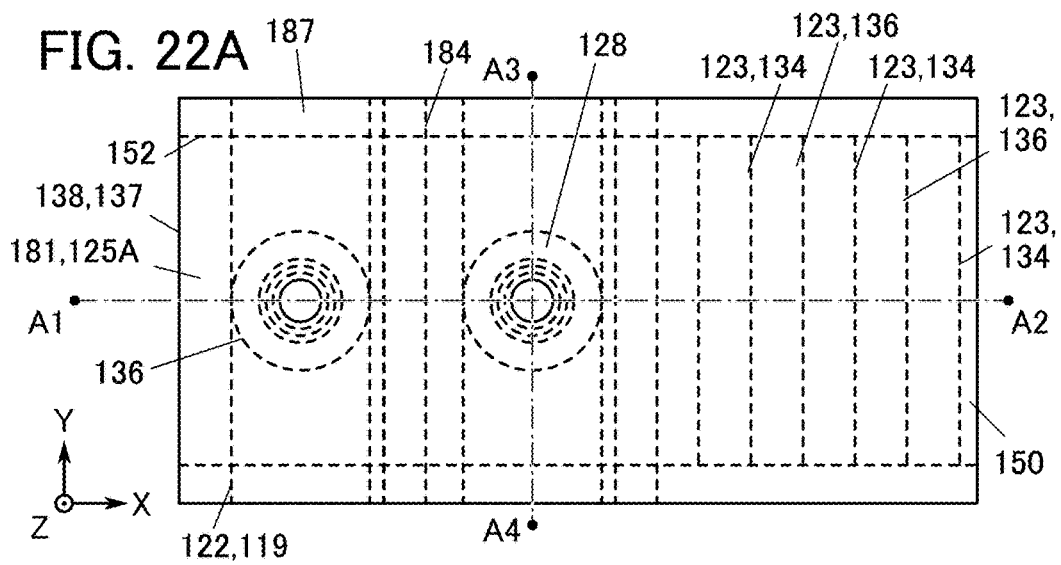
FIG. 22A to FIG. 22C are cross-sectional views illustrating a manufacturing step of a semiconductor device according to one embodiment of the present invention.
Figure 22B:
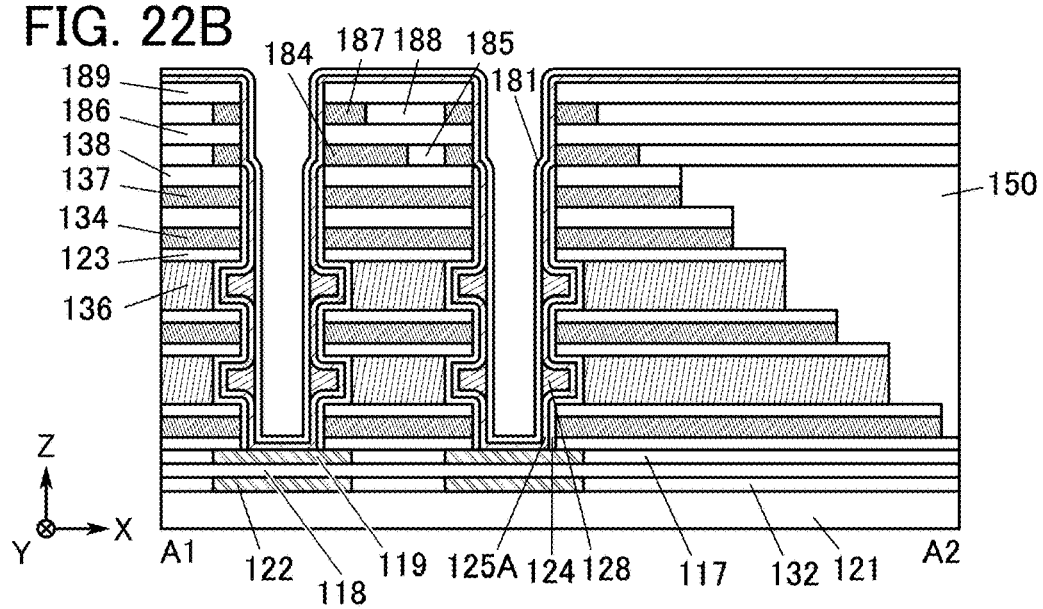
Figure 22C:
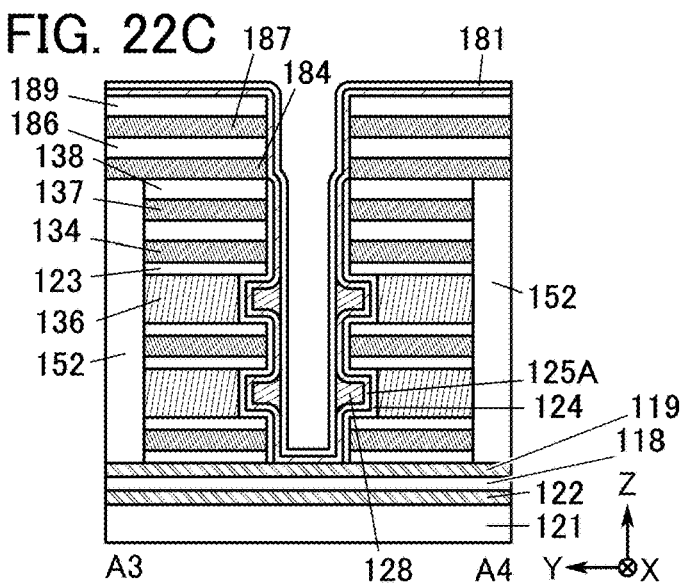
Figure 23A:
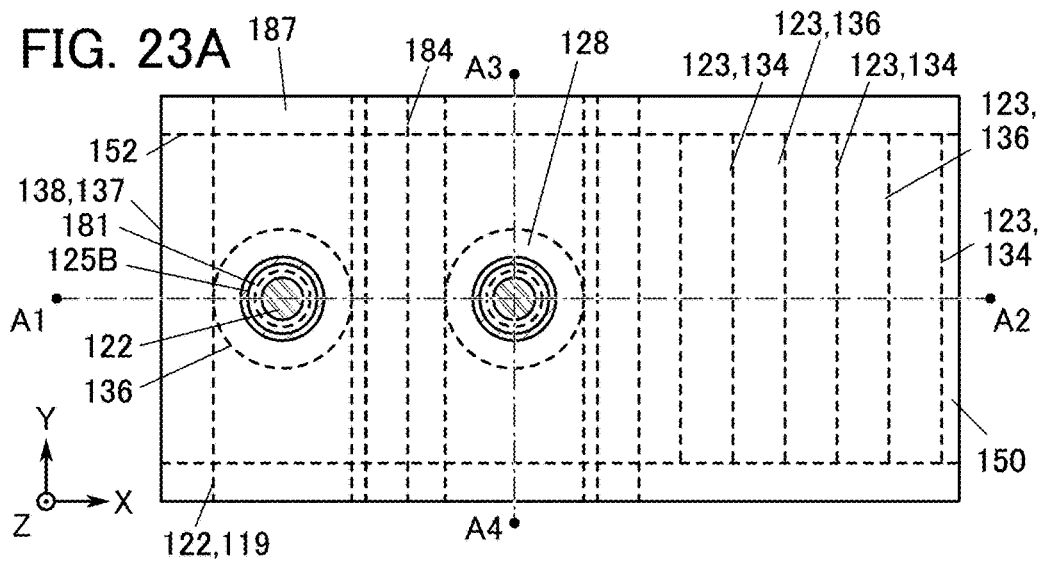
FIG. 23A to FIG. 23C are cross-sectional views illustrating a manufacturing step of a semiconductor device according to one embodiment of the present invention.
Figure 23B:
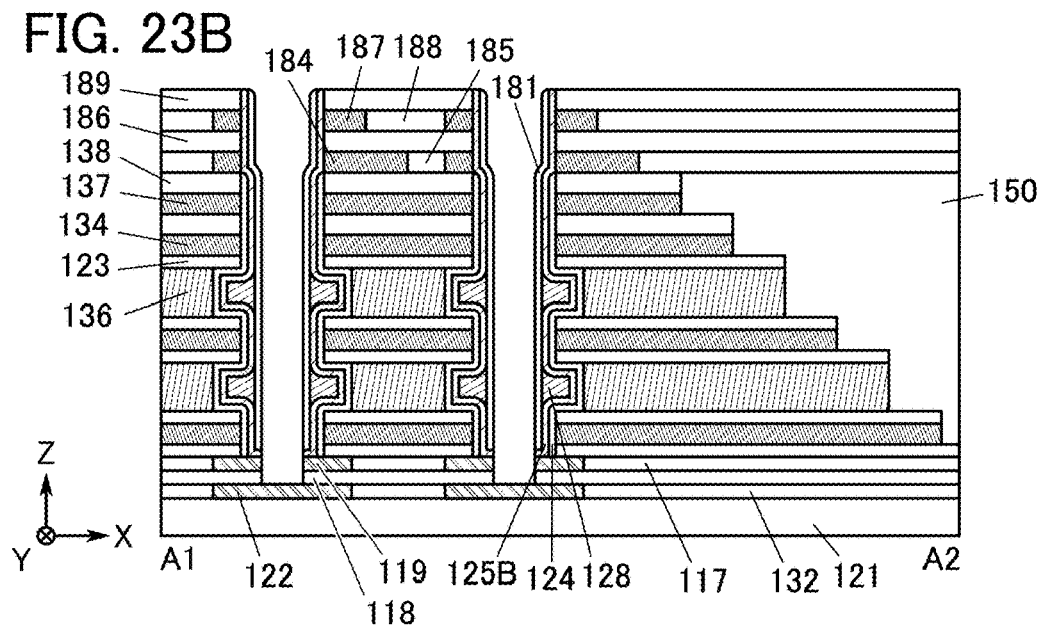
Figure 23C:
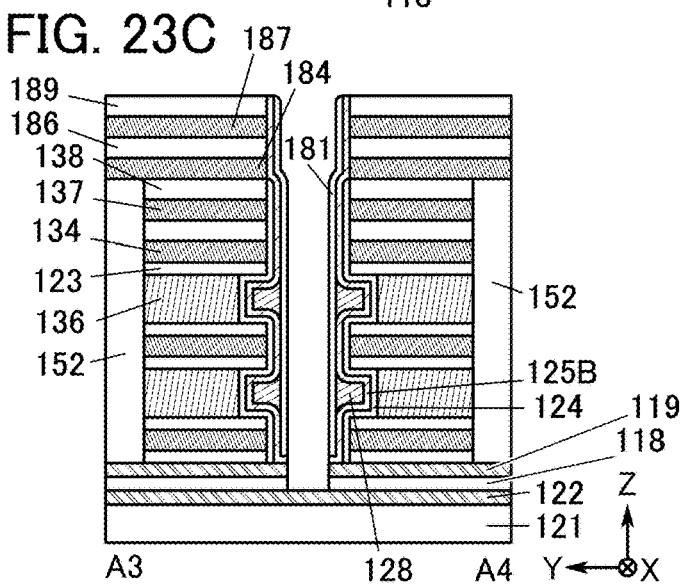

Next, the conductive film 128A is processed to form the conductors 128 (see FIG. 22A to FIG. 22C). For the processing of the conductive film 128A, isotropic etching or anisotropic etching can be used. In the case where the formed conductive film 128A fills the depressions and does not completely fill the first opening as illustrated in FIG. 21A to FIG. 21C, isotropic etching is preferably used for the processing of the conductive film 128A. By contrast, in the case where the conductive film 128A is formed to fill the depression and the first opening, anisotropic etching is preferably used. By the above-described processing, the conductor 128 can be formed inside the recessed portion.

Next, a material 181 is formed in the first opening (see FIG. 22A to FIG. 22C). The material 181 is used for a sacrificial layer that protects the semiconductor film 125A in processing of the semiconductor film 125A, the conductor 119, the insulator 118, and the like. Although the material 181 is preferably formed using an insulating material, one embodiment of the present invention is not limited thereto. The material 181 may be a conductive material. The material 181 is a material that can be formed for the insulating film 124A and can be formed with a method used for formation of the insulating film 124A.

Next, the resistance of part of the semiconductor film 125A is increased using the conductors 128 as a mask to form high-resistance regions (i-type regions). In a formation method of the high-resistance regions, irradiation of the semiconductor film 125A with a microwave is performed to remove hydrogen contained in the semiconductor film 125A. The microwave irradiation is preferably performed in an atmosphere containing oxygen, in which case oxygen is supplied to the semiconductor film 125A. In this embodiment, the semiconductor film 125A is irradiated with the microwave in an atmosphere containing oxygen and argon, whereby the resistance of a first region of the semiconductor film 125A that is not covered with the conductor 128 is increased.

Here, heat treatment may be performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

The resistance of a second region of the semiconductor film 125A in contact with the conductor 128 can be decreased by heat treatment, so that a low-resistance region (N-type region) can be formed. The heat treatment performed in the state where the semiconductor film 125A and the conductor 128 are in contact with each other sometimes forms a metal compound layer containing a metal element contained in the conductor 128 and a component of the semiconductor film 125A at an interface between the conductor 128 and the semiconductor film 125A. The metal compound layer is preferably formed, in which case the resistance of the semiconductor film 125A in the region in contact with the conductor 128 is reduced. In addition, oxygen contained in the semiconductor film 125A is absorbed by the conductor 128 in some cases. The heat treatment performed in the state where the semiconductor film 125A and the conductor 128 are in contact with each other further reduces the resistance of the semiconductor film 125A. The heat treatment may also be performed before the microwave treatment. Since the second region whose resistance is reduced by the heat treatment is covered with the conductors 128, the second region is not affected by the microwave and can maintain the low resistance value even after the microwave treatment.

It is preferable that the carrier concentration of the first region after the above-described microwave treatment and heat treatment be lower than $1\times10^{18}/cm^3$, further preferably lower than or equal to $1\times10^{17}/cm^3$, still further preferably lower than or equal to $1\times10^{16}/cm^3$. The carrier concentration of the second region is preferably higher than or equal to $1\times10^{18}/cm^3$, further preferably higher than or equal to $1\times10^{19}/cm^3$, still further preferably higher than or equal to $1\times10^{20}/cm^3$.

Note that the treatment of increasing the resistance of the semiconductor film 125A is not limited to the timing after the material 181 is formed. The treatment of increasing the resistance may be performed before the formation of the material 181. Alternatively, the treatment of increasing the resistance may be performed before formation of an insulating film 126A described later or may be performed after the formation of the insulating film 126A.

Next, the material 181, the semiconductor film 125A, the conductor 119, and the insulator 118 formed in the bottom portion of the first opening are removed, so that a semiconductor 125B is obtained. Anisotropic etching is preferably used to remove the semiconductor film 125A, the material 181, the conductor 119, and the insulator 118. At this time, the semiconductor film 125A and the material 181 over the insulator 189 are also removed, which results in formation of the semiconductor 125B only on the sidewall of the first opening (see FIG. 23A to FIG. 23C). The semiconductor film 125A, the material 181, the conductor 119, and the insulator 118 in the bottom portion of the first opening are removed, whereby the conductor 122 is exposed.

Figure 24A:
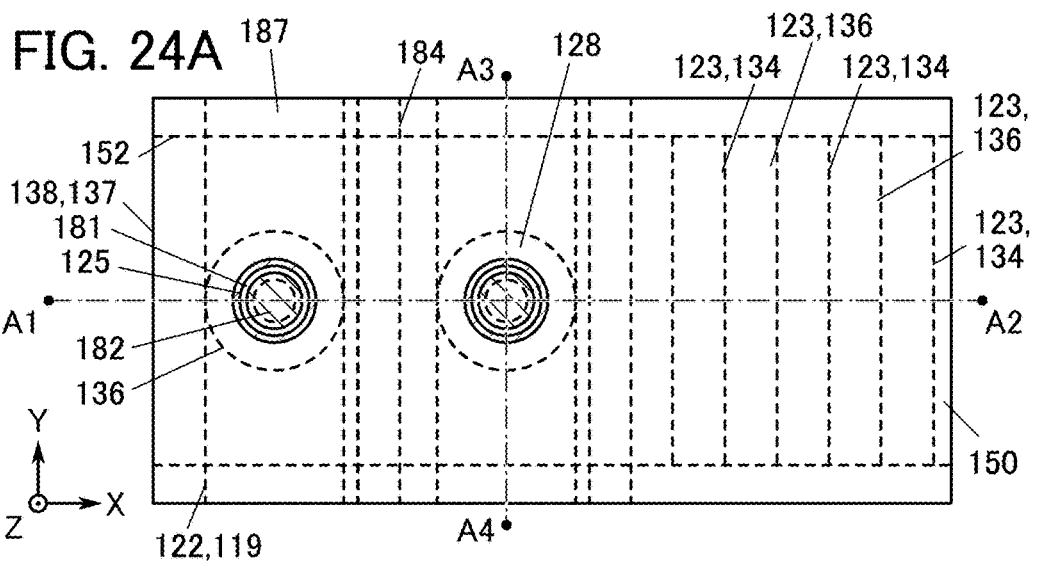
FIG. 24A to FIG. 24C are cross-sectional views illustrating a manufacturing step of a semiconductor device according to one embodiment of the present invention.
Figure 24B:
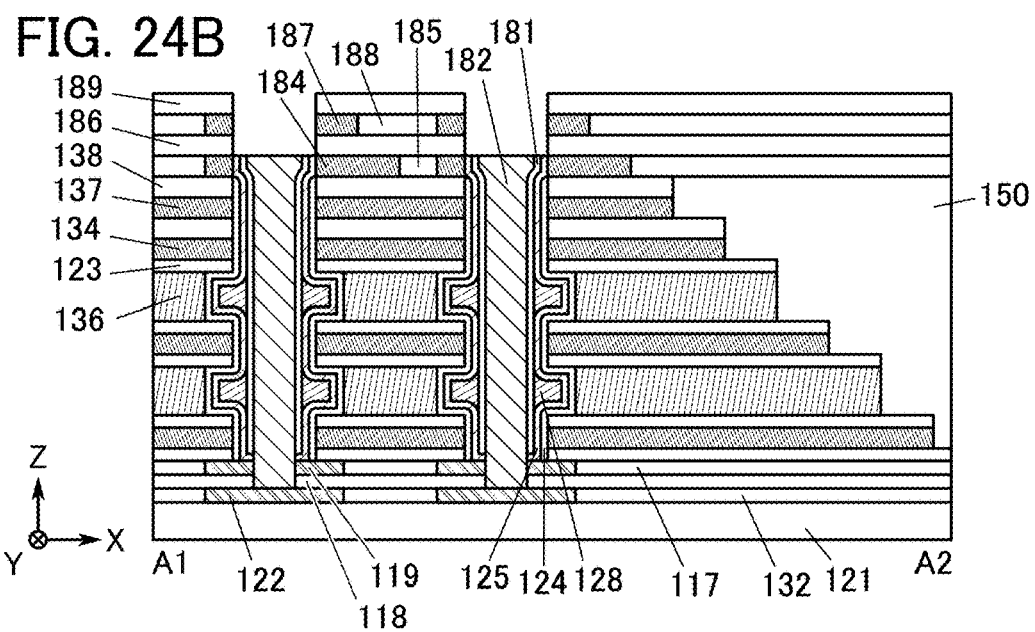
Figure 24C:
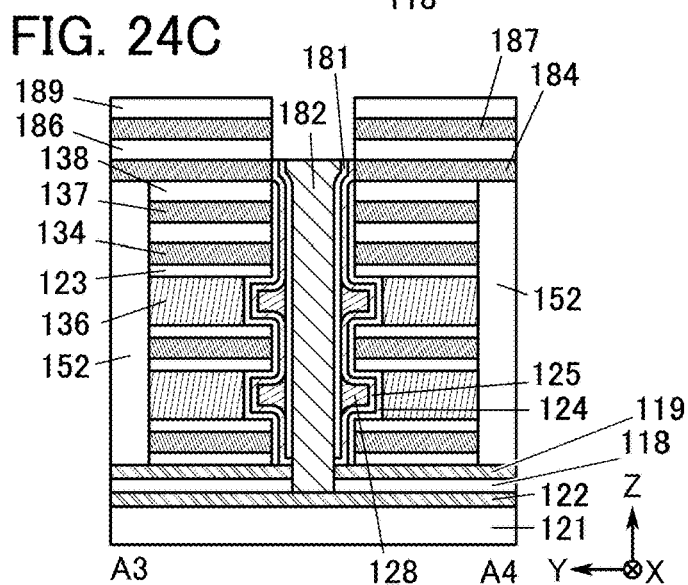

Next, in the X-Y plane illustrated in FIG. 24A to FIG. 24C, the material 181 and the semiconductor 125B overlapping with the conductor 187 are removed. For the removal of the semiconductor 125B, first, a material 182 (also referred to as a sacrificial layer) that is removable in a later step is formed to be embedded in the first opening, and part of the material 182 is removed by etching or the like to a desired depth in the first opening (see FIG. 24A to FIG. 24C). Next, with use of the material 182 as a mask, the material 181 and the semiconductor 125B exposed by the etching are removed, so that the semiconductor 125 is obtained (see FIG. 24A to FIG. 24C). After the semiconductor 125B is removed, the material 182 and the material 181 are removed.

Figure 25A:
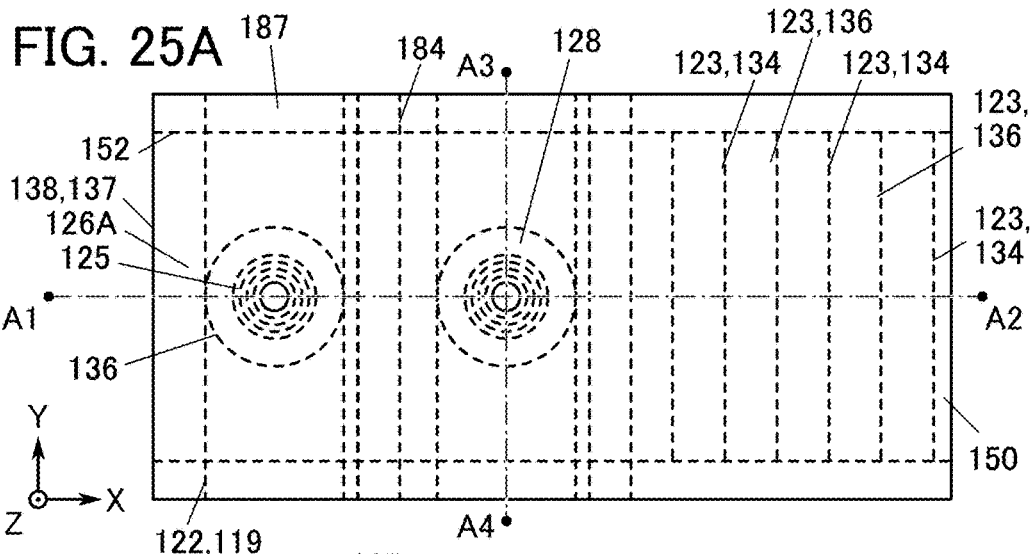
FIG. 25A to FIG. 25C are cross-sectional views illustrating a manufacturing step of a semiconductor device according to one embodiment of the present invention.
Figure 25B:
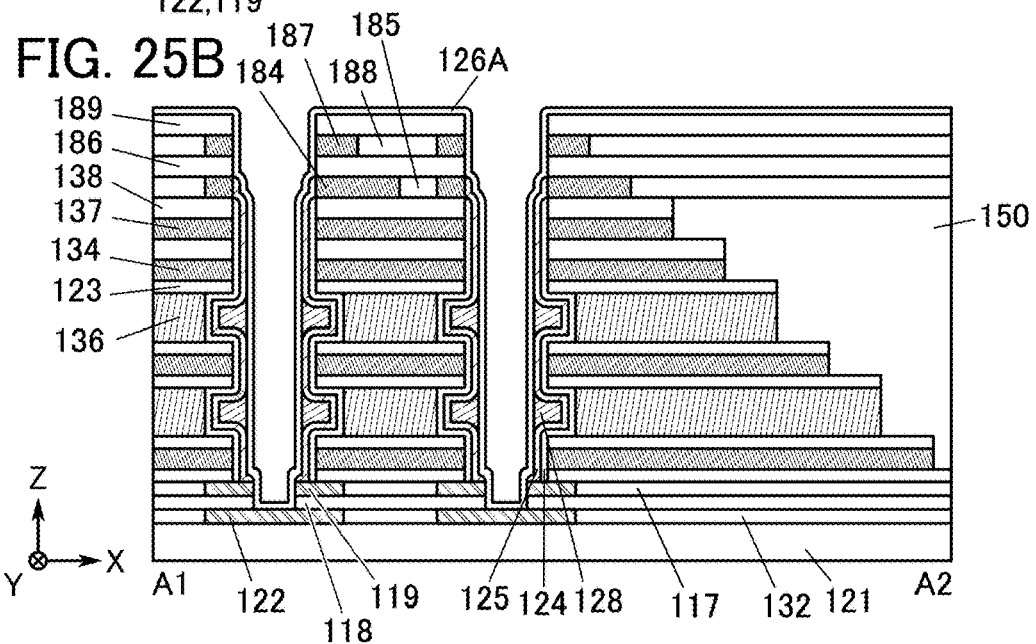
Figure 25C:
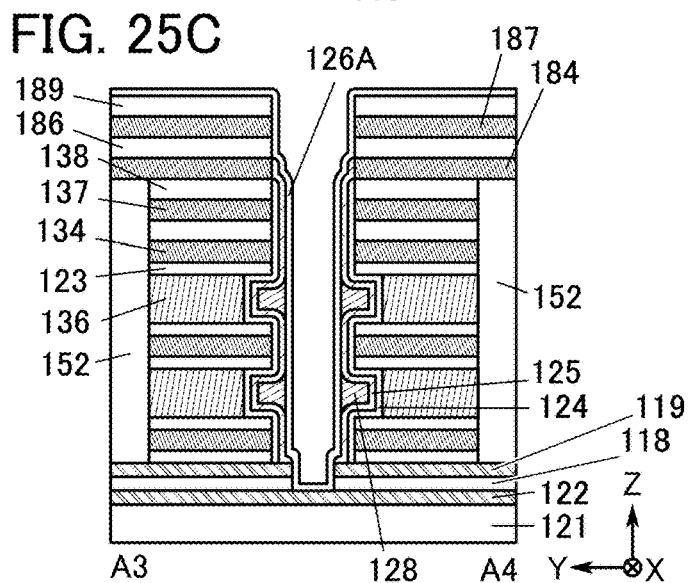
Figure 26A:
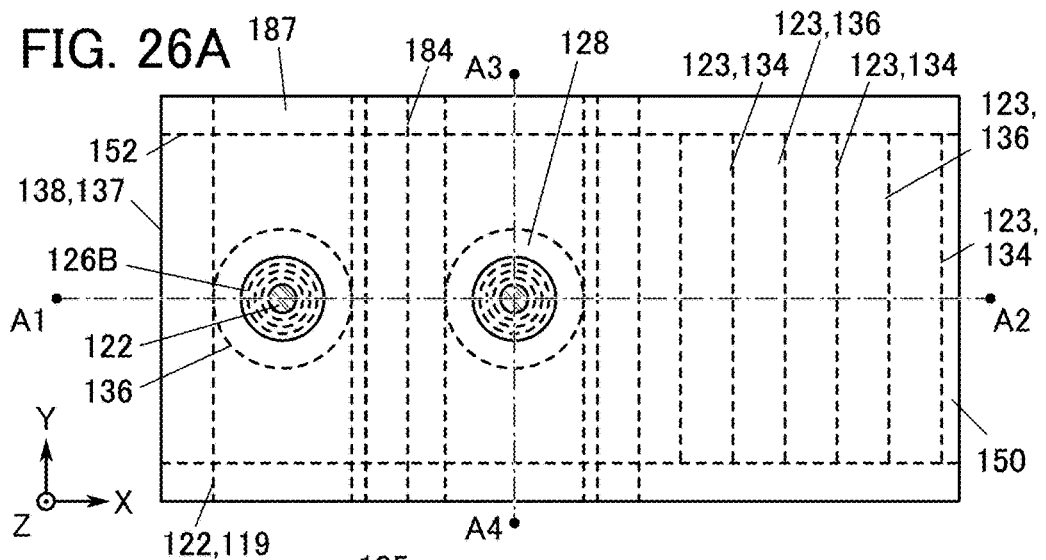
FIG. 26A to FIG. 26C are cross-sectional views illustrating a manufacturing step of a semiconductor device according to one embodiment of the present invention.
Figure 26B:
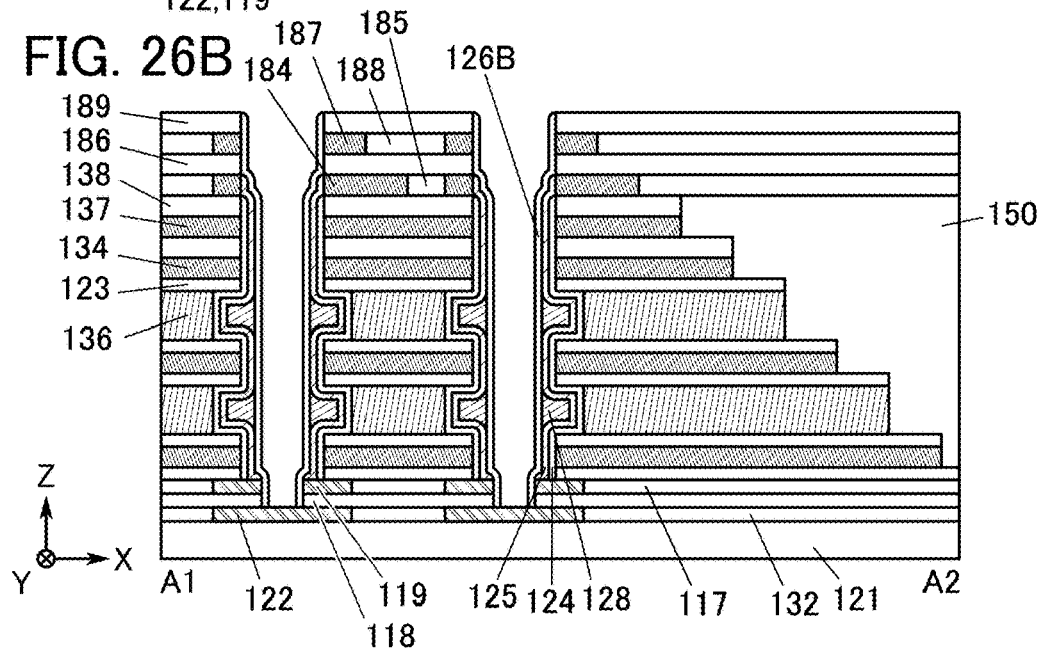
Figure 26C:
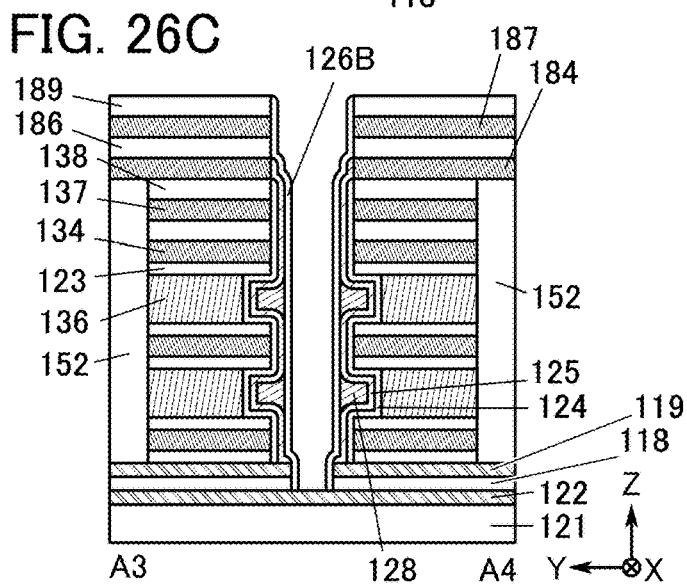

Next, the insulating film 126A is formed over the insulator 189 and in the first opening (see FIG. 25A to FIG. 25C). Although not illustrated, the insulating film 126A may have a stacked-layer structure. The insulating film 126A can be formed by a CVD method or an ALD method. It is particularly preferable to employ an ALD method, in which case a film with a uniform thickness can be formed even in a groove or an opening portion having a high aspect ratio. In particular, the use of plasma in a PEALD method is sometimes preferable because deposition at a lower temperature is possible. Alternatively, the insulating film 126A may be formed by a combination of an ALD method and a CVD method. In the case where the insulating film 126A has a stacked-layer structure, insulating films may be formed in the same deposition apparatus or different deposition apparatuses.

Then, the insulating film 126A formed in a bottom portion of the first opening is removed, so that an insulator 126B is obtained. Anisotropic etching is preferably used to remove the insulating film 126A. At this time, the insulating film 126A over the insulator 189 is also removed; thus, the insulator 126B is provided only on the sidewall of the first opening (see FIG. 26A to FIG. 26C). The conductor 122 is exposed again by removal of the insulating film 126A in the bottom portion of the first opening.

Figure 27A:
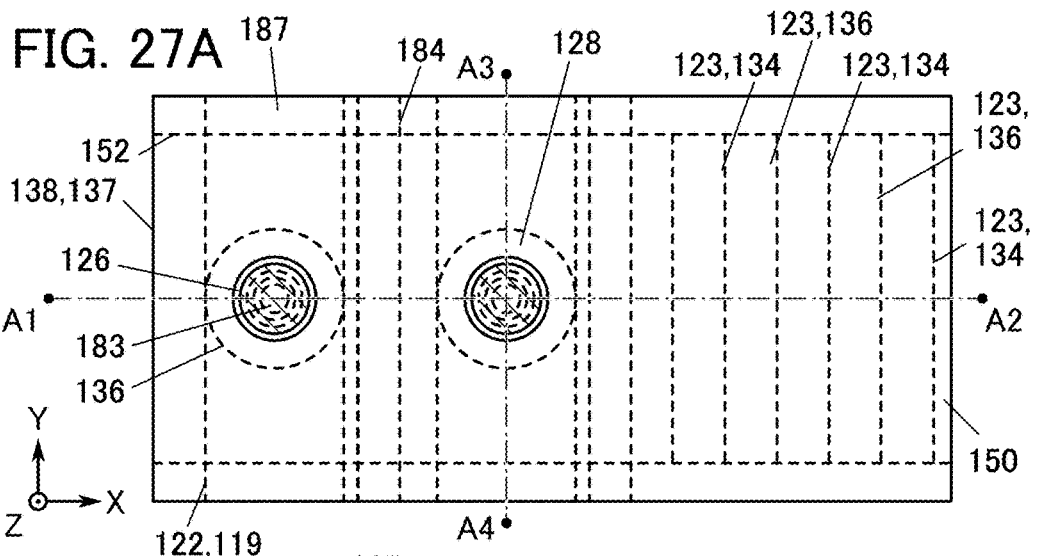
FIG. 27A to FIG. 27C are cross-sectional views illustrating a manufacturing step of a semiconductor device according to one embodiment of the present invention.
Figure 27B:
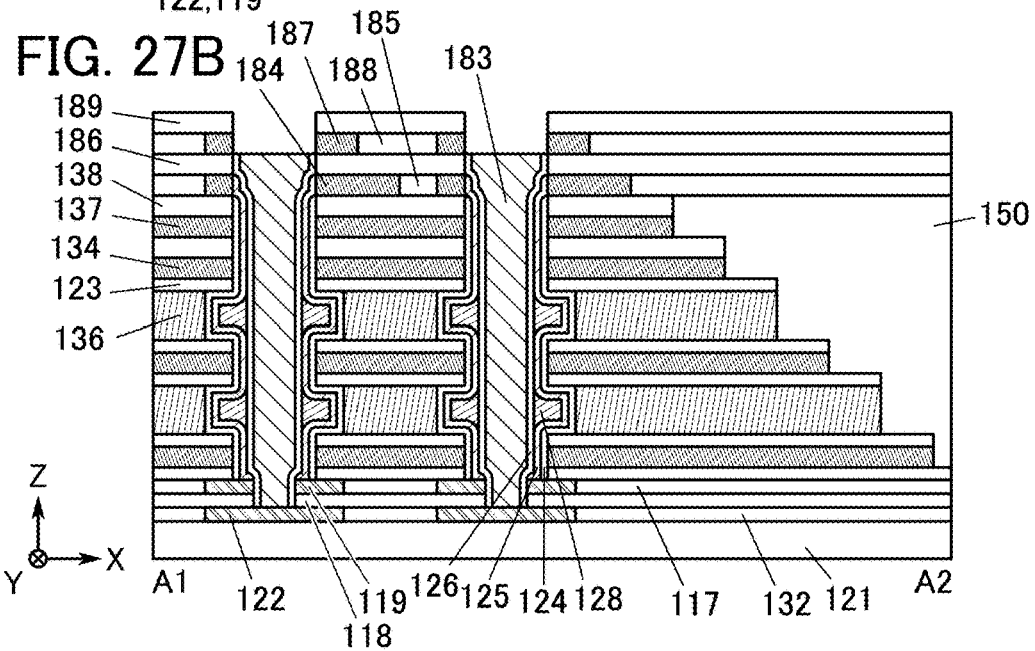
Figure 27C:
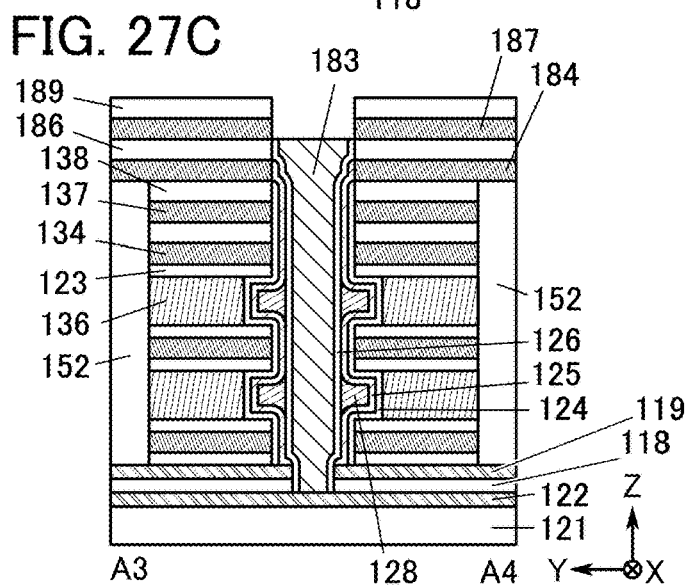

Next, in the X-Y plane illustrated in FIG. 27A to FIG. 27C, the insulator 126B overlapping with the conductor 187 is removed. For the removal of the insulator 126B, first, a material 183 (also referred to as a sacrificial layer) that is removable in a later step is formed to be embedded in the first opening, and part of the material 183 is removed by etching or the like to a desired depth in the first opening (see FIG. 27A to FIG. 27C). Next, with use of the material 183 as a mask, the insulator 126B exposed by the etching is removed, so that an insulator 126 is obtained (see FIG. 27A to FIG. 27C). After the insulator 126B is removed, the material 183 is removed.

Figure 28A:
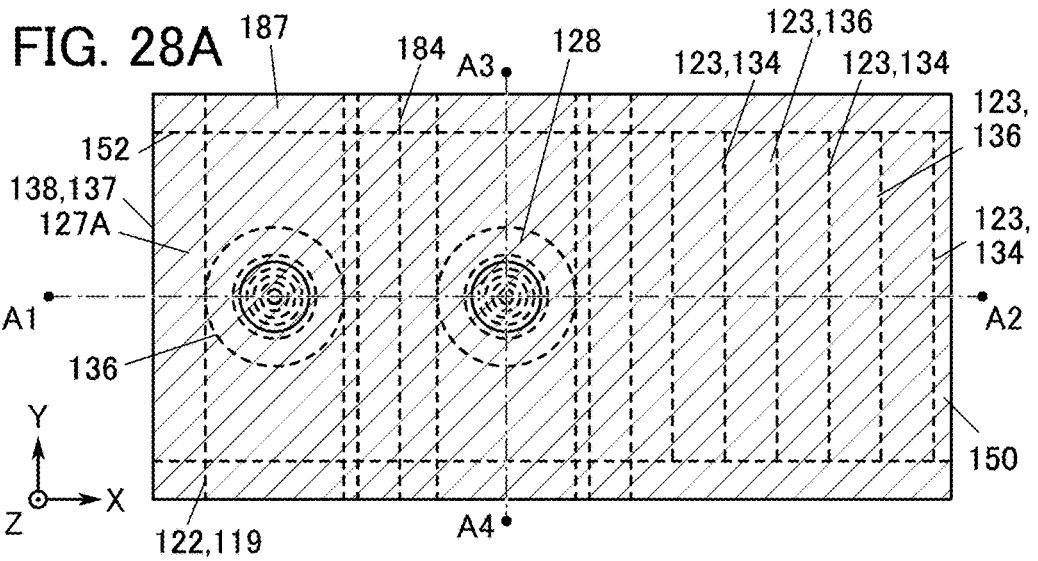
FIG. 28A to FIG. 28C are cross-sectional views illustrating a manufacturing step of a semiconductor device according to one embodiment of the present invention.
Figure 28B:
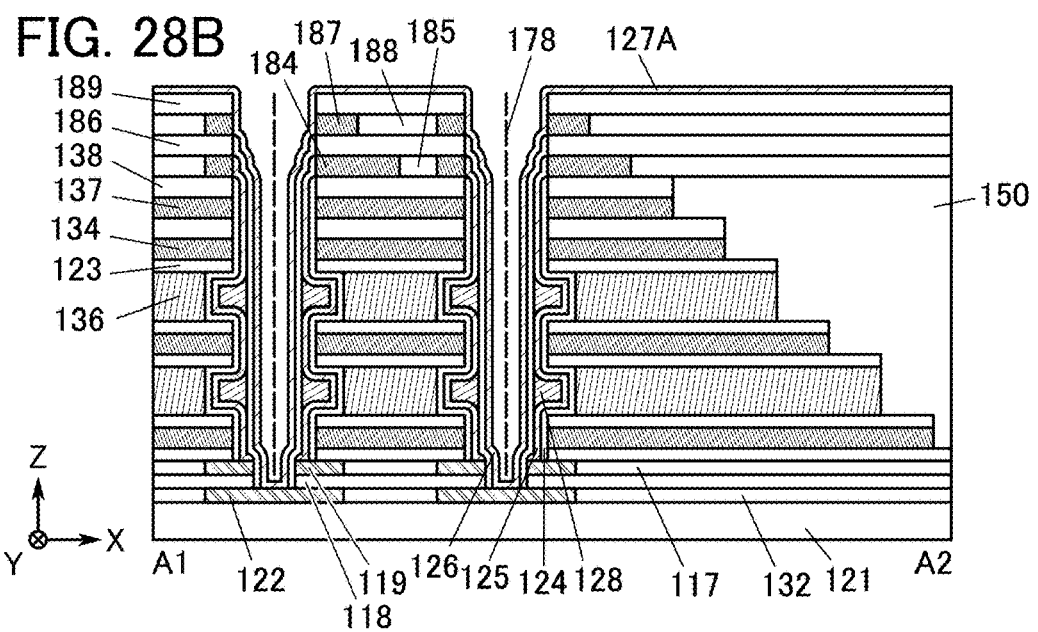
Figure 28C:
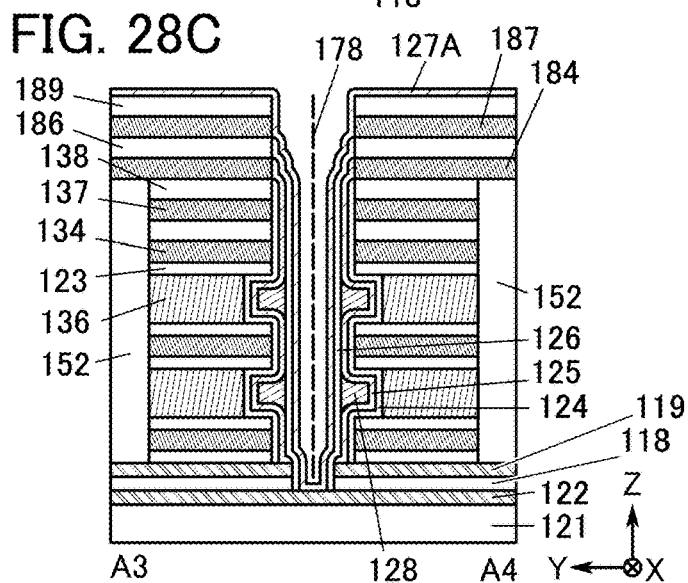
Figure 29A:
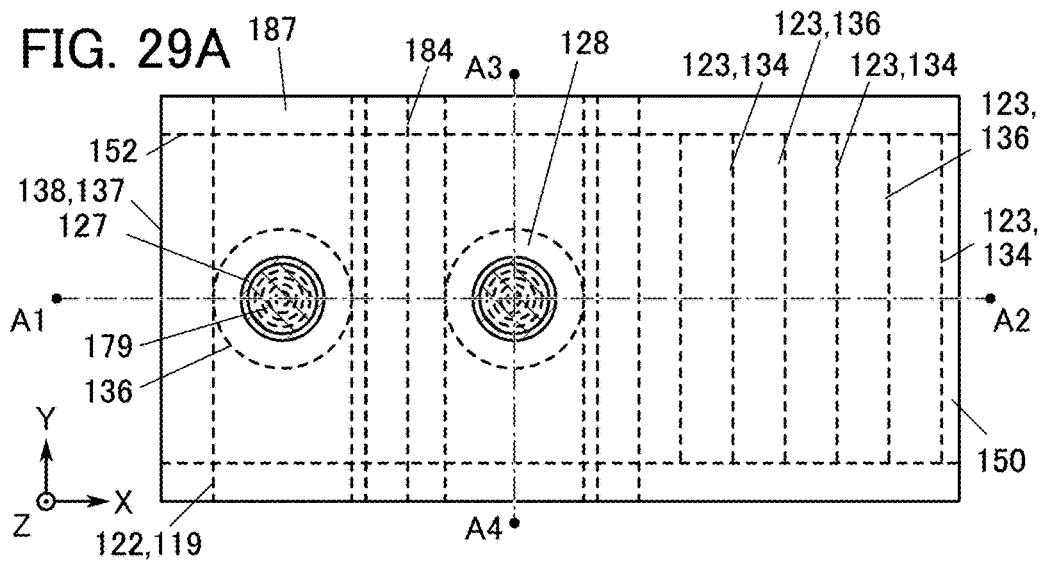
FIG. 29A to FIG. 29C are cross-sectional views illustrating a manufacturing step of a semiconductor device according to one embodiment of the present invention.
Figure 29B:
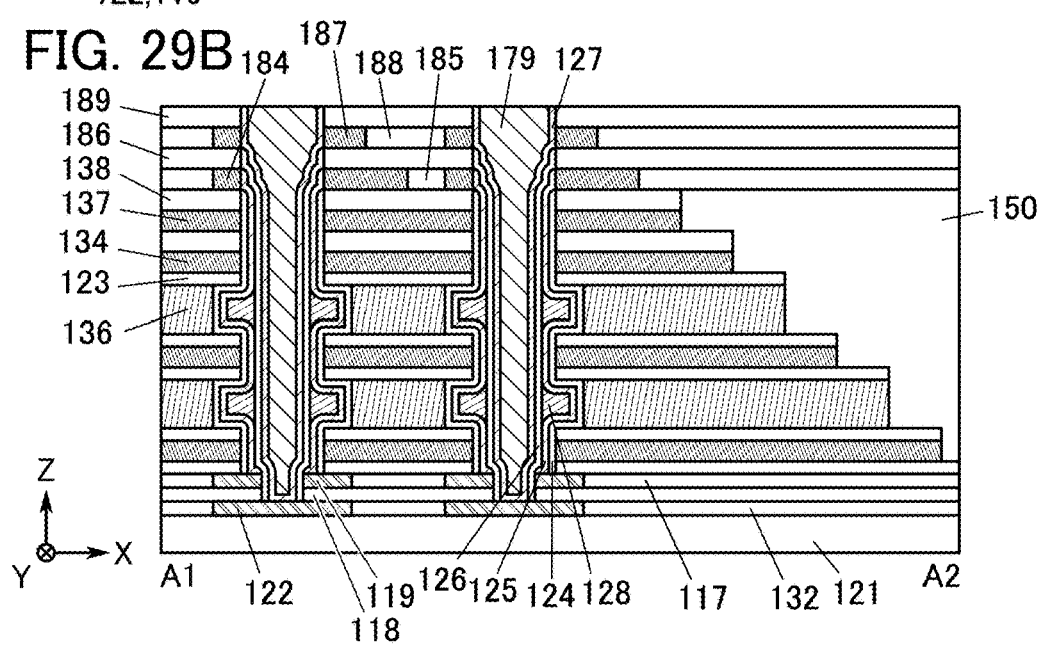
Figure 29C:
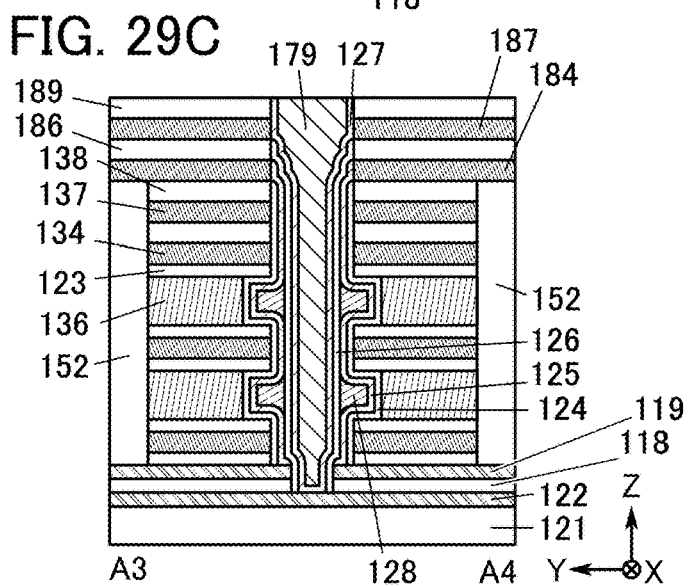

Then, a semiconductor film 127A is formed in the first opening to be partially in contact with the conductor 122 (see FIG. 28A to FIG. 28C). The semiconductor film 127A can be formed by a CVD method or an ALD method. It is particularly preferable to employ an ALD method, in which case a film with a uniform thickness can be formed even in a groove or an opening portion having a high aspect ratio. In particular, the use of plasma in a PEALD method is sometimes preferable because deposition at a lower temperature is possible. Alternatively, the semiconductor film 127A may be formed by a combination of an ALD method and a CVD method. At this time, the semiconductor film 127A is preferably formed to be partially in contact with the conductor 187. The semiconductor film 127A is preferably an oxide semiconductor having a CAAC structure. In the case where the semiconductor film 127A is an oxide semiconductor having a CAAC structure, c-axes of the semiconductor film 127A are aligned in the direction normal to a surface on which the semiconductor film 127A is formed, in the first opening. In this case, c-axes of the semiconductor film 127A positioned on the side surface of the first opening are aligned toward the axis 178 illustrated in FIG. 28B and FIG. 28C from the surface on which the semiconductor film 127A is formed. Thus, the c-axes of the semiconductor 127 positioned as described above are aligned toward the axis 178 from the surface on which the semiconductor 127 is formed.

Here, in the case where a metal oxide is formed as the semiconductor film 127A by an ALD method, an In—Ga—Zn oxide is preferably formed using a precursor containing indium, a precursor containing gallium, and a precursor containing zinc.

As the precursor containing indium, triethylindium, tris(2,2,6,6-tetramethyl-3,5-heptanedione acid)indium, cyclopentadienylindium, indium(III) chloride, or the like can be used. As the precursor containing gallium, trimethylgallium, triethylgallium, tris(dimethylamide)gallium, gallium(III) acetylacetonate, tris(2,2,6,6-tetramethyl-3,5-heptanedione acid)gallium, dimethylchlorogallium, diethylchlorogallium, indium(III) chloride, or the like can be used. As the precursor containing zinc, dimethylzinc, diethylzinc, bis(2,2,6,6-tetramethyl-3,5-heptanedione acid)zinc, zinc chloride, or the like can be used.

Next, the semiconductor film 127A formed over the insulator 189 is removed. For the removal of the semiconductor film 127A, first, a material 179 (also referred to as a sacrificial layer) that is removable in a later step is formed to be embedded on the inner side of the semiconductor film 127A in the first opening. Then, with use of the material 179 as a mask, the semiconductor film 127A is removed, so that the semiconductor 127 is obtained (see FIG. 29A to FIG. 29C). To remove the semiconductor film 127A, etching, a CMP method, or the like can be used. In the case where the semiconductor film 127A is removed by etching, dry etching or wet etching may be employed. After the semiconductor film 127A is removed, the material 179 is removed.

Figure 30A:
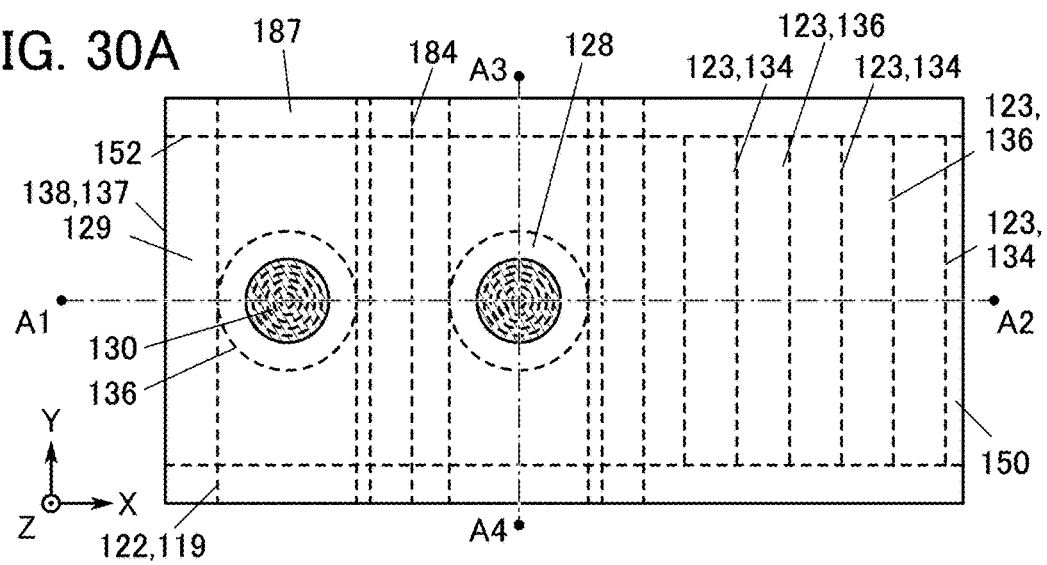
FIG. 30A to FIG. 30C are cross-sectional views illustrating a manufacturing step of a semiconductor device according to one embodiment of the present invention.
Figure 30B:
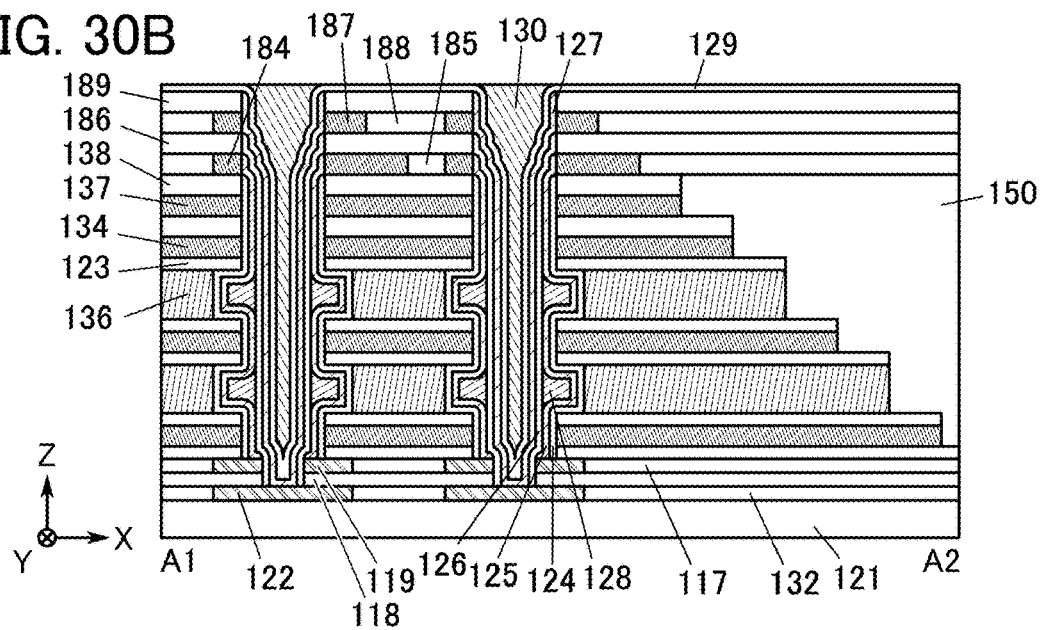
Figure 30C:
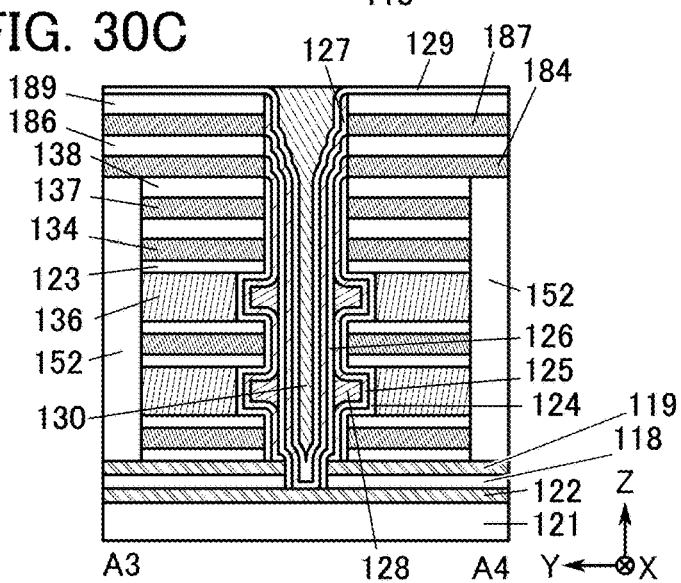

Next, the insulator 129 is formed over the insulator 189 and on the inner side of the semiconductor 127, and the conductor 130 is formed on the inner side of the insulator 129 (see FIG. 30A to FIG. 30C). The insulator 129 and the conductor 130 can be formed by a CVD method or an ALD method. It is particularly preferable to employ a CVD method or an ALD method, in which case a film with a uniform thickness can be formed even in a groove or an opening portion having a high aspect ratio. Alternatively, the films may be formed by a combination of an ALD method and a CVD method. Alternatively, the films may be formed using different deposition methods or different deposition apparatuses. For example, the insulator 129 can be formed using a material and a method that can be used for the formation of the insulating film 124A. The conductor 130 can be formed using a material and a method that can be used for the formation of the conductive film 128A.

Here, the semiconductor film 127 may be subjected to treatment of increasing resistance similar to that performed on the semiconductor film 125A. In the case where the treatment of increasing resistance is performed on the semiconductor film 127, the treatment is preferably performed before the formation of the conductor 130 or before the formation of the insulator 129. In the case where the resistance of the first region of the semiconductor 125 can also be increased by the treatment of increasing resistance performed on the semiconductor film 127A, the treatment of increasing resistance in the aforementioned step may be omitted.

Then, heat treatment is performed. The heat treatment is preferably performed in an atmosphere containing nitrogen at higher than or equal to 200° C. and lower than or equal to 500° C., preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

The conductor 130 can be obtained in the following manner: a conductive film is formed over the insulator 129 and on the inner side of the insulator 129; and the conductive film is removed by a CMP method or the like until the surface of the insulator 129 is exposed (see FIG. 30A to FIG. 30C). Note that the above-described heat treatment may be performed after the formation of the conductor 130.

Figure 31A:
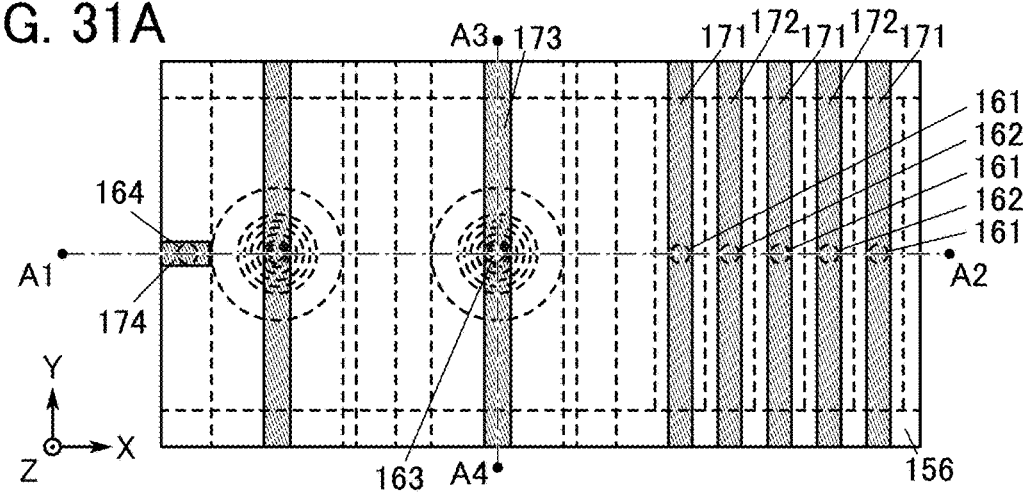
FIG. 31A to FIG. 31C are cross-sectional views illustrating a manufacturing step of a semiconductor device according to one embodiment of the present invention.
Figure 31B:
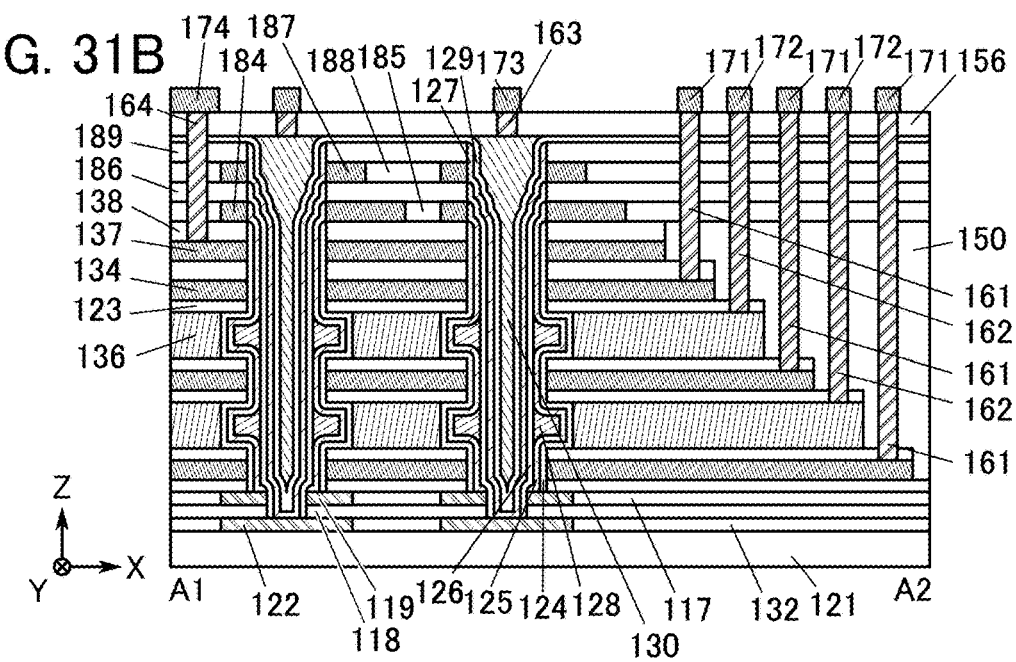
Figure 31C:
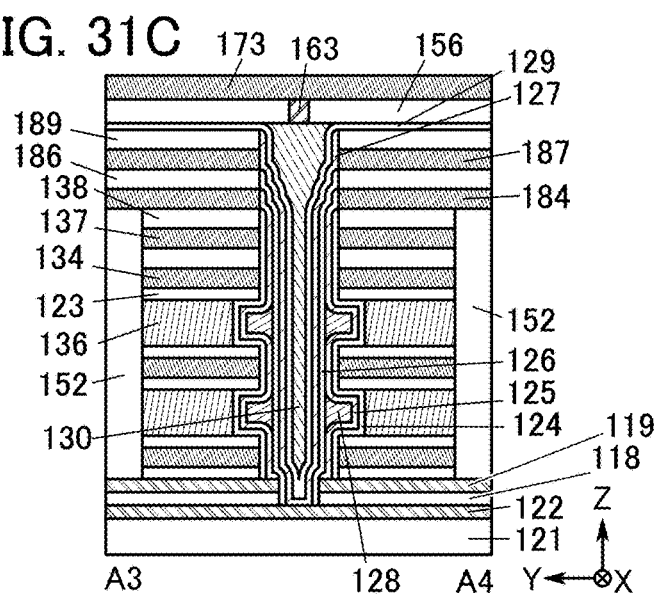

Next, an insulator 156 is formed over the conductor 130 and the insulator 129 (see FIG. 31A to FIG. 31C). The insulator 156 can be formed by a CVD method, an ALD method, a sputtering method, or the like.

Next, the insulator 156, the insulator 129, the insulator 189, the insulator 188, the insulator 186, the insulator 185, the insulator 138, the insulator 150, and the insulator 123 are processed by a lithography method, whereby second openings are formed so as to expose the conductor 134, the conductor 136, the conductor 130, and the conductor 137. The second openings are formed for each of the conductors 134 and the conductors 136 formed stepwise (see FIG. 31A to FIG. 31C). Although not illustrated, an opening in which the conductor 184 and the conductor 187 are exposed and an opening in which the conductor 119 and the conductor 122 are exposed may be formed in the above step.

Next, a conductor 161 electrically connected to the conductor 134, a conductor 162 electrically connected to the conductor 136, a conductor 163 electrically connected to the conductor 130, and a conductor 164 electrically connected to the conductor 137 are formed so as to be embedded in the second openings (see FIG. 31A to FIG. 31C). The conductor 161, the conductor 162, the conductor 163, and the conductor 164 can be formed by a CVD method or an ALD method. It is particularly preferable to employ an ALD method, in which case a film with a uniform thickness can be formed even in a groove or an opening portion having a high aspect ratio. Alternatively, the conductors may be formed by a combination of an ALD method and a CVD method. The conductor 161, the conductor 162, the conductor 163, and the conductor 164 may have a stacked-layer structure composed of a plurality of layers. The conductor 161, the conductor 162, the conductor 163, and the conductor 164 can be formed in such a manner that a conductive film is formed over the insulator 156 and inside the second openings and an unnecessary conductive film is removed by CMP or the like. Note that, although not illustrated, a conductor electrically connected to the conductor 184, the conductor 187, the conductor 119, and the conductor 122 may be formed in the above step.

Next, a conductor 171 electrically connected to the conductor 161, a conductor 172 electrically connected to the conductor 162, a conductor 173 electrically connected to the conductor 163, and a conductor 174 electrically connected to the conductor 164 are formed (see FIG. 31A to FIG. 31C). The conductor 171, the conductor 172, the conductor 173, and the conductor 174 can be formed in such a manner that a conductive film is formed over the insulator 156 and processed by a lithography method. For the processing, a dry etching method or a wet etching method can be employed. A dry etching method is suitable for microfabrication.

The conductor 171, the conductor 161, and the conductor 134 function as the conductor SG or the conductors WWL. The conductor 172, the conductor 162, and the conductor 136 function as the conductor RWL. The conductor 173, the conductor 163, and the conductor 130 function as a conductor BG. The conductor 174, the conductor 164, and the conductor 137 function as the conductors SEL. The conductor 184 can function as the conductor WBL. The conductor 187 can serve as the conductor RBL. Through the above-described steps, the transistor STr1 that includes the semiconductor 125 functioning as the channel formation region and the conductor 134 functioning as the gate; the transistor STr2 that includes the semiconductor 127 functioning as the channel formation region and the conductor 137 functioning as the gate; the transistor Str3 that includes the semiconductor 125 functioning as the channel formation region and the conductor 137 functioning as the gate; the transistor WTr that includes the semiconductor 125 functioning as the channel formation region and the conductor 134 functioning as the gate; and the transistor RTr that includes the semiconductor 127 functioning as the channel formation region, the conductor 136 functioning as the gate, the conductor 130 functioning as the back gate, and the conductor 128 between the semiconductor 127 and the conductor 136 can be manufactured. Furthermore, the memory device including the transistor STr1, the transistor STr2, the transistor STr3, the transistor WTr, and the transistor RTr can be manufactured.

<Structure Example of Deposition Apparatus>

Figure 32A:
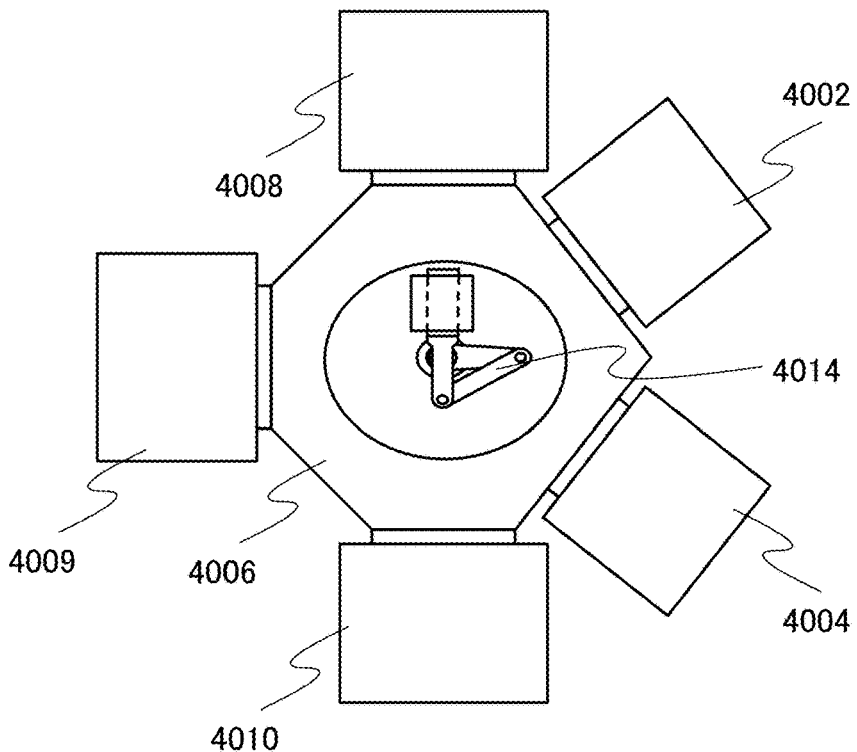
FIG. 32A is a schematic view of a multi-chamber deposition apparatus.
Figure 32B:
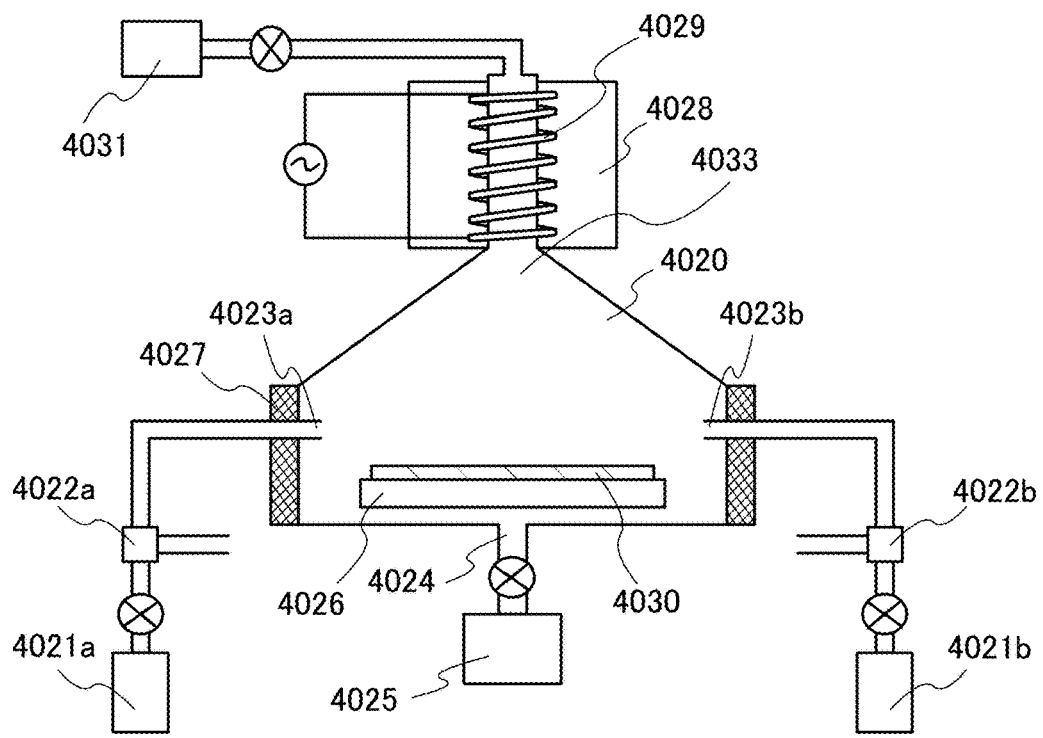
FIG. 32B is a cross-sectional view of a deposition chamber.

A structure of a deposition apparatus 4000, which is an example of the apparatus capable of deposition by an ALD method, is described with reference to FIG. 32A and FIG. 32B. FIG. 32A is a schematic view of the multi-chamber type deposition apparatus 4000, and FIG. 32B is a cross-sectional view of an ALD apparatus that can be used for the deposition apparatus 4000.

The deposition apparatus 4000 includes a carrying-in/out chamber 4002, a carrying-in/out chamber 4004, a transfer chamber 4006, a deposition chamber 4008, a deposition chamber 4009, a deposition chamber 4010, and a transfer arm 4014. Here, the carrying-in/out chamber 4002, the carrying-in/out chamber 4004, and the deposition chambers 4008 to 4010 are each independently connected to the transfer chamber 4006. This enables successive deposition in the deposition chambers 4008 to 4010 without exposure to the air, preventing the entry of impurities into a film. Moreover, contamination of an interface between a substrate and a film and interfaces between films can be reduced, so that clean interfaces can be obtained.

Note that in order to prevent attachment of moisture and the like, the carrying-in/out chamber 4002, the carrying-in/out chamber 4004, the transfer chamber 4006, and the deposition chambers 4008 to 4010 are preferably filled with an inert gas (e.g., a nitrogen gas) whose dew point is controlled, and desirably maintain reduced pressure.

An ALD apparatus can be used in the deposition chambers 4008 to 4010. Alternatively, a structure may be employed in which a deposition apparatus other than an ALD apparatus is used in any of the deposition chambers 4008 to 4010. Examples of the deposition apparatus that can be used in the deposition chambers 4008 to 4010 include a sputtering apparatus, a plasma CVD (PECVD: Plasma Enhanced CVD) apparatus, a thermal CVD (TCVD) apparatus, a photo CVD apparatus, a metal CVD (MCVD) apparatus, and a metal organic CVD (MOCVD) apparatus. An apparatus having a function other than a deposition apparatus may be provided in one or more of the deposition chambers 4008 to 4010. Examples of the apparatus include a heating apparatus (typically, a vacuum heating apparatus) and a plasma generation apparatus (typically, a μ-wave plasma generation apparatus).

For example, in the case where an ALD apparatus is used in the deposition chamber 4008, a PECVD apparatus is used in the deposition chamber 4009, and a metal CVD apparatus is used in the deposition chamber 4010, a metal oxide can be formed in the deposition chamber 4008, an insulating film functioning as a gate insulating film can be formed in the deposition chamber 4009, and a conductive film functioning as a gate electrode can be formed in the deposition chamber 4010. At this time, the metal oxide, the insulating film thereover, and the conductive film thereover can be formed successively without exposure to the air.

Although the deposition apparatus 4000 includes the carrying-in/out chamber 4002, the carrying-in/out chamber 4004, and the deposition chambers 4008 to 4010, the present invention is not limited thereto. The number of the deposition chambers in the deposition apparatus 4000 may be four or more. The deposition apparatus 4000 may be of a single-wafer type or may be of a batch type, in which case deposition is performed on a plurality of substrates at a time.

<ALD Apparatus>

Next, a structure of an ALD apparatus that can be used for the deposition apparatus 4000 is described with reference to FIG. 32B. The ALD apparatus includes a deposition chamber (a chamber 4020), a source material supply portion 4021 (source material supply portions 4021a and 4021b), a source material supply portion 4031, a high-speed valve 4022 (high-speed valves 4022a and 4022b) that is an introduction amount controller, a source material introduction port 4023 (source material introduction ports 4023a and 4023b), a source material introduction port 4033, a source material exhaust port 4024, and an evacuation unit 4025. The source material introduction ports 4023a, 4023b, and 4033 provided in the chamber 4020 are connected to the source material supply portions 4021a, 4021b, and 4031, respectively, through supply tubes and valves, and the source material exhaust port 4024 is connected to the evacuation unit 4025 through an exhaust tube, a valve, and a pressure controller.

A plasma generation apparatus 4028 is connected to the chamber 4020 as illustrated in FIG. 32B, whereby deposition can be performed by a plasma ALD method as well as a thermal ALD method. It is preferable that the plasma generation apparatus 4028 be an ICP-type plasma generation apparatus using a coil 4029 connected to a high frequency power source. The high frequency power source is capable of outputting power with a frequency higher than or equal to 10 kHz and lower than or equal to 100 MHz, preferably higher than or equal to 1 MHz and lower than or equal to 60 MHz, further preferably higher than or equal to 10 MHz and lower than or equal to 60 MHz. For example, power with a frequency of 13.56 MHz or 60 MHz can be output. A plasma ALD method enables deposition without decreasing the deposition rate even at low temperatures, and thus is preferably used for a single-wafer type deposition apparatus with low deposition efficiency.

A substrate holder 4026 is positioned in the chamber, and a substrate 4030 is placed on the substrate holder 4026. The substrate holder 4026 may be provided with a mechanism to which a constant potential or a high-frequency wave is applied. Alternatively, the substrate holder 4026 may be floating or grounded. A heater 4027, which is provided on an outside wall of the chamber, can control the temperature inside the chamber 4020 and the temperatures of the substrate holder 4026, the surface of the substrate 4030, and the like. The heater 4027 is preferably capable of controlling the temperature of the surface of the substrate 4030 to higher than or equal to 100° C. and lower than or equal to 500° C., preferably higher than or equal to 200° C. and lower than or equal to 400° C., and is capable of setting the temperature of the heater 4027 itself to higher than or equal to 100° C. and lower than or equal to 500° C.

In the source material supply portions 4021a, 4021b, and 4031, a source gas is formed from a solid source material or a liquid source material using a vaporizer, a heating unit, or the like. Alternatively, the source material supply portions 4021a, 4021b, and 4031 may supply a source gas.

Although FIG. 32B illustrates the example in which two source material supply portions 4021 and one source material supply portion 4031 are provided, this embodiment is not limited thereto. One or three or more source material supply portions 4021 may be provided. In addition, two or more source material supply portions 4031 may be provided. The high-speed valves 4022a and 4022b can be precisely controlled by time and are configured to control supply of a source gas from the source material supply portion 4021a and supply of a source gas from the source material supply portion 4021b.

In the deposition apparatus illustrated in FIG. 32B, a thin film is formed over a substrate surface in such a manner that after the substrate 4030 is transferred onto the substrate holder 4026 and the chamber 4020 is sealed, the substrate 4030 is set to a desired temperature (e.g., higher than or equal to 100° C. and lower than or equal to 500° C., preferably higher than or equal to 200° C. and lower than or equal to 400° C.) by the heater 4027, and supply of a source gas from the source material supply portion 4021a, evacuation with the evacuation unit 4025, supply of a source gas from the source material supply portion 4031, and evacuation with the evacuation unit 4025 are repeated. In the deposition of the thin film, supply of a source gas from the source material supply portion 4021b and evacuation with the evacuation unit 4025 may further be performed. The temperature of the heater 4027 is determined as appropriate depending on the type of film to be formed, the source gas, the desired film quality, and the heat resistance of a substrate and a film and an element that are provided thereover. For example, the deposition may be performed by setting the temperature of the heater 4027 to higher than or equal to 200° C. and lower than or equal to 300° C. or higher than or equal to 300° C. and lower than or equal to 500° C.

By performing deposition while the substrate 4030 is heated by the heater 4027, heat treatment for the substrate 4030 that is necessary in a later step can be omitted. In other words, with use of the deposition apparatus 4000 or the chamber 4020 provided with the heater 4027, formation of a film over the substrate 4030 can also serve as heat treatment for the substrate 4030.

In the deposition apparatus illustrated in FIG. 32B, a metal oxide can be formed by appropriate selection of source materials (e.g., a volatile organometallic compound) used in the source material supply portion 4021 and the source material supply portion 4031. In the case where an In—Ga—Zn oxide, which contains indium, gallium, and zinc, is formed as the metal oxide, it is preferable to use a deposition apparatus provided with at least three source material supply portions 4021 and at least one source material supply portion 4031. It is preferable that a precursor containing indium be supplied from the first source material supply portion 4021, a precursor containing gallium be supplied from the second source material supply portion 4021, and a precursor containing zinc be supplied from the third source material supply portion 4021.

In the case where the metal oxide is formed using precursors containing gallium and zinc, at least two source material supply portions 4021 are provided. Any of the above-described precursors can be used as the precursor containing indium, the precursor containing gallium, and the precursor containing zinc.

A reactant is supplied from the source material supply portion 4031. An oxidizer containing at least one of ozone, oxygen, and water can be used as the reactant.

By appropriate selection of source materials (e.g., a volatile organometallic compound) used in the source material supply portions 4021a, 4021b, and 4031, an insulating layer formed using an oxide (including a composite oxide) containing one or more kinds of elements selected from hafnium, aluminum, tantalum, zirconium, and the like can be formed. Specifically, an insulating layer formed using hafnium oxide, an insulating layer formed using aluminum oxide, an insulating layer formed using hafnium silicate, an insulating layer formed using aluminum silicate, or the like can be formed. Alternatively, a thin film, e.g., a metal layer such as a tungsten layer or a titanium layer, or a nitride layer such as a titanium nitride layer can be formed by appropriate selection of source materials (e.g., a volatile organometallic compound) used for the source material supply portions 4021a, 4021b, and 4031.

For example, in the case where a hafnium oxide layer is formed by an ALD apparatus, the first source gas which is obtained by vaporizing a liquid containing a solvent and a hafnium precursor compound (hafnium alkoxide or hafnium amide such as tetrakis(dimethylamide)hafnium (TD-MAHf)), and the second source gas of ozone ($O_3$) and oxygen ($O_2$) as an oxidizer are used. In this case, the first source gas supplied from the source material supply portion 4021a is TDMAHf, and the second source gas supplied from the source material supply portion 4031 is ozone and oxygen. Note that the chemical formula of tetrakis(dimethylamide)hafnium is $Hf[N(CH_3)_2]_4$. Furthermore, examples of another material liquid include tetrakis(ethylmethylamide) hafnium. Alternatively, water can be used as the second source gas.

In the case where an aluminum oxide layer is formed by an ALD apparatus, the first source gas which is obtained by vaporizing a liquid containing a solvent and an aluminum precursor compound (e.g., TMA: trimethylaluminum) and the second source gas containing ozone ($O_3$) and oxygen ($O_2$) as an oxidizer are used. In this case, the first source gas supplied from the source material supply portion 4021a is TMA, and the second source gas supplied from the source material supply portion 4031 is ozone and oxygen. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate). Alternatively, water can be used as the second source gas.

Figure 33A:
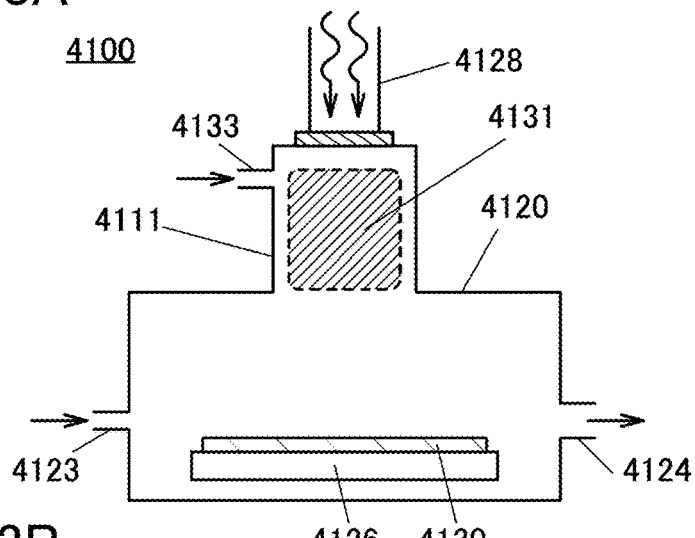
FIG. 33A to FIG. 33C are diagrams illustrating structure examples of an ALD apparatus.
Figure 33B:
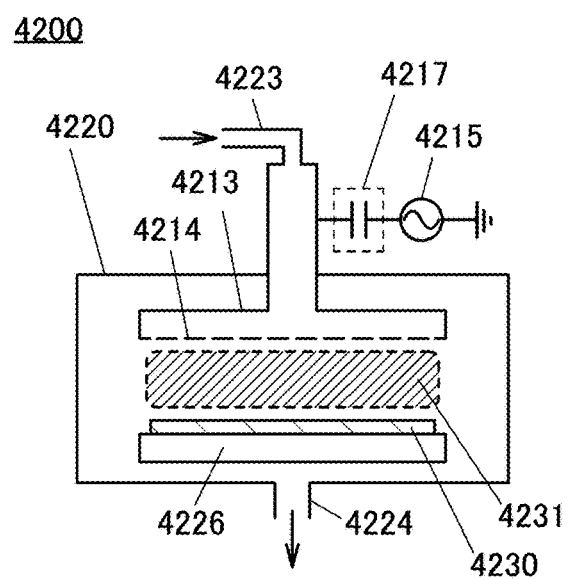
Figure 33C:
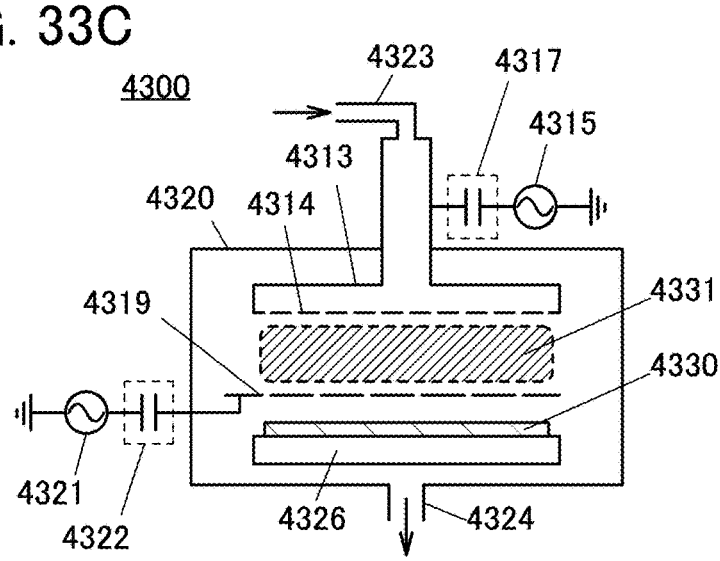

FIG. 33A to FIG. 33C illustrate a different structure of an ALD apparatus that can be used for the deposition apparatus 4000. Note that detailed description of structures and functions similar to those of the ALD apparatus illustrated in FIG. 32B is omitted in some cases.

FIG. 33A is a schematic view illustrating one embodiment of a plasma ALD apparatus. A plasma ALD apparatus 4100 is provided with a reaction chamber 4120 and a plasma generation chamber 4111 above the reaction chamber 4120. The reaction chamber 4120 can be referred to as a chamber. Alternatively, the reaction chamber 4120 and the plasma generation chamber 4111 can be collectively referred to as a chamber. The reaction chamber 4120 includes a source material introduction port 4123 and a source material exhaust port 4124, and the plasma generation chamber 4111 includes a source material introduction port 4133. Furthermore, a plasma generation apparatus 4128 enables a high-frequency wave such as RF or a microwave to be applied to a gas introduced to the plasma generation chamber 4111, thereby generating plasma 4131 in the plasma generation chamber 4111. In the case where the plasma 4131 is generated using a microwave, a microwave with a frequency of 2.45 GHz is typically used. Such plasma generated by the microwave is referred to as ECR (Electron Cyclotron Resonance) plasma in some cases. A substrate holder 4126 is provided in the reaction chamber 4120, and a substrate 4130 is positioned thereover. A source gas introduced from the source material introduction port 4123 is decomposed by heat from a heater provided in the reaction chamber 4120 and is deposited over the substrate 4130. A source gas introduced from the source material introduction port 4133 turns into a plasma state by the plasma generation apparatus 4128. The source gas in the plasma state is recombined with electrons and other molecules to be in a radical state before it reaches the surface of the substrate 4130, and reaches the substrate 4130. An ALD apparatus that performs deposition using a radical in such a manner may also be referred to as a radical ALD (Radical-Enhanced ALD) apparatus. In the plasma ALD apparatus 4100, the plasma generation chamber 4111 is provided above the reaction chamber 4120; however, this embodiment is not limited to this structure. The plasma generation chamber 4111 may be provided in contact with a side surface of the reaction chamber 4120.

FIG. 33B is a schematic view illustrating one embodiment of a plasma ALD apparatus. A plasma ALD apparatus 4200 includes a chamber 4220. The chamber 4220 includes an electrode 4213, a source material exhaust port 4224, and a substrate holder 4226, and a substrate 4230 is positioned thereover. The electrode 4213 includes a source material introduction port 4223 and a shower head 4214 that supplies the introduced source gas into the chamber 4220. A power source 4215 capable of applying a high-frequency wave through a capacitor 4217 is connected to the electrode 4213. The substrate holder 4226 may be provided with a mechanism to which a constant potential or a high-frequency wave is applied. Alternatively, the substrate holder 4226 may be floating or grounded. The electrode 4213 and the substrate holder 4226 function as an upper electrode and a lower electrode for generating plasma 4231, respectively. A source gas introduced from the source material introduction port 4223 is decomposed by heat from a heater provided in the chamber 4220 and is deposited over the substrate 4230. Alternatively, the source gas introduced from the source material introduction port 4223 turns into a plasma state between the electrode 4213 and the substrate holder 4226. The source gas in the plasma state enters the substrate 4230 owing to a potential difference (also referred to as an ion sheath) generated between the plasma 4231 and the substrate 4230.

FIG. 33C is a schematic view illustrating one embodiment of a plasma ALD apparatus different form that in FIG. 33B. A plasma ALD apparatus 4300 includes a chamber 4320. The chamber 4320 includes an electrode 4313, a source material exhaust port 4324, and a substrate holder 4326, and a substrate 4330 is positioned thereover. The electrode 4313 includes a source material introduction port 4323 and a shower head 4314 that supplies the introduced source gas into the chamber 4320. A power source 4315 capable of applying a high-frequency wave through a capacitor 4317 is connected to the electrode 4313. The substrate holder 4326 may be provided with a mechanism to which a constant potential or a high-frequency wave is applied. Alternatively, the substrate holder 4326 may be floating or grounded. The electrode 4313 and the substrate holder 4326 function as an upper electrode and a lower electrode for generating plasma 4331, respectively. The plasma ALD apparatus 4300 is different from the plasma ALD apparatus 4200 in that a mesh 4319 to which a power source 4321 capable of applying a high-frequency wave through a capacitor 4322 is connected is provided between the electrode 4313 and the substrate holder 4326. With the mesh 4319, the plasma 4231 can be away from the substrate 4130. A source gas introduced from the source material introduction port 4323 is decomposed by heat from a heater provided in the chamber 4320 and is deposited over the substrate 4330. Alternatively, the source gas introduced from the source material introduction port 4323 turns into a plasma state between the electrode 4313 and the substrate holder 4326. Charge of the source gas in the plasma state is removed by the mesh 4319 and the source gas reaches the substrate 4130 while being in an electrically neutral state such as a radical. Therefore, it is possible to perform deposition with suppressed damage due to plasma or the entry of ions.

The semiconductor 125 or the semiconductor 127 is formed by an ALD method, whereby a metal oxide having a CAAC structure, in which c-axes are aligned substantially parallel to the direction normal to the surface on which the semiconductor 125 or the semiconductor 127 is formed, can be formed in some cases.

This embodiment can be implemented in an appropriate combination with the structures described in the other embodiments and the like.

Embodiment 2

Figure 34:
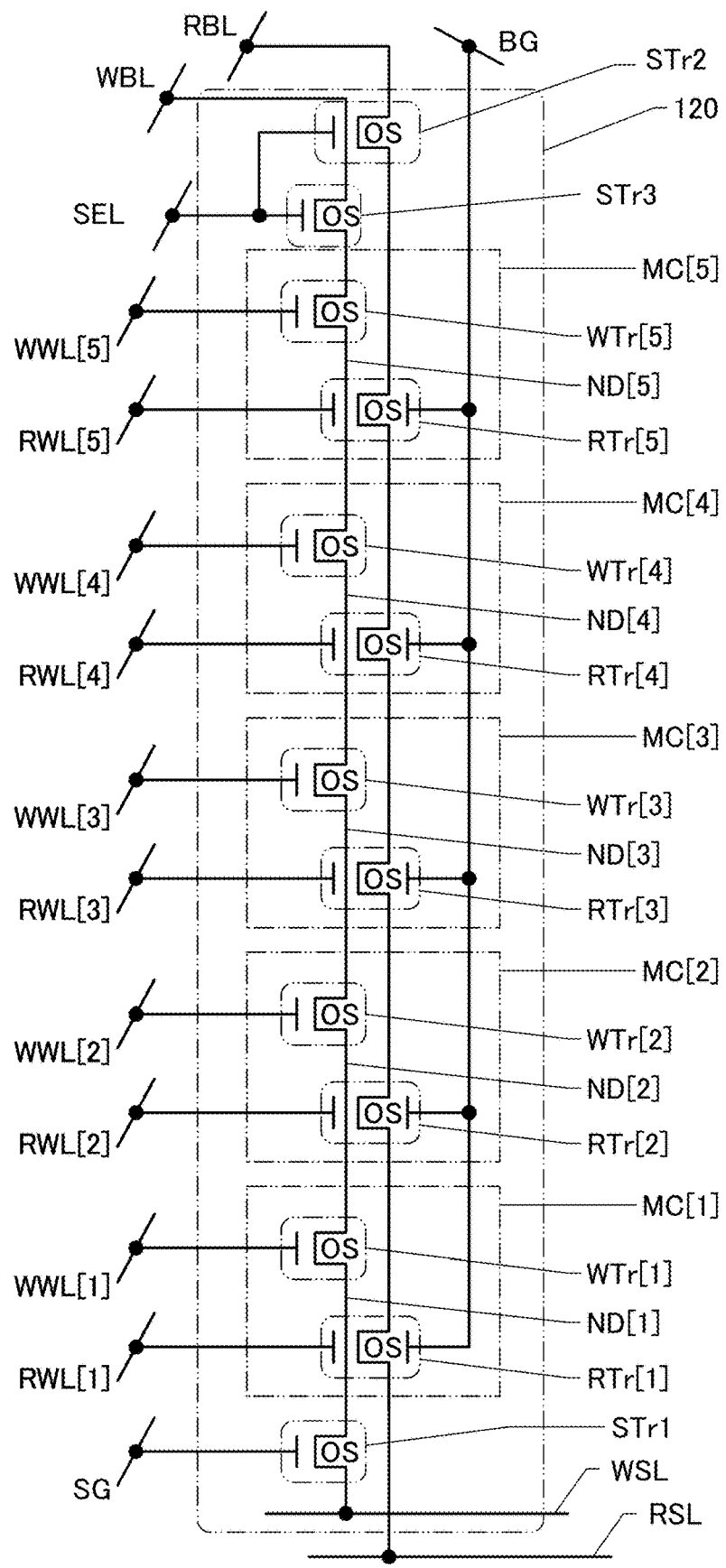
FIG. 34 illustrates a circuit configuration example of a memory string.
Figure 35:
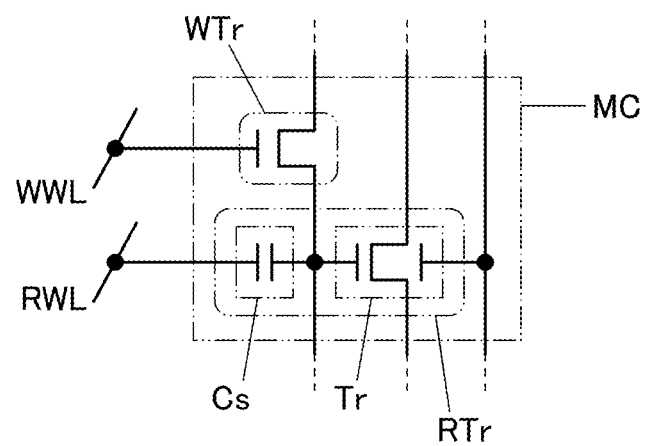
FIG. 35 illustrates a circuit configuration example of a memory string.

In this embodiment, a circuit structure and operations of the memory string 120 that is a memory device will be described. FIG. 34 illustrates a circuit structure example of the memory string 120. FIG. 35 is an equivalent circuit diagram of the memory element MC.

In the drawings and the like, for easy understanding of the potential of a wiring, an electrode, a conductor, or the like, "H" representing an H potential or "L" representing an L potential is sometimes written near the wiring, the electrode, the conductor, or the like. In addition, enclosed "H" or "L" is sometimes written near a wiring, an electrode, a conductor, or the like whose potential has changed. Moreover, a symbol "x" is sometimes written on a transistor in an off state.

<Circuit Structure Example of Memory String>

FIG. 34 illustrates a circuit structure example of the memory string 120 including five memory elements MC. The memory elements MC each include a transistor WTr and a transistor RTr. In FIG. 34, the transistor WTr included in the memory element MC[1] is represented by a transistor WTr[1], and the transistor RTr included in the memory element MC[1] is represented by a transistor RTr[1]. Thus, the memory string 120 illustrated in FIG. 34 includes the transistor WTr[1] to a transistor WTr[5] and the transistor RTr[1] to a transistor RTr[5]. Furthermore, the memory string 120 illustrated in FIG. 34 includes a transistor STr1, a transistor STr2, and a transistor STr3. The memory string 120 is a NAND memory device.

To clarify that a transistor is an OS transistor in an equivalent circuit diagram and the like, "OS" is sometimes written beside a circuit symbol of the transistor. Similarly, to clarify that a transistor is a Si transistor (a transistor using silicon for a semiconductor layer in which a channel is formed), "Si" is sometimes written beside a circuit symbol of the transistor. FIG. 34 illustrates that the transistor WTr and the transistor RTr are OS transistors.

A NAND memory device including the OS memory is referred to as an "OS NAND type" or an "OS NAND memory device". An OS NAND memory device in which a plurality of OS memories are stacked in the Z direction is referred to as a "3D OS NAND type" or a "3D OS NAND memory device".

The transistor WTr is a normally-off transistor. The transistor RTr is a normally-on transistor. As described in the above embodiment, the transistor RTr includes the conductor 128 between the gate and the semiconductor layer. The conductor 128 can function as a floating gate of the transistor RTr. For example, the conductor 128 included in the transistor RTr[1] is referred to as a conductor 128[1].

A node where the conductor 128 and one of a source and a drain of the transistor WTr are electrically connected to each other is referred to as a node ND. For example, a node where the conductor 128[1] and one of a source and a drain of the transistor WTr[1] are electrically connected to each other is referred to as a node ND[1].

One of a source and a drain of the transistor RTr[1] is electrically connected to the conductor RSL, and the other is electrically connected to one of a source and a drain of the transistor RTr[2]. A gate of the transistor RTr[1] is electrically connected to the conductor RWL[1]. A back gate of the transistor RTr[1] is electrically connected to the conductor BG. The one of the source and the drain of the transistor WTr[1] is electrically connected to the conductor 128[1] and the other is electrically connected to a conductor 128[2]. A gate of the transistor WTr[1] is electrically connected to the conductor WWL[1]. Furthermore, the other of the source and the drain of the transistor STr1 is electrically connected to the conductor WSL, and a gate of the transistor STr1 is electrically connected to the conductor SG.

Here, as illustrated in FIG. 35, the transistor RTr can be replaced with a capacitor Cs and a transistor Tr. A gate of the transistor Tr is electrically connected to the conductor RWL through the capacitor Cs.

One of a source and a drain of the transistor RTr[5] is electrically connected to the other of a source and a drain of a transistor RTr[4], and the other is electrically connected to one of a source and a drain of the transistor STr2. A gate of the transistor RTr[5] is electrically connected to the conductor RWL[5]. A back gate of the transistor RTr[5] is electrically connected to the conductor BG. One of a source and a drain of the transistor WTr[5] is electrically connected to a conductor 128[5], and the other is electrically connected to one of a source and a drain of the transistor STr3. A gate of the transistor WTr[5] is electrically connected to the conductor WWL[5]. The other of the source and the drain of the transistor STr2 is electrically connected to the conductor RBL, and a gate of the transistor STr2 is electrically connected to the conductor SEL. The other of the source and the drain of the transistor STr3 is electrically connected to the conductor WBL, and the gate of the transistor STr3 is electrically connected to the conductor SEL.

In the case where the memory string 120 includes n memory elements MC (n is an integer greater than or equal to 1), in an i-th (i is an integer greater than or equal to 2 and less than or equal to n−1) memory element MC[i] except the first and n-th memory elements MC, one of a source and a drain of a transistor RTr[i] is electrically connected to the other of a source and a drain of a transistor RTr[i−1], and the other is electrically connected to one of a source and a drain of a transistor RTr[i+1]. A gate of the transistor RTr[i] is electrically connected to a conductor RWL[i]. A back gate of the transistor RTr[i] is electrically connected to the conductor BG. One of a source and a drain of a transistor WTr[i] is electrically connected to a conductor 128[i] and the other thereof is electrically connected to a conductor 128[i+1]. A gate of the transistor WTr[i] is electrically connected to a conductor WWL[i]. Note that for the connection relation between the first and n-th memory elements MC, other elements, and conductors, the connection relations described above for the memory element MC[1] and the memory element MC[5] can be referred to.

The transistor STr1, the transistor STr2, and the transistor Str3 may be OS transistors or Si transistors, for example. At least one of the transistor STr1, the transistor STr2, and the transistor Str3 may be an OS transistor, and the others may be Si transistors. Note that in the case where both the transistors WTr and the transistors RTr are formed of OS transistors, the transistor STr1, the transistor STr2, and the transistor Str3 are preferably also formed of OS transistors. By using the same semiconductor material for the transistors, the productivity of the semiconductor device can be increased.

Figure 36:
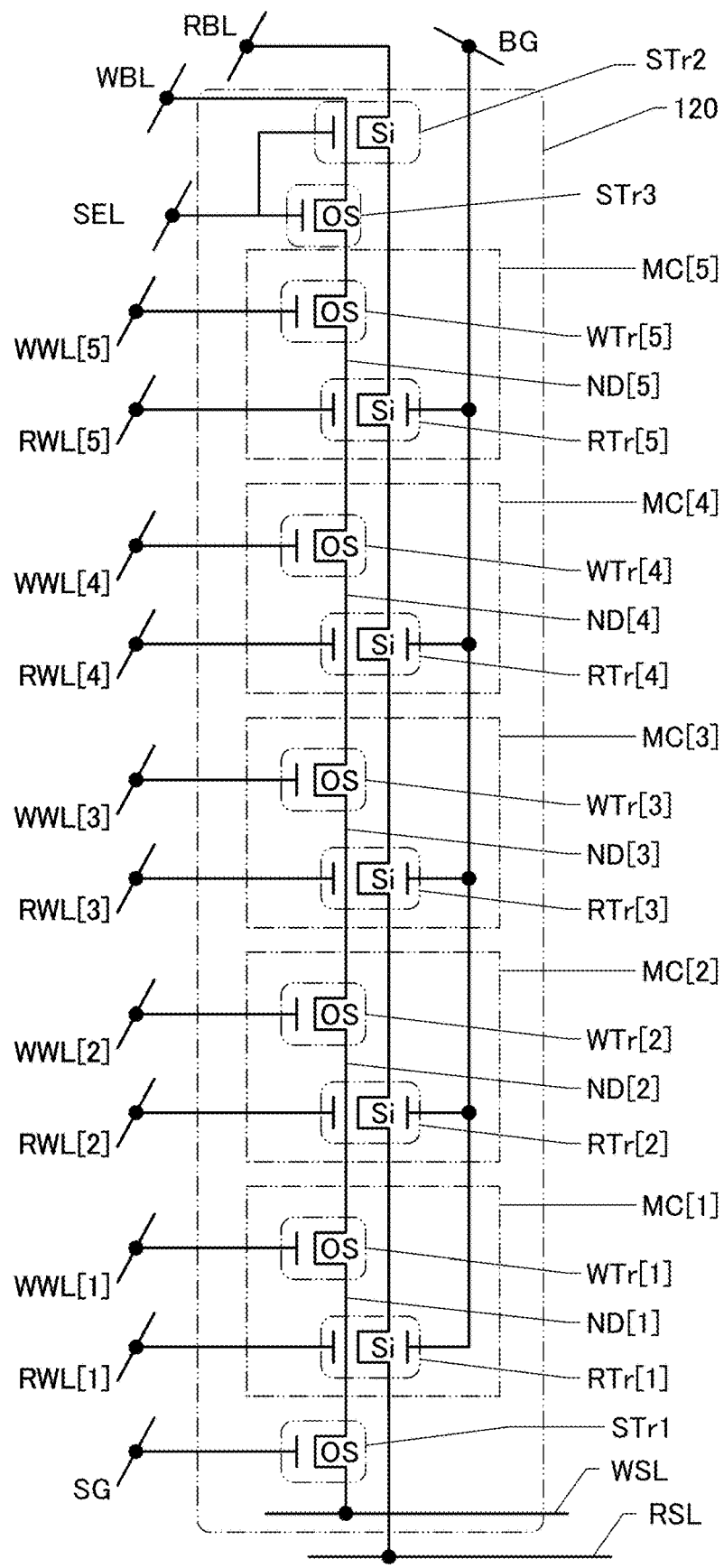
FIG. 36 illustrates a circuit configuration example of a memory string.

Alternatively, OS transistors may be used as the transistors WTr, and Si transistors may be used as the transistors RTr. FIG. 36 is an equivalent circuit diagram of the memory string 120 in the case where OS transistors are used as the transistors WTr and Si transistors are used as the transistors RTr.

In the case where the transistors RTr are formed of Si transistors, polycrystalline silicon is used as the semiconductor 125, for example. In the case where OS transistors are used as the transistors WTr, CAAC-IGZO may be used as the semiconductor 127, for example. In this case, it is preferable to use OS transistors for the transistor STr1 and the transistor STr3 and use an Si transistor for the transistor STr2.

Figure 37:
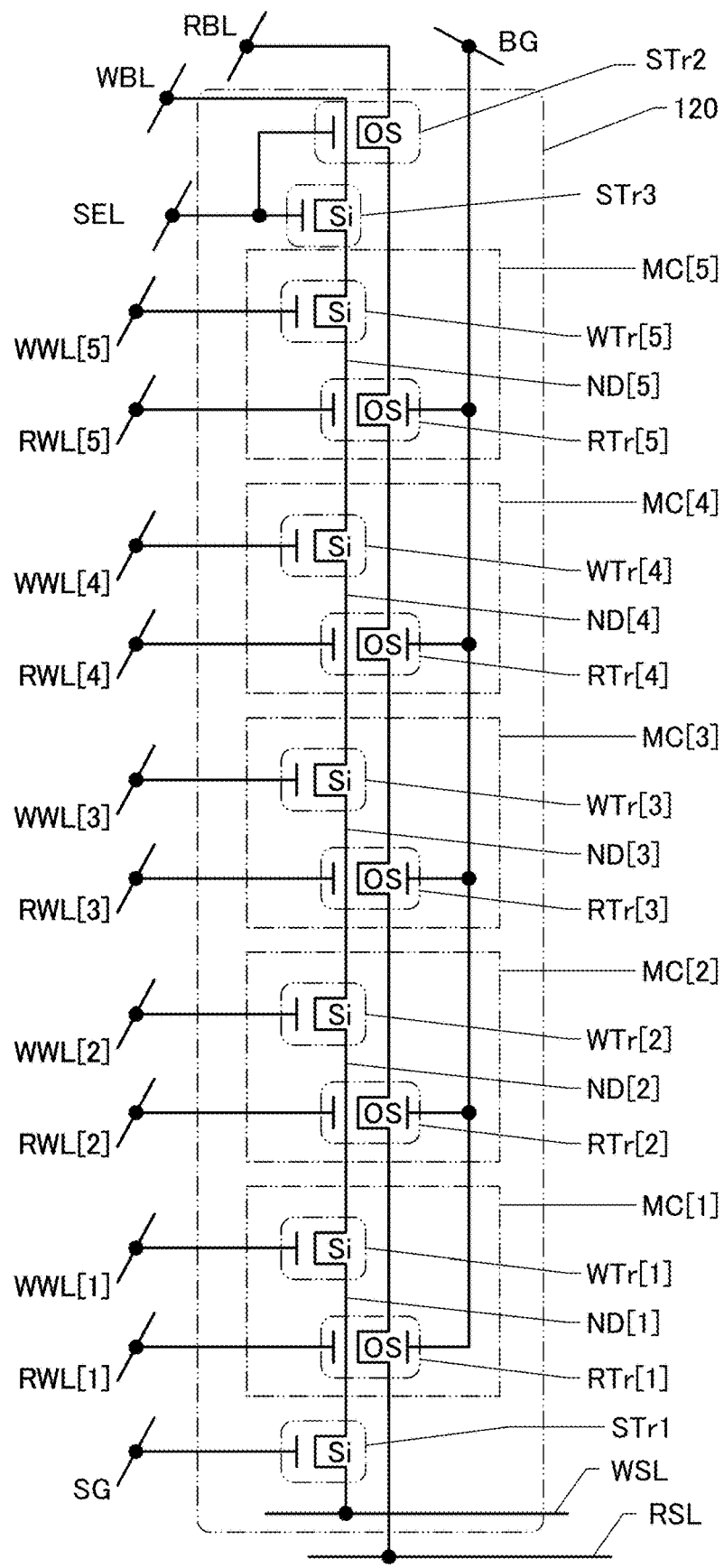
FIG. 37 illustrates a circuit configuration example of a memory string.
Figure 38:
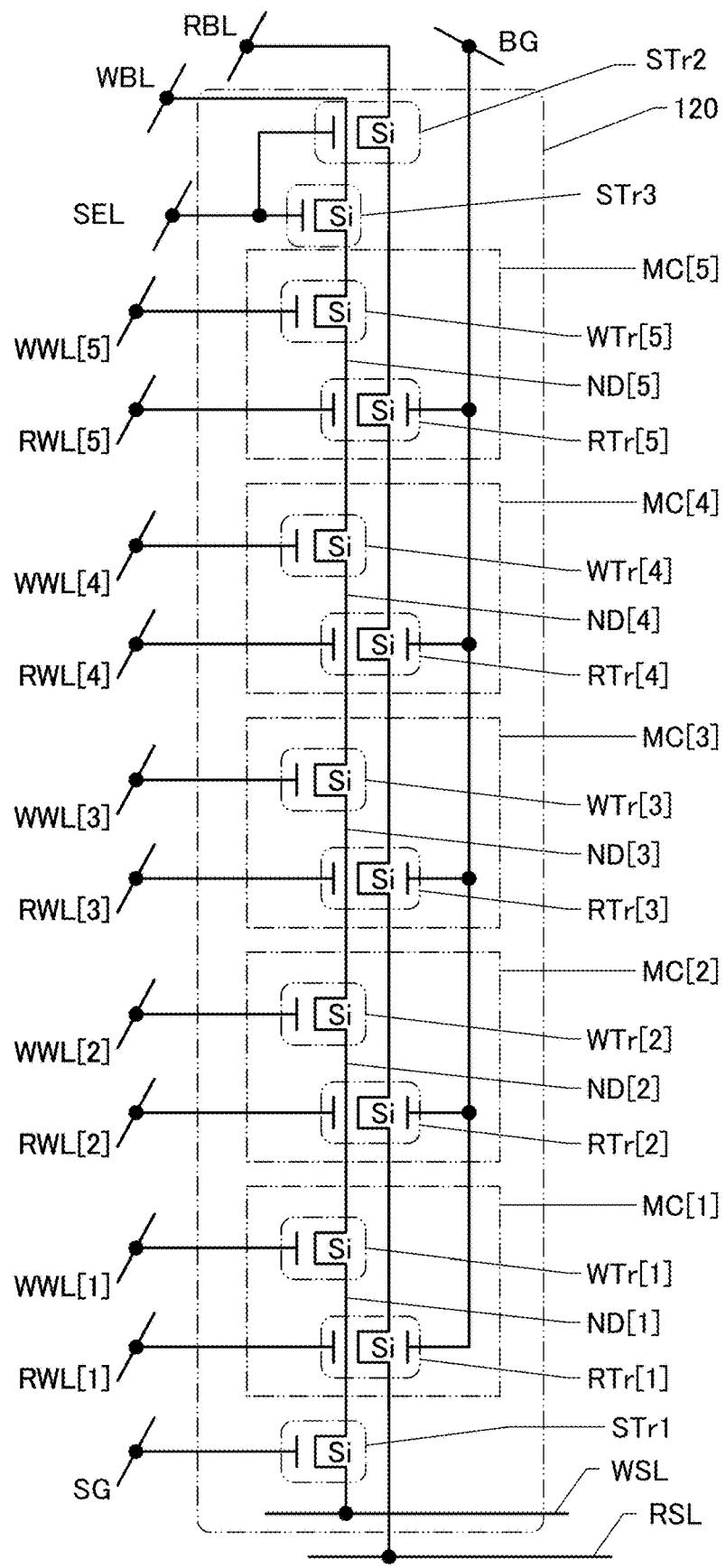
FIG. 38 illustrates a circuit configuration example of a memory string.

As illustrated in FIG. 37, Si transistors may be used as the transistors WTr and OS transistors may be used as the transistors RTr depending on the purpose, application, or the like. In this case, it is preferable to use Si transistors for the transistor STr1 and the transistor STr3 and use an OS transistor for the transistor STr2. As illustrated in FIG. 38, Si transistors may be used as both the transistors WTr and the transistors RTr depending on the purpose, application, or the like. In the case where Si transistors are used as both the transistors WTr and the transistors RTr, Si transistors are preferably also used for the transistor STr1, the transistor STr2, and the transistor STr3.

<Operation Example of Memory String>

Next, an operation example of the memory string 120 illustrated in FIG. 34 is described.

[Writing Operation]

Figure 39:
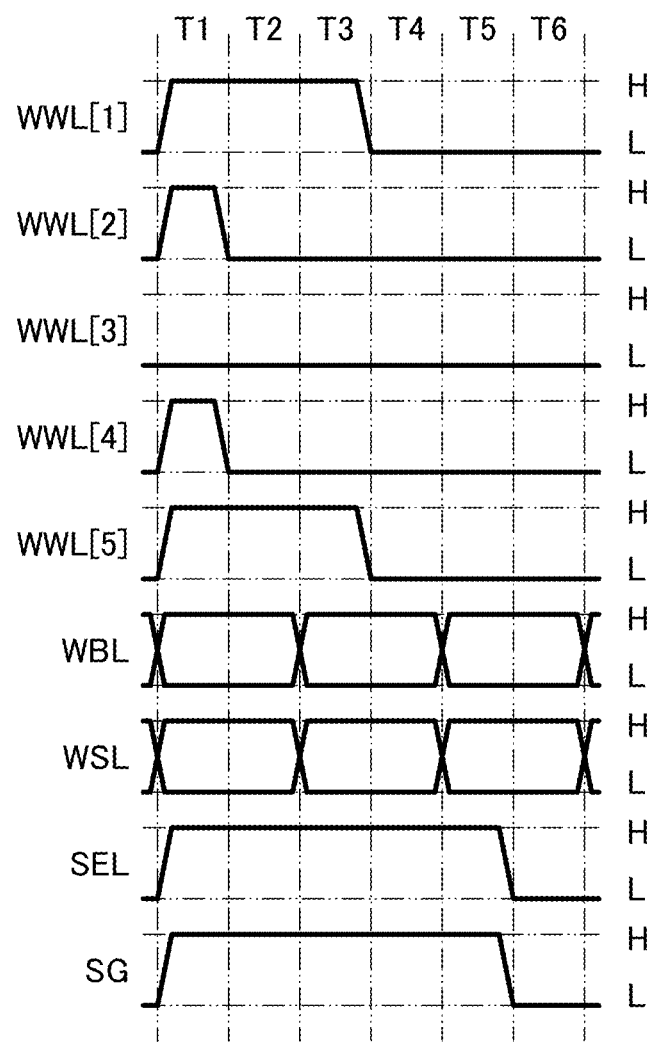
FIG. 39 is a timing chart illustrating a writing operation example of a memory string.

An operation example in which an H potential or L potential is written to the memory element MC is described. FIG. 39 is a timing chart showing a writing operation. FIG. 40A to FIG. 40B are circuit diagrams for explaining the writing operation.

In an initial state, it is assumed that the L potential is written to the memory element MC[1] to the memory element MC[5]. Furthermore, it is assumed that the L potential is supplied to the conductor WWL[1] to the conductor WWL[5], the conductor RWL[1] to the conductor RWL[5], the conductor SEL, the conductor BG, the conductor WBL, the conductor RBL, the conductor SG, the conductor WSL, and the conductor RSL. Note that the conductor BG can control the threshold voltage of the transistor RTr. The potential supplied to the conductor BG may be adjusted appropriately so that the transistor RTr can be a desired normally-on transistor. Although the conductor SEL is described as a conductor shared by the transistor STr2 and the transistor STr3 for their gates, the conductor SEL may be different conductors between the transistor STr2 and the transistor STr3.

[Period T1]

In Period T1, while the conductor WWL[3] is kept having the L potential, the H potential is supplied to the conductor WWL[1], the conductor WWL[2], the conductor WWL[4], the conductor WWL[5], the conductor SG, and the conductor SEL (see FIG. 40A). To the conductor WSL and the conductor WBL, any one of the H potential and the L potential, is supplied. As a result, the potential of the conductor WSL is supplied to the node ND[1] to a node ND[3], and the potential of the conductor WBL is supplied to a node ND[4] and a node ND[5].

[Period T2]

In Period T2, the L potential is supplied to the conductor WWL[2] and the conductor WWL[4] (see FIG. 40B). This brings the transistor WTr[2] and the transistor WTr[4] into an off state, and charge written to the node ND[3] and the node ND[4] is retained.

[Period T3]

In Period T3, the potential of the conductor WSL is supplied to the node ND[1] and the node ND[2], and the potential of the conductor WBL is supplied to the node ND[5] (see FIG. 40B).

[Period T4]

In Period T4, the L potential is supplied to the conductor WWL[1] and the conductor WWL[5] (see FIG. 41A). This brings the transistor WTr[1] and the transistor WTr[5] into an off state, and charge written to the node ND[2] and the node ND[5] is retained.

[Period T5]

In Period T5, the potential of the conductor WSL is supplied to the node ND[1] (see FIG. 41A).

[Period T6]

In Period T6, the L potential is supplied to the conductor SG (see FIG. 41B). This brings the transistor STr1 into an off state, and charge written to the node ND[1] is retained. At this time, the potential L may be supplied to the conductor SEL.

In this manner, data can be written to the memory elements MC.

In the memory string 120, data can be written from both the conductor WSL and the conductor WBL. That is, writing can be performed concurrently on the memory element MC[3] and the memory element MC[4]. Furthermore, after the writing to the memory element MC[3] and the memory element MC[4], writing can be performed concurrently on the memory element MC[2] and the memory element MC[5]. As described above, data can be concurrently written to a plurality of memory elements MC in one memory string 120, which enables data writing speed to be increased. Moreover, charge corresponding to data to be written can be supplied more reliably.

Furthermore, in the case where data is written to the i-th memory element MC, when i is close to n, data is written from the conductor WBL side, so that the data writing operation for the first to (i−1)-th memory elements MC can be omitted. When i is close to 1, data is written from the conductor WSL side, so that the data writing operation for the (i+1)-th to n-th memory elements MC can be omitted. The memory string 120 enables reductions in the time and consumed power for the writing operation.

This embodiment shows a writing operation example such that the L potential is constantly supplied to the conductor WWL[3], data is written to the memory element MC[1] to the memory element MC[3] from the conductor WSL side, and data is written to the memory element MC[4] to the memory element MC[5] from the conductor WBL side. However, the present invention is not limited to the example. With the given conductor WWL[i] as the dividing point, data writing to the memory element MC[1] to the memory element MC[i] may be performed from the conductor WSL side, and data writing to the memory element MC[i+1] to the memory element MC[n] may be performed from the conductor WBL side. Alternatively, data writing to the memory element MC[1] to the memory element MC[n] may be performed from the conductor WSL side or data writing to the memory element MC[1] to the memory element MC[n] may be performed from the conductor WBL side.

[Reading Operation]

Figure 42:
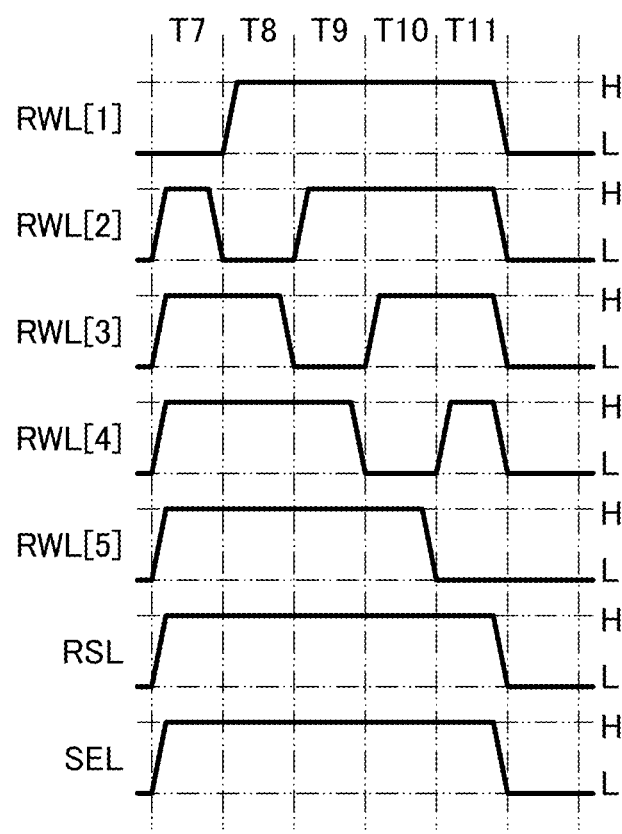
FIG. 42 is a timing chart illustrating a reading operation example of a memory string.

A reading operation example of the memory string 120 with the above-described circuit structure is described. In an assumed initial state, the L potential is supplied to the conductor WWL[1] to the conductor WWL[5], the conductor RWL[1] to the conductor RWL[5], the conductor SG, the conductor SEL, the conductor BG, the conductor WSL, the conductor RSL, the conductor WBL, and the conductor RBL. FIG. 42 is a timing chart showing a reading operation. FIG. 43A to FIG. 45 are circuit diagrams for explaining the reading operation.

In this embodiment, an operation of reading data from the memory element MC[1] to the memory element MC[5] sequentially is described.

[Period T7]

In Period T7, the H potential is supplied to the conductor RWL[2] to the conductor RWL[5], the conductor SEL, and the conductor RSL (see FIG. 43A). This brings the transistor RTr[2] to the transistor RTr[5] into an on state. In addition, the transistor STr2 is brought into an on state, and the semiconductor 127 included in the transistors RTr and the conductor RBL are brought into conduction.

In the case where the node ND[1] in the memory element MC[1] retains the H potential in this period, the transistor RTr[1] is brought into an on state even when the potential supplied to the conductor RWL[1] is the L potential. Thus, a conducting state between the conductor RSL and the conductor RBL is established through the transistor RTr[1] to the transistor RTr[5], and the H potential supplied to the conductor RSL can be detected on the conductor RBL side. In other words, the potential retained at the node ND[1] in the memory element MC[1] can be detected to be the H potential. Note that the conductor RBL is preferably functionally connected to the RBL driver 2004 including a sense amplifier or the like (see FIG. 1A and FIG. 1B).

In the alternative case where the node ND[1] in the memory element MC[1] retains the L potential, the transistor RTr[1] is brought into an off state because the L potential is supplied to the conductor RWL[1]. Thus, the conducting state between the conductor RSL and the conductor RBL is not established, and the H potential supplied to the conductor RSL cannot be detected on the conductor RBL side. Consequently, it is possible to detect the L potential retained at the node ND[1] in the memory element MC[1] on the conductor RBL side.

[Period T8]

Next, in Period T8, the H potential is supplied to the conductor RWL[1], and the L potential is supplied to the conductor RWL[2] (see FIG. 43B). In the case where the node ND[2] in the memory element MC[2] retains the H potential in this period, the transistor RTr[2] is brought into an on state even when the L potential is supplied to the conductor RWL[2]. Thus, a conducting state between the conductor RSL and the conductor RBL is established through the transistor RTr[1] to the transistor RTr[5], and the H potential supplied to the conductor RSL can be detected on the conductor RBL side. In other words, the potential retained at the node ND[2] in the memory element MC[2] can be detected to be the H potential.

In the alternative case where the node ND[2] in the memory element MC[2] retains the L potential, the transistor RTr[2] is brought into an off state because the L potential is supplied to the conductor RWL[2]. Thus, a conducting state between the conductor RSL and the conductor RBL is not established, and the H potential supplied to the conductor RSL cannot be detected on the conductor RBL side. Consequently, it is possible to detect the L potential retained at the node ND[2] in the memory element MC[2] on the conductor RBL side.

[Period T9]

Next, in Period T9, the H potential is supplied to the conductor RWL[2], and the L potential is supplied to the conductor RWL[3] (see FIG. 44A). In the case where the node ND[3] of the memory element MC[3] retains the H potential in this period, the transistor RTr[3] is brought into an on state even when the L potential is supplied to the conductor RWL[3]. Thus, a conducting state between the conductor RSL and the conductor RBL is established through the transistor RTr[1] to the transistor RTr[5], and the H potential supplied to the conductor RSL can be detected on the conductor RBL side. In other words, the potential retained at the node ND[3] in the memory element MC[3] can be detected to be the H potential.

In the alternative case where the node ND[3] in the memory element MC[3] retains the L potential, the transistor RTr[3] is brought into an off state because the L potential is supplied to the conductor RWL[3]. Thus, the conducting state between the conductor RSL and the conductor RBL is not established, and the H potential supplied to the conductor RSL cannot be detected on the conductor RBL side. Consequently, it is possible to detect the L potential retained at the node ND[3] in the memory element MC[3] on the conductor RBL side.

[Period T10]

Next, in the period T10, the H potential is supplied to the conductor RWL[3], and the L potential is supplied to the conductor RWL[4] (see FIG. 44B). In the case where the node ND[4] in the memory element MC[4] retains the H potential in this period, the transistor RTr[4] is brought into an on state even when the L potential is supplied to the conductor RWL[4]. Thus, a conducting state between the conductor RSL and the conductor RBL is established through the transistor RTr[1] to the transistor RTr[5], and the H potential supplied to the conductor RSL can be detected on the conductor RBL side. In other words, the potential retained at the node ND[4] in the memory element MC[4] can be detected to be the H potential.

In the alternative case where the node ND[4] in the memory element MC[4] retains the L potential, the transistor RTr[4] is brought into an off state because the L potential is supplied to the conductor RWL[4]. Thus, the conducting state between the conductor RSL and the conductor RBL is not established, and the H potential supplied to the conductor RSL cannot be detected on the conductor RBL side. Consequently, it is possible to detect the L potential retained at the node ND[4] in the memory element MC[4] on the conductor RBL side.

[Period T11]

Figure 45:
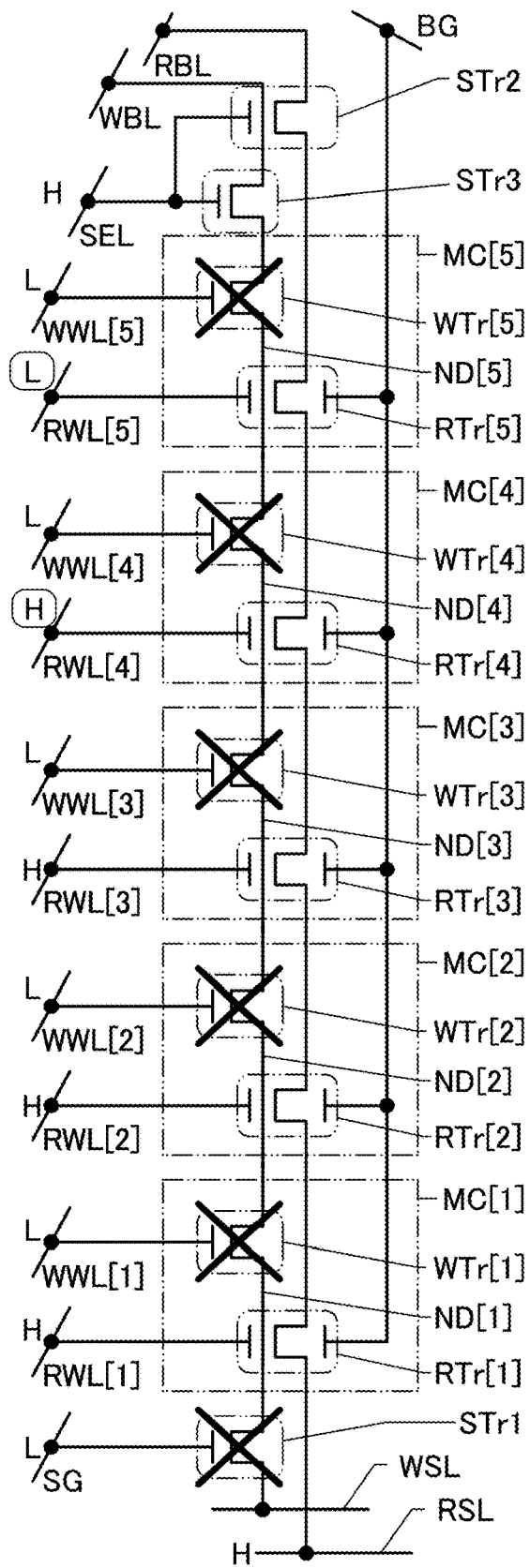
FIG. 45 is a circuit diagram illustrating a reading operation example of a memory string.

Next, in the period T11, the H potential is supplied to the conductor RWL[4], and the L potential is supplied to the conductor RWL[5] (see FIG. 45). In the case where the node ND[5] in the memory element MC[5] retains the H potential in this period, the transistor RTr[5] is brought into an on state even when the L potential is supplied to the conductor RWL[5]. Thus, a conducting state between the conductor RSL and the conductor RBL is established through the transistor RTr[1] to the transistor RTr[5], and the H potential supplied to the conductor RSL can be detected on the conductor RBL side. In other words, the potential retained at the node ND[5] in the memory element MC[5] can be detected to be the H potential.

In the alternative case where the node ND[5] in the memory element MC[5] retains the L potential, the transistor RTr[5] is brought into an off state because the L potential is supplied to the conductor RWL[5]. Thus, the conducting state between the conductor RSL and the conductor RBL is not established, and the H potential supplied to the conductor RSL cannot be detected on the conductor RBL side. Consequently, it is possible to detect the L potential retained at the node ND[5] in the memory element MC[5] on the conductor RBL side.

The potentials retained at the node ND[1] to the node ND[5] are detected in the above manner, whereby data of the memory element MC[1] to the memory element MC[5] can be read out. This embodiment shows an example in which data reading is performed sequentially from the memory element MC[1] to the memory element MC[5]; however, the present invention is not limited to the example. Data reading may be performed sequentially from the memory element MC[5] to the memory element MC[1].

Furthermore, it is not necessary to read data of the memory element MC[1] to the memory element MC[5]. Data of the given memory element MC[i] can be read out. In this case, the L potential is supplied to the conductor RWL[i], the H potential is supplied to the other conductors RWL, and a potential retained at the node ND[i] in the memory element MC[i] is detected in accordance with whether the potential of the conductor RSL can be detected on the conductor RBL side. In this manner, the data of the memory element MC[i] may be read out.

This embodiment can be implemented in an appropriate combination with the structures described in the other embodiments and the like.

Embodiment 3

In this embodiment, a structure example of a semiconductor device 200 including the memory device 100 will be described.

Figure 46:
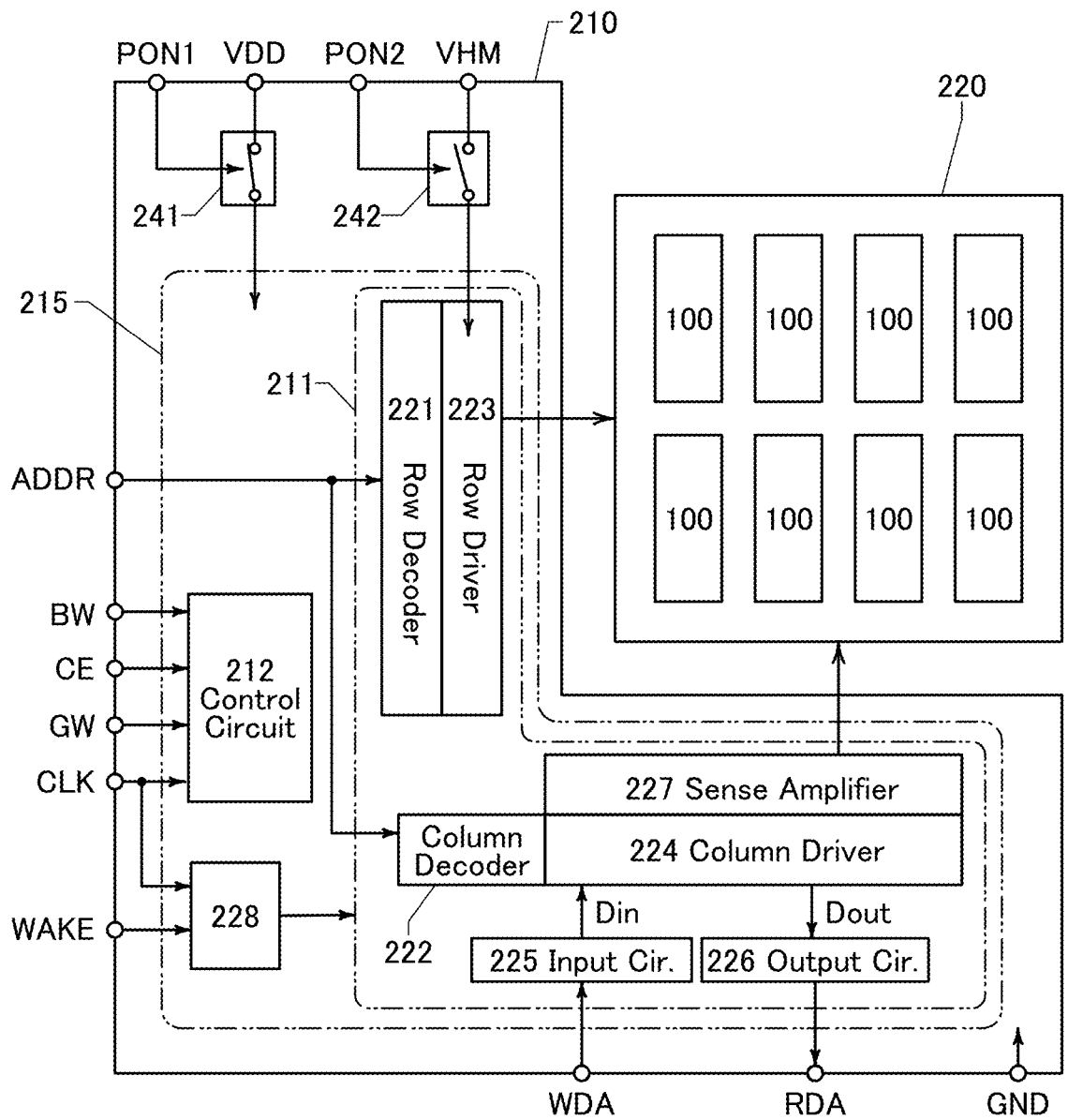
FIG. 46 is a block diagram illustrating a structure example of a semiconductor device.

FIG. 46 is a block diagram illustrating a structure example of the semiconductor device 200 of one embodiment of the present invention. The semiconductor device 200 illustrated in FIG. 46 includes a driver circuit 210 and a memory array 220. The memory array 220 includes one or more memory devices 100. FIG. 46 illustrates an example in which the memory array 220 includes a plurality of memory devices 100 arranged in a matrix.

The driver circuit 210 includes a PSW 241 (power switch), a PSW 242, and a peripheral circuit 215. The peripheral circuit 215 includes a peripheral circuit 211, a control circuit 212, and a voltage generation circuit 228. Note that the semiconductor device 200 includes elements, circuits, or the like having a variety of functions such as the memory array 220, the PSWs 241 and 242, the peripheral circuit 211, the control circuit 212, and the voltage generation circuit 228. Thus, the semiconductor device 200 may be referred to as a system or a subsystem.

In the semiconductor device 200, each circuit, each signal, and each voltage can be appropriately selected as needed. Alternatively, another circuit or another signal may be added. A signal BW, a signal CE, a signal GW, a signal CLK, a signal WAKE, a signal ADDR, a signal WDA, a signal PON1, and a signal PON2 are signals input from the outside, and a signal RDA is a signal output to the outside. The signal CLK is a clock signal.

The signals BW and CE, and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signal PON1 and the signal PON2 are power gating control signals. Note that the signal PON1 and the signal PON2 may be generated in the control circuit 212.

The control circuit 212 is a logic circuit having a function of controlling the overall operation of the semiconductor device 200. For example, the control circuit performs a logical operation on the signal CE, the signal GW, and the signal BW to determine an operation mode of the semiconductor device 200 (e.g., a writing operation or a reading operation). Alternatively, the control circuit 212 generates a control signal for the peripheral circuit 211 so that the operation mode is executed.

The voltage generation circuit 228 has a function of generating a negative voltage. The signal WAKE has a function of controlling the input of the signal CLK to the voltage generation circuit 228. For example, when an H-level signal is applied as the signal WAKE, the signal CLK is input to the voltage generation circuit 228, and the voltage generation circuit 228 generates a negative voltage.

The peripheral circuit 211 is a circuit for writing and reading data to/from the memory device 100. The peripheral circuit 211 includes a row decoder 221, a column decoder 222, a row driver 223, a column driver 224, an input circuit (Input Cir.) 225, an output circuit (Output Cir.) 226, and a sense amplifier 227.

The row decoder 221 and the column decoder 222 have a function of decoding the signal ADDR. The row decoder 221 is a circuit for specifying a row to be accessed, and the column decoder 222 is a circuit for specifying a column to be accessed. The row driver 223 has a function of selecting the conductor WWL specified by the row decoder 221. The column driver 224 has a function of writing data to the memory device 100, a function of reading data from the memory device 100, a function of retaining the read data, and the like.

The input circuit 225 has a function of retaining the signal WDA. Data retained by the input circuit 225 is output to the column driver 224. Data output from the input circuit 225 is data (Din) to be written to the memory device 100. Data (Dout) read from the memory device 100 by the column driver 224 is output to the output circuit 226. The output circuit 226 has a function of retaining Dout. In addition, the output circuit 226 has a function of outputting Dout to the outside of the semiconductor device 200. Data output from the output circuit 226 is the signal RDA.

The PSW 241 has a function of controlling the supply of VDD to the peripheral circuit 215. The PSW 242 has a function of controlling the supply of VHM to the row driver 223. Here, in the semiconductor device 200, a high power supply voltage is VDD and a low power supply voltage is GND (a ground potential). In addition, VHM is a high power supply voltage used for setting a word line to high level, and is higher than VDD. The on/off of the PSW 241 is controlled by the signal PON1, and the on/off of the PSW 242 is controlled by the signal PON2. The number of power domains to which VDD is supplied is one in the peripheral circuit 215 in FIG. 46 but can be more than one. In that case, a power switch is provided for each power domain.

Figure 47A:
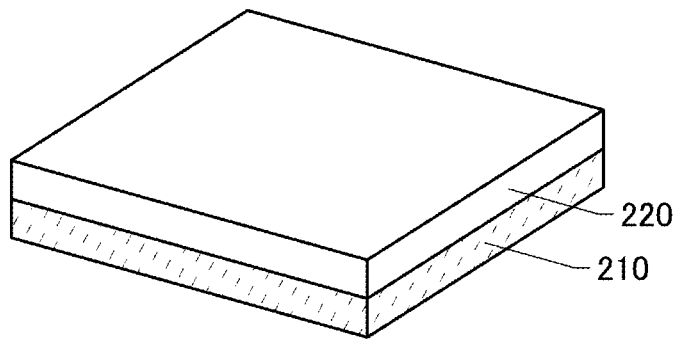
FIG. 47A to FIG. 47C are perspective views illustrating structure examples of a semiconductor device.
Figure 47B:
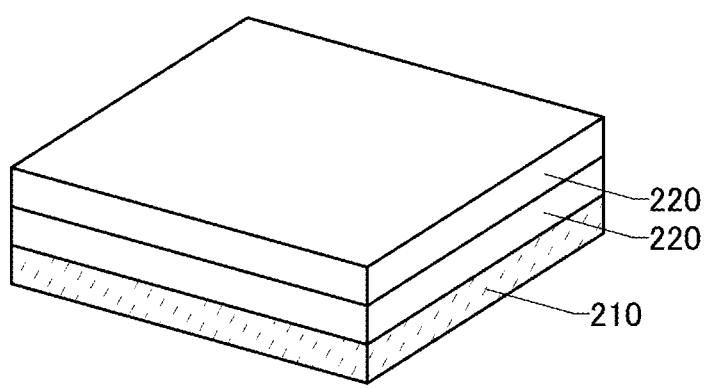

The driver circuit 210 and the memory array 220 may be provided on the same plane. As illustrated in FIG. 47A, the driver circuit 210 and the memory array 220 may be provided to overlap with each other. When the driver circuit 210 and the memory array 220 overlap with each other, the signal transmission distance can be shortened. Alternatively, a plurality of memory arrays 220 may be provided over the driver circuit 210 as illustrated in FIG. 47B.

Figure 47C:
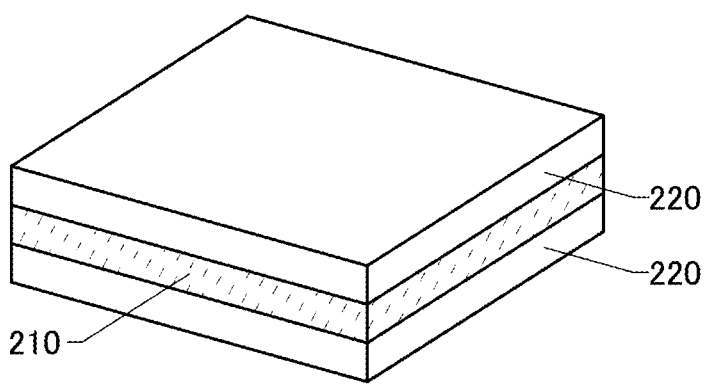

As illustrated in FIG. 47C, the memory array 220 may be provided over and under the driver circuit 210. FIG. 47C illustrates an example in which one memory array 220 is provided over and under the driver circuit 210. Providing a plurality of memory arrays 220 so that the driver circuit 210 is sandwiched therebetween can further shorten the signal propagation distance. The number of memory arrays 220 stacked over the driver circuit 210 and the number of memory arrays 220 stacked under the driver circuit 210 may each be one or more. The number of memory arrays 220 stacked over the driver circuit 210 is preferably equal to the number of memory arrays 220 stacked under the driver circuit 210.

<Cross-Sectional Structure Example of Semiconductor Device 200>

Figure 48:
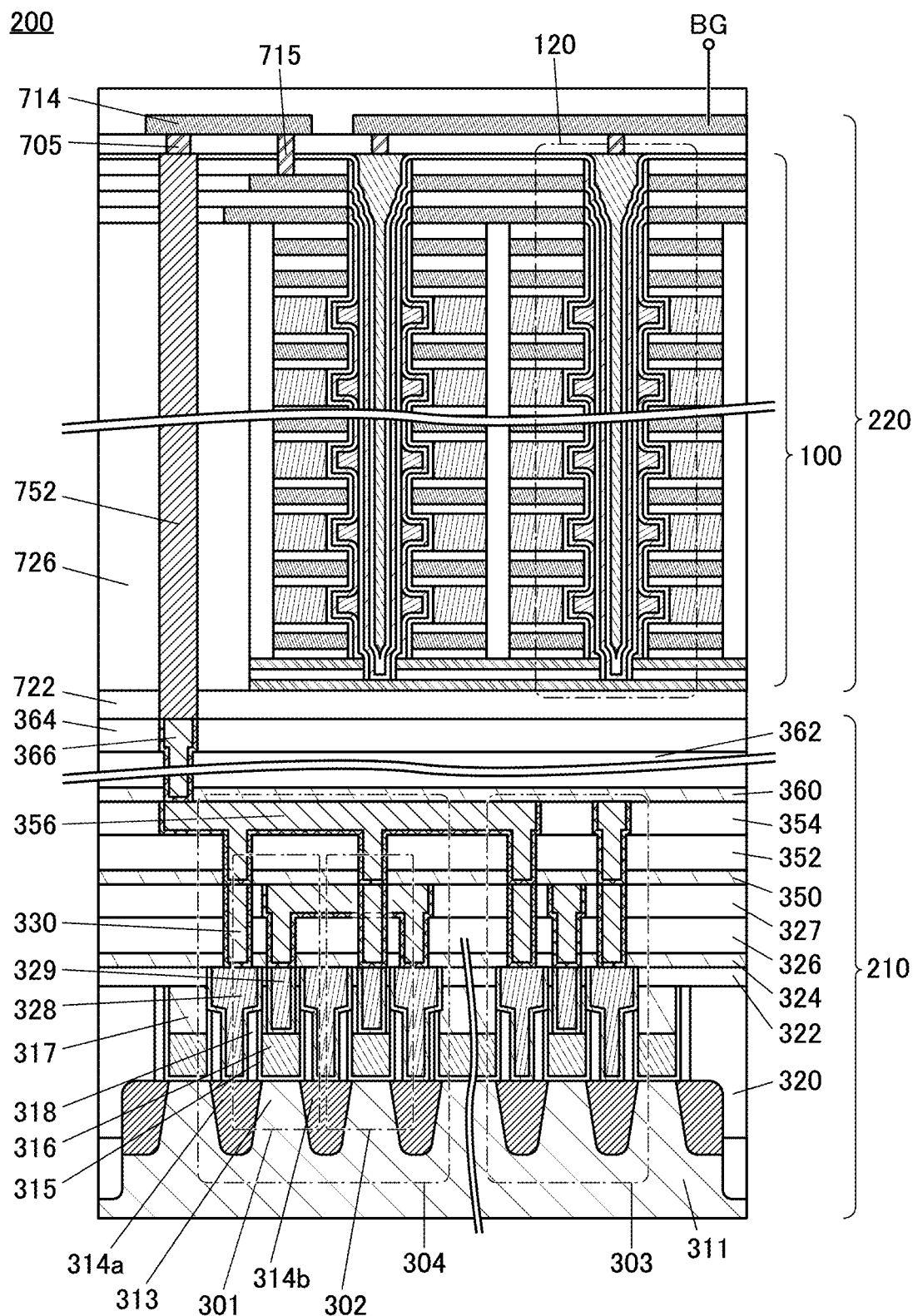
FIG. 48 is a cross-sectional view illustrating a semiconductor device according to one embodiment of the present invention.

FIG. 48 illustrates a cross-sectional structure example of the semiconductor device 200 illustrated in FIG. 47A. In FIG. 48, part of the semiconductor device 200 illustrated in FIG. 47A is illustrated.

FIG. 48 illustrates a transistor 301, a transistor 302, and a transistor 303 included in the driver circuit 210. Note that the transistor 301 and the transistor 302 function as part of the sense amplifier 227. Furthermore, the transistor 303 functions as a column selection switch. Specifically, the conductor RBL included in the memory array 220 is electrically connected to one of a source and a drain of the transistor 301, a gate of the transistor 301 is electrically connected to one of a source and a drain of the transistor 302, and a gate of the transistor 302 is electrically connected to the one of the source and the drain of the transistor 301. The one of the source and the drain of the transistor 301 and the gate of the transistor 302 are electrically connected to one of a source and a drain of the transistor 303 that functions as the column selection switch. Accordingly, the layout area of the semiconductor device 200 can be reduced. Note that an example where five memory elements MC are provided per memory string is illustrated in FIG. 48. However, the number of memory elements MC provided in a memory string is not limited thereto. For example, the number of memory elements MC provided in a memory string may be 32, 64, 128, or 200 or more.

The conductor RBL of the memory array 220 is electrically connected to the sense amplifier 227 and the transistor 303 functioning as the column selection switch through a conductor 715, a conductor 714, a conductor 705, and a conductor 752 formed so as to be embedded in an insulator 726, an insulator 722, and the like. Note that circuits and transistors included in the driver circuit 210 are examples, and one embodiment of the present invention is not limited to the circuit structures and the transistor structures. In addition to the above, a transistor or a circuit such as a control circuit, a row decoder, a row driver, a source line driver, or an input-output circuit can be provided as appropriate in accordance with the structure or driving method of the semiconductor device 200.

The transistor 301, the transistor 302, and the transistor 303 are provided on a substrate 311 and each include a conductor 316, an insulator 315, a semiconductor region 313 that is part of the substrate 311, and a low-resistance region 314a and a low-resistance region 314b serving as a source region and a drain region. Note that as shown in FIG. 48, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate.

Note that an insulator functioning as a mask for forming the convex portion may be included in contact with an upper portion of the convex portion. Although the case where the convex portion is formed by processing part of the semiconductor substrate is described here, a semiconductor film having a convex shape may be formed by processing an SOI substrate.

The transistor 301, the transistor 302, and the transistor 303 may each be either a p-channel or n-channel transistor. The transistor 301 and the transistor 302 may have the same polarity or different polarities.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 functions as a gate insulating film of each of the transistor 301, the transistor 302, and the transistor 303.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An insulator 317 serving as an etching stopper is preferably provided above the conductor 316. In addition, an insulator 318 functioning as a spacer is preferably provided on a side surface of the insulator 315. When the insulator 317 and the insulator 318 are provided, regions where the low-resistance region 314a and the low-resistance region 314b and a conductor 328 are electrically connected to each other can be defined in a self-aligned manner. Thus, even when misalignment occurs in forming the openings for exposing part of the low-resistance region 314a and the low-resistance region 314b, the openings for exposing the intended regions can be formed. The conductor 328 provided in the openings formed in this manner can provide a favorable contact with reduced contact resistance between the low-resistance region 314a and the low-resistance region 314b and the conductor 328. The contact between the low-resistance region 314a and the low-resistance region 314b and the conductor 328 which is formed in this manner may be referred to as a self-aligned contact. Furthermore, a conductor 329 electrically connected to the conductor 316 may be provided so as to be embedded in the insulator 317 and an insulator 322.

An insulator 320, an insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 320 and the insulator 322 may function as a planarization film for eliminating a level difference caused by the transistor 301 or the like provided below the insulators 320 and 322. For example, a top surface of one or both of the insulator 320 and the insulator 322 may be planarized by planarization treatment using a chemical mechanical polishing (CMP) method or the like to increase planarity.

The insulator 324 is preferably formed using a film having a barrier property that prevents diffusion of hydrogen or impurities from the substrate 311, the transistor 301, or the like into the region where the memory array 220 is provided.

For the film having a barrier property against hydrogen, silicon nitride formed by a CVD method can be used, for example. Here, diffusion of hydrogen into a semiconductor element including an oxide semiconductor, such as the memory elements MC, degrades the characteristics of the semiconductor element in some cases. Therefore, a film that inhibits hydrogen diffusion is preferably used between the memory elements MC and the transistor 301 and the like. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of each of the insulator 326 and the insulator 327 is preferably lower than that of the insulator 324. For example, the dielectric constant of each of the insulator 326 and the insulator 327 is preferably lower than 4, further preferably lower than 3. The dielectric constant of each of the insulator 326 and the insulator 327 is, for example, preferably less than or equal to 0.7 times, further preferably less than or equal to 0.6 times the dielectric constant of the insulator 324. When a material with a low permittivity is used for an interlayer film, parasitic capacitance generated between wirings can be reduced.

The conductor 328, the conductor 329, a conductor 330, and the like that are electrically connected to the memory array 220 are embedded in the insulator 320, the insulator 322, the insulator 324, the insulator 326, and the insulator 327. Note that the conductor 328, the conductor 329, and the conductor 330 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 327 and the conductor 330. For example, in FIG. 48, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be provided using a material similar to those for the conductor 328, the conductor 329, and the conductor 330.

For example, like the insulator 324, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 301 and the like and the memory elements MC can be separated by the barrier layer, so that the diffusion of hydrogen from the transistor 301 and the like into the memory elements MC can be inhibited.

Note that for the conductor having a barrier property against hydrogen, tantalum nitride is preferably used, for example. In addition, the use of a stack including tantalum nitride and tungsten, which has high conductivity, can inhibit the diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 48, an insulator 360, an insulator 362, and an insulator 364 are stacked in this order. Furthermore, a conductor 366 is formed in the insulator 360, the insulator 362, and the insulator 364. The conductor 366 functions as a plug or a wiring. Note that the conductor 366 can be provided using a material similar to those for the conductor 328, the conductor 329, and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 301 and the like and the memory elements MC can be separated by the barrier layer, so that the diffusion of hydrogen from the transistor 301 and the like into the memory elements MC can be inhibited.

The insulator 722 is provided over the insulator 364 and the conductor 366, and the memory array 220 is provided above the insulator 722. A barrier film formed using a material similar to that for the insulator 324 may be provided between the insulator 364 and the insulator 722.

Figure 49:
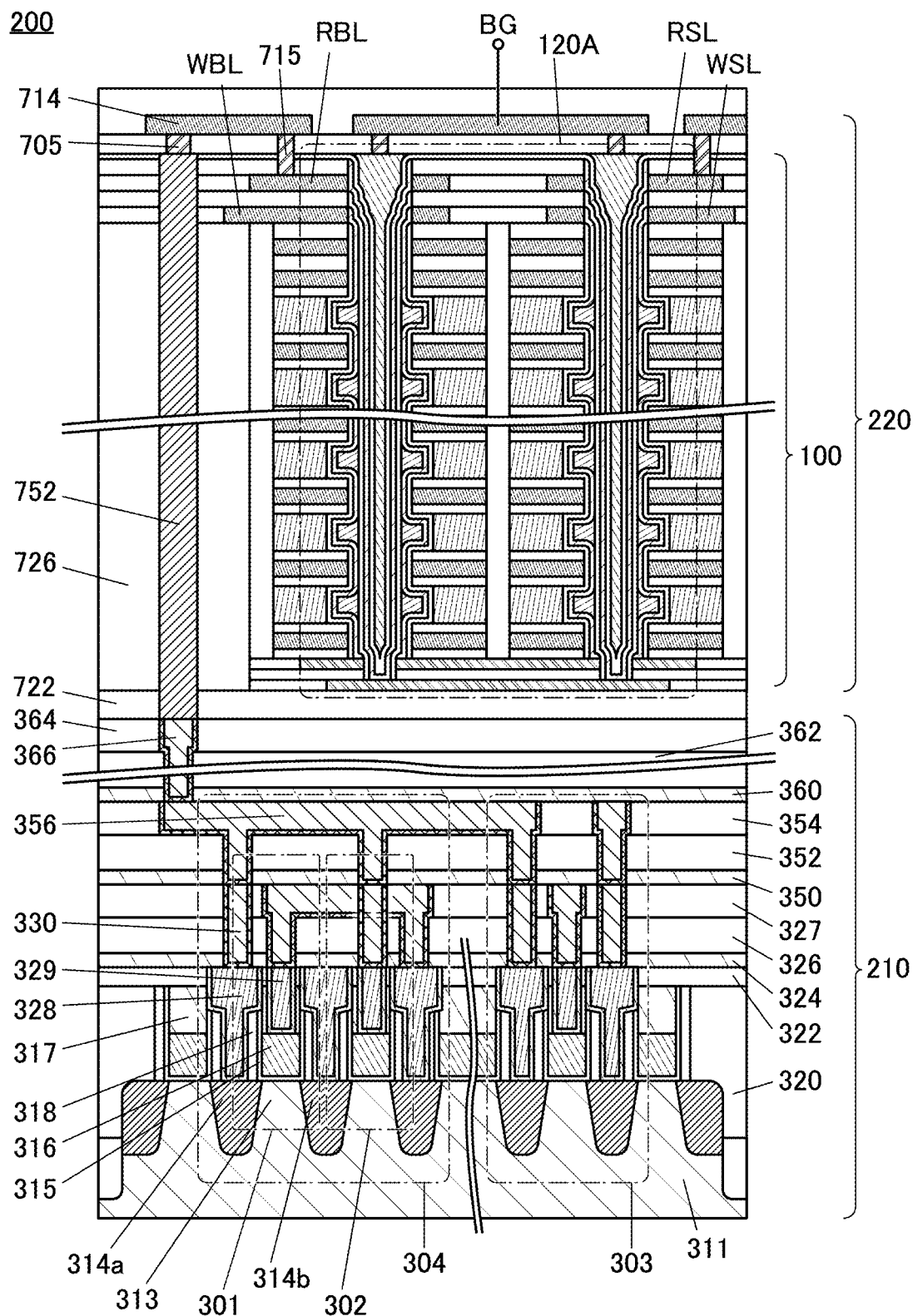
FIG. 49 is a cross-sectional view illustrating a semiconductor device according to one embodiment of the present invention.

Although an example where the memory device 100 includes the memory string 120 is show in the above description, this embodiment is not limited thereto. As illustrated in FIG. 49, the memory device 100 may include the memory string 120A described with reference to FIG. 8.

This embodiment can be implemented in an appropriate combination with the structures described in the other embodiments and the like.

Embodiment 4

In this embodiment, application examples of a data processing device of one embodiment of the present invention will be described.

A computer generally includes, as its components, a processor, a main memory, a storage and the like on a motherboard, which are electrically connected to one another through a bus line, for example. Thus, the parasitic capacitance increases as the bus line lengthens, resulting in increased power consumption required for signal transmission.

Figure 50A:
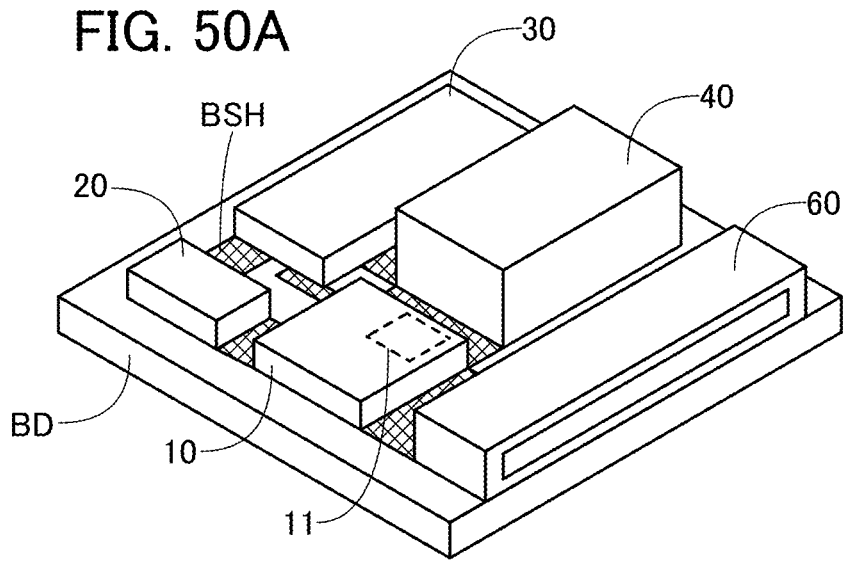
FIG. 50A is a perspective view illustrating a structure example of a computer.

Specifically, the computer has a structure illustrated in FIG. 50A, for example. The computer includes a motherboard BD, and an arithmetic processing unit (e.g., a processor and a CPU) 10, a main memory (e.g., a DRAM (Dynamic Random Access Memory)) 30, a storage (e.g., a three-dimensional NAND memory device or a 3D OS NAND memory device) 40, an interface 60, and the like are provided on the motherboard BD. Although an SRAM (static random access memory) 20 that also functions as a main memory is illustrated in FIG. 50, it is not necessarily provided on the motherboard BD.

Note that FIG. 50 illustrates a structure in which the arithmetic processing device 10 includes a register 11.

In FIG. 50A, the arithmetic processing device 10 is electrically connected to the SRAM 20, the main memory 30, the storage 40, and the interface 60. The main memory 30 is electrically connected to the SRAM 20 and the storage 40.

Note that the components of the computer in FIG. 50A are electrically connected to one another through a bus line BSH. This means that as the number of components of the computer increases or the motherboard BD increases in size, the bus line BSH to be routed lengthens; thus, the power consumption required for signal transmission increases.

The components of the computer in FIG. 50A may be integrated into one chip to form a monolithic IC (integrated circuit). In this case, the data processing device described in the above embodiment can be used as the main memory 30 and the storage 40. The case where the computer in FIG. 50A is made as a monolithic IC in this manner is illustrated in FIG. 50B.

Figure 50B:
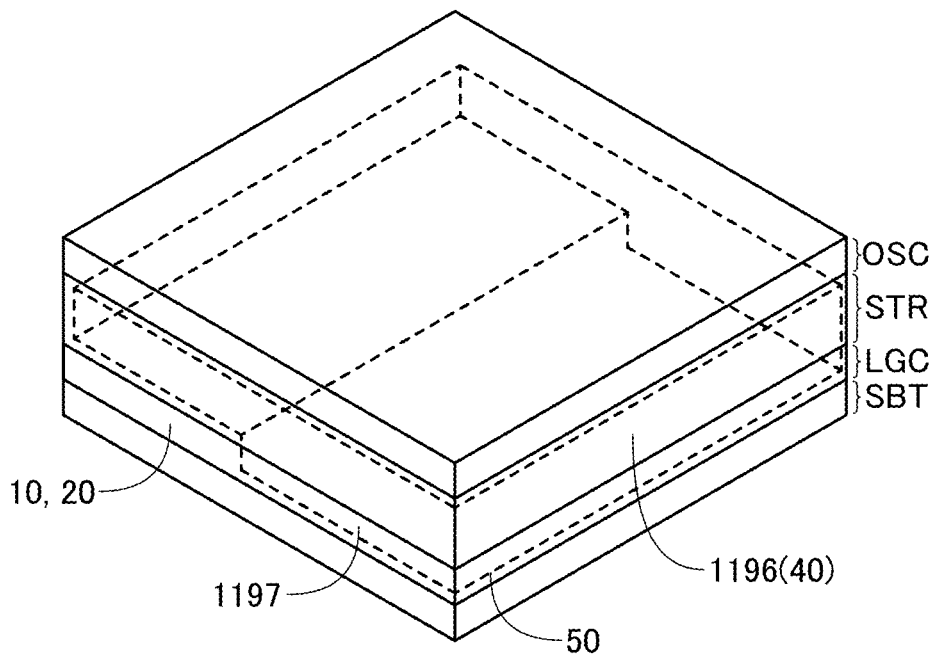
FIG. 50B is a perspective view illustrating a monolithic IC.

The monolithic IC in FIG. 50B includes a circuit layer LGC over a semiconductor substrate containing Si. The monolithic IC also includes a memory layer STR over the circuit layer LGC and a circuit layer OSC over the memory layer STR.

The circuit layer LGC includes a plurality of circuits including Si transistors formed on a semiconductor substrate SBT containing Si, for example. As part of the plurality of circuits, the arithmetic processing device 10, the SRAM 20, and the like in FIG. 50A can be used, for example. In the case where the data processing device is used as the main memory 30 and the storage 40, part of the plurality of circuits can be the controller 1197 included in the data processing device 50.

In particular, by using a Si transistor for the SRAM 20, for example, the drive frequency of the SRAM can be increased.

The memory layer STR functions as a memory portion including a Si transistor and/or an OS transistor. The memory layer STR can be, for example, a three-dimensional NAND memory circuit, a 3D OS NAND memory circuit, or the like. Thus, the memory layer STR includes a memory portion 1196 in the data processing device, the storage 40 in FIG. 50A, and the like.

The use of the 3D OS NAND memory circuit can reduce the power consumption of the monolithic IC in FIG. 50B.

The circuit layer OSC includes a plurality of circuits including OS transistors, for example. As part of the plurality of circuits, for example, a circuit that is different from the circuits included in the circuit layer LGC, such as the arithmetic processing device 10 and the SRAM 20, can be used.

In the monolithic IC in FIG. 50B, the bus line BSH to be routed on the motherboard is not provided, resulting in short lines electrically connecting the components. Accordingly, the power consumption required for signal transmission can be reduced.

The monolithic IC in FIG. 50B also includes the data processing device 50. Thus, the data processing device 50 functions as both the storage 40 and the main memory 30 in FIG. 50A. Therefore, in the monolithic IC in FIG. 50B, the memory portion 1196 of the memory layer STR can function as the main memory 30.

The bus line BSH is not provided and the memory portion 1196 is used as an alternative to the main memory 30, whereby the circuit area in the monolithic IC in FIG. 50B can be smaller than that in the computer in FIG. 50A.

Figure 51A:
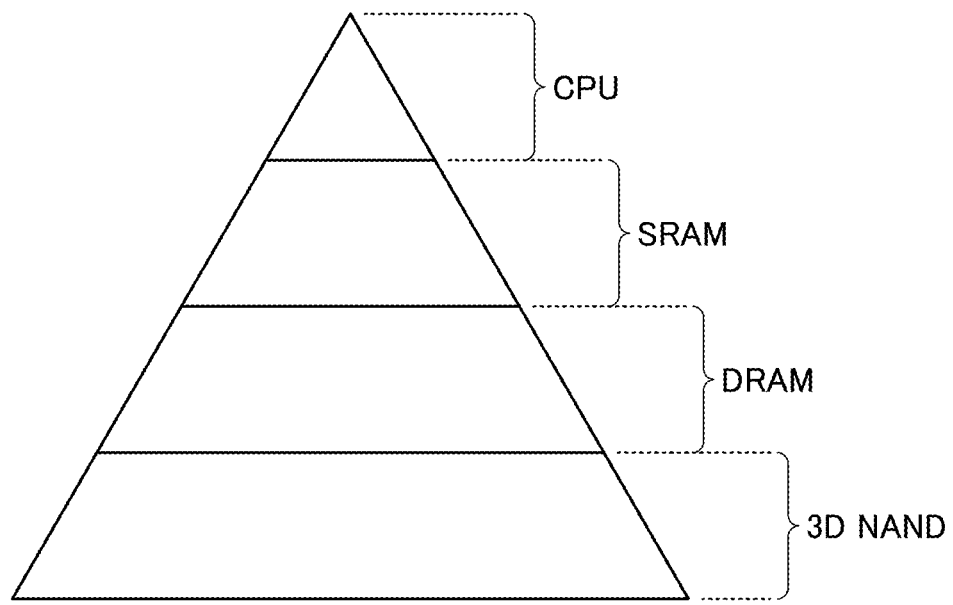
FIG. 51A and FIG. 51B are diagrams illustrating memory hierarchies of the computer and the monolithic IC, respectively.
Figure 51B:
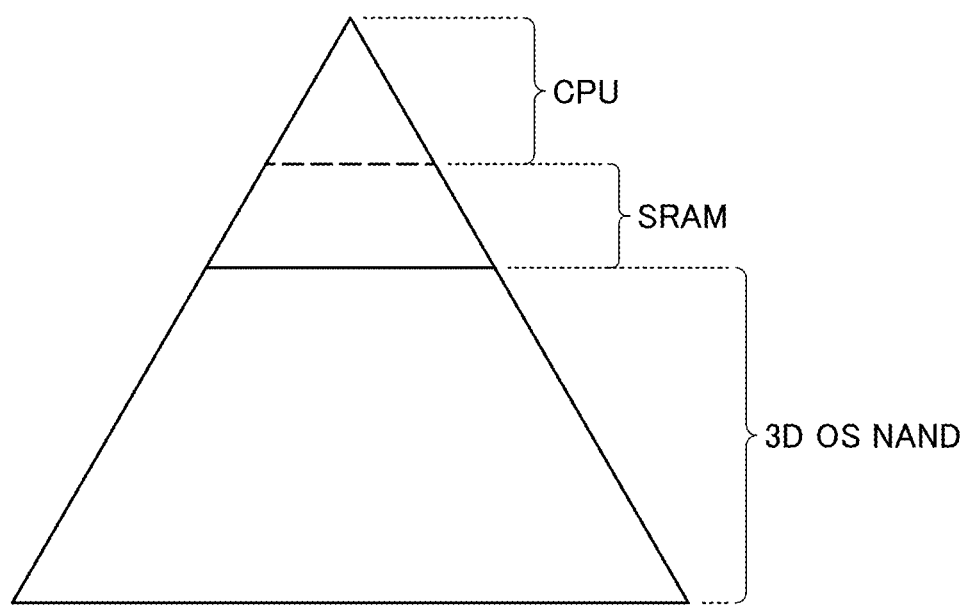

FIG. 51A and FIG. 51B show memory hierarchy examples of the computer in FIG. 50A and the monolithic IC in FIG. 50B, respectively.

In a general memory hierarchy, memory devices at the upper levels require higher operation speed, and memory devices at the lower levels require larger storage capacity and higher record density. For example, FIG. 51A illustrates, in order from the top, a register included in the CPU (the arithmetic processing device 10), the SRAM, the DRAM included in the main memory 30, the three-dimensional NAND memory circuit included in the storage 40.

The register included in the arithmetic processing device 10 and the SRAM are used for temporary storage of arithmetic operation results, for example, and thus is frequently accessed by the arithmetic processing device 10. Accordingly, a high operating speed is required rather than storage capacity. The register also has a function of retaining settings of the arithmetic processing device, for example.

The DRAM included in the main memory 30 has a function of retaining a program or data read from the storage 40, for example. The recording density of a DRAM is approximately 0.1 to 0.3 Gbit/mm$^2$.

The storage 40 has a function of retaining data that needs to be stored for a long time and a variety of programs used in the arithmetic processing device, for example. Therefore, the storage 40 needs to have large storage capacity and high record density rather than operation speed. The record density of a memory device used for the storage 40 is approximately 0.6 to 6.0 Gbit/mm$^2$. Thus, a three-dimensional NAND memory circuit, a hard disk drive (HDD), or the like is used as the storage 40.

Since the monolithic IC in FIG. 50B functions as the storage 40 and the main memory in FIG. 50A, the memory hierarchy of the monolithic IC in FIG. 50B is as shown in FIG. 51B.

In other words, in the monolithic IC in FIG. 50B, a memory cell included in the memory portion of the data processing device 50 can be used not only as a cache memory of the memory portion but also as the main memory 30 in the computer in FIG. 50A. Accordingly, the main memory 30 such as a DRAM does not need to be provided in the monolithic IC in FIG. 50B, resulting in a smaller circuit area in the monolithic IC in FIG. 50B and lower power consumption required for the operation of the main memory 30 such as a DRAM.

Note that the structure of the monolithic IC illustrated in FIG. 50B is an example and is not limited to one embodiment of the present invention. The structure of the monolithic IC illustrated in FIG. 50B may be changed depending on the situation. For example, in the case where a high-speed memory of 1 GHz or higher is required as the SRAM in the monolithic IC in FIG. 50B, the SRAM may be included in the arithmetic processing device.

Note that this embodiment can be implemented in appropriate combination with the other embodiments described in this specification.

Embodiment 5

In this embodiment, an example of a chip 1200 that is a kind of semiconductor device on which the memory device of the present invention is mounted will be described with reference to FIG. 52A and FIG. 52B. A plurality of circuits (systems) are mounted on the chip 1200. The technology for integrating a plurality of circuits (systems) into one chip is referred to as system on chip (SoC) in some cases.

Figure 52A:
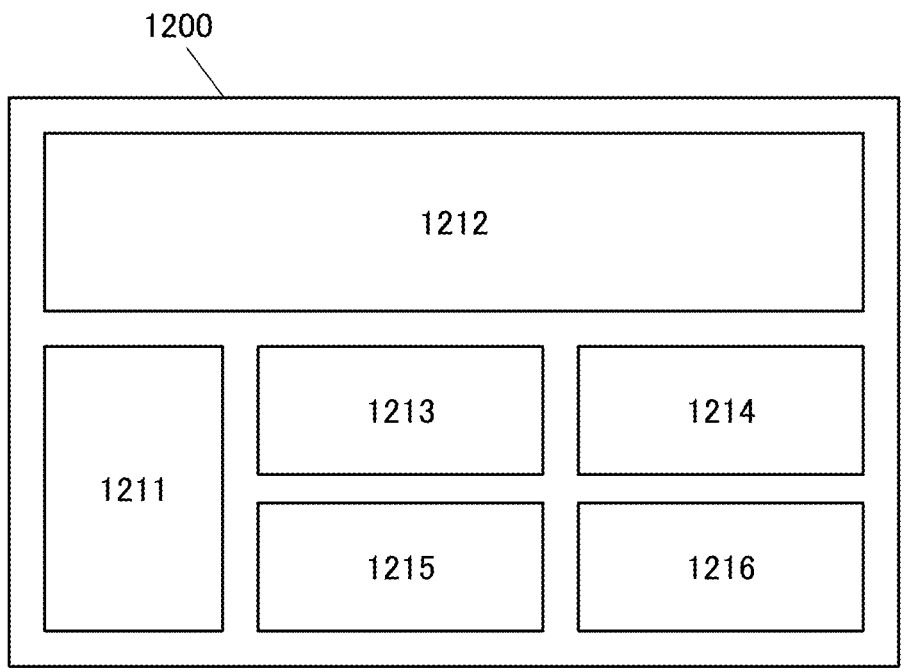
FIG. 52A is a schematic view of a semiconductor device.

As illustrated in FIG. 52A, the chip 1200 includes a CPU 1211, a GPU 1212, one or a plurality of analog arithmetic portions 1213, one or a plurality of memory controllers 1214, one or a plurality of interfaces 1215, one or a plurality of network circuits 1216, and the like.

Figure 52B:
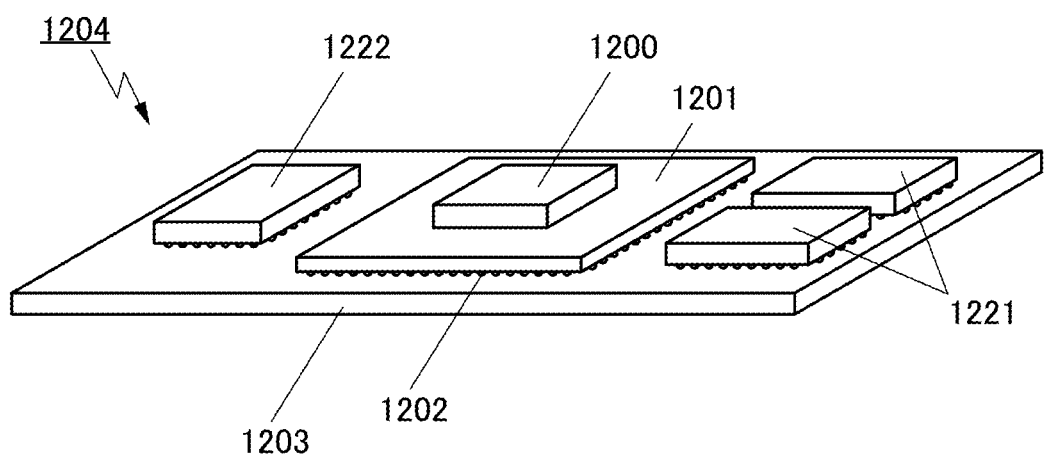
FIG. 52B is a perspective view of the semiconductor device.

A bump (not illustrated) is provided on the chip 1200, and as illustrated in FIG. 52B, the chip 1200 is connected to a first surface of a printed circuit board (PCB) 1201. A plurality of bumps 1202 are provided on the rear side of the first surface of the PCB 1201, whereby the PCB 1201 is connected to a motherboard 1203.

The motherboard 1203 may be provided with a sensor 1221, a power supply circuit 1222, or the like.

The CPU 1211 preferably includes a plurality of CPU cores. The GPU 1212 preferably includes a plurality of GPU cores. The CPU 1211 and the GPU 1212 may each include a memory for temporarily storing data. Alternatively, a common memory for the CPU 1211 and the GPU 1212 may be provided on the chip 1200. Moreover, the GPU 1212 is suitable for parallel computation of a number of data and thus can be used for image processing or a product-sum operation. When an image processing circuit or a product-sum operation circuit is provided in the GPU 1212, image processing and a product-sum operation can be performed with low power consumption.

Since the CPU 1211 and the GPU 1212 are provided on the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic portion 1213 includes one or both of an A/D (analog/digital) converter circuit and a D/A (digital/analog) converter circuit. Furthermore, the product-sum operation circuit may be provided in the analog arithmetic portion 1213.

The memory controller 1214 includes circuits that function as a controller and an interface of the memory device of one embodiment of the present invention.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit for the connection to a LAN (Local Area Network) or the like. The network circuit 1216 may further include a circuit for network security.

The circuits (systems) can be formed on the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the PCB 1201 on which the chip 1200 including the GPU 1212 is mounted, the sensor 1221, and the power supply circuit 1222 can be referred to as a GPU module 1204.

The GPU module 1204 includes the chip 1200 using the SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments and the like.

Embodiment 6

In this embodiment, application examples of the semiconductor device using the memory device described in the above embodiment will be described. The memory device described in the above embodiment can be used for a variety of removable memory devices such as memory cards (e.g., SD cards), USB memories, and SSDs (solid state drives). FIG. 53A to FIG. 53E schematically illustrate some structure examples of removable memory devices. The semiconductor device described in the above embodiment is processed into a packaged memory chip and used in a variety of storage devices and removable memories, for example.

Figure 53A:
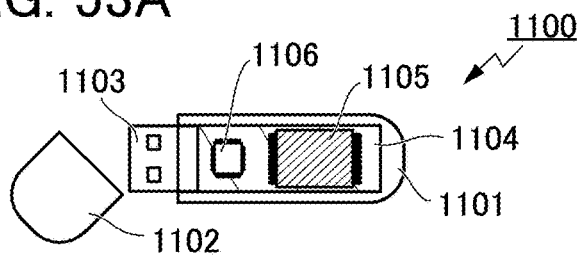
FIGS. 53A to 53E show examples of memory devices.

FIG. 53A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The memory device or the semiconductor device described in the above embodiment can be incorporated in the memory chip 1105 or the like.

Figure 53B:
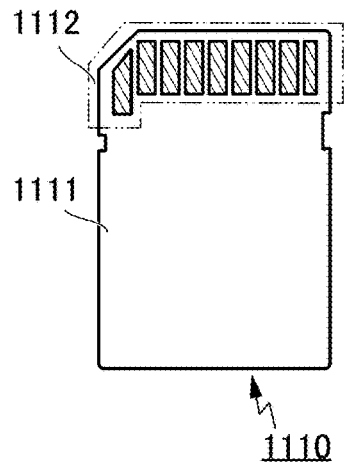
Figure 53C:
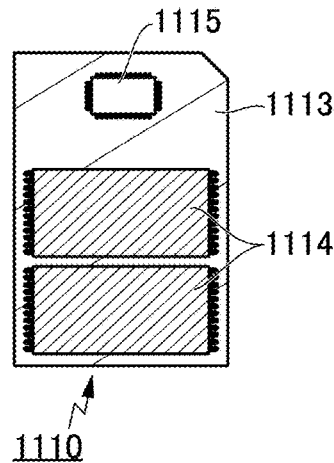

FIG. 53B is a schematic external diagram of an SD card, and FIG. 53C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. In that case, data can be read from and written to the memory chip 1114 through radio communication between a host device and the SD card 1110. The memory device or the semiconductor device described in the above embodiment can be incorporated in the memory chip 1114 or the like.

Figure 53D:
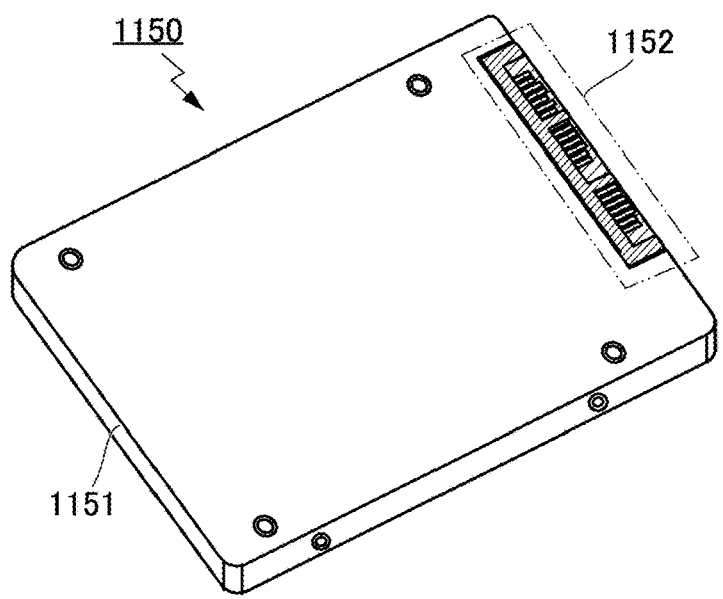
Figure 53E:
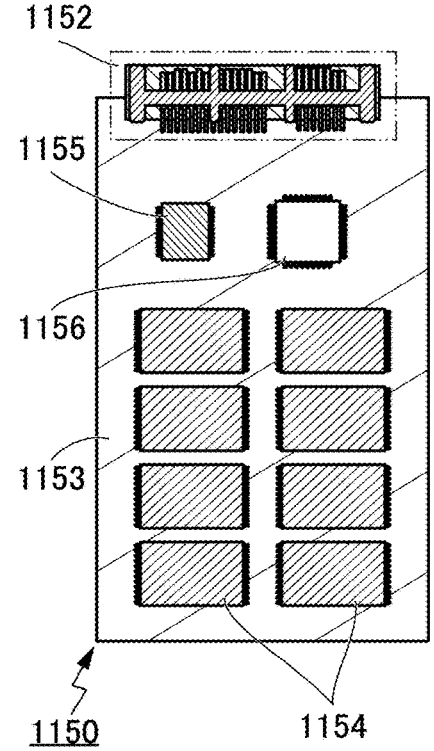

FIG. 53D is schematic external diagram of an SSD, and FIG. 53E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The memory device or the semiconductor device described in the above embodiment can be incorporated in the memory chip 1154 or the like.

This embodiment can be implemented in an appropriate combination with the structures described in the other embodiments and the like.

Embodiment 7

FIG. 54A to FIG. 54G illustrate specific examples of electronic devices each provided with the memory device or the semiconductor device of one embodiment of the present invention.

Electronic Device System>

The memory device or the semiconductor device of one embodiment of the present invention can be incorporated into a variety of electronic devices. Examples of electronic devices include an information terminal, a computer, a smartphone, an e-book reader, a television device, digital signage, a large game machine such as a pachinko machine, a digital camera, a digital video camera, a digital photo frame, a mobile phone, a portable game machine, a video recording/reproducing device, a navigation system, and an audio reproducing device. Here, the computer refers not only to a tablet computer, a notebook computer, and a desktop computer, but also to a large computer such as a server system.

The electronic device of one embodiment of the present invention may include an antenna. When a signal is received by the antenna, a video, data, or the like can be displayed on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

[Information Terminal]

With the memory device or the semiconductor device of one embodiment of the present invention, a memory device for storing a microcontroller program can be configured. Thus, according to one embodiment of the present invention, a microcontroller chip can be downsized.

Figure 54A:
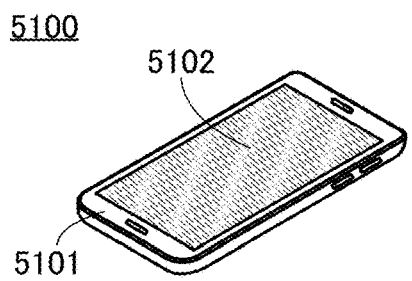
FIG. 54A to FIG. 54G are diagrams illustrating structure examples of electronic devices.

FIG. 54A illustrates a mobile phone (smartphone), which is a type of information terminal. An information terminal 5100 includes a housing 5101 and a display portion 5102. As input interfaces, a touch panel is provided in the display portion 5102, and a button is provided in the housing 5101. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 54B:
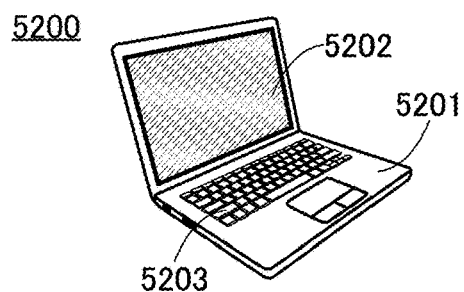

FIG. 54B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIG. 54A and FIG. 54B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machine]

Figure 54C:
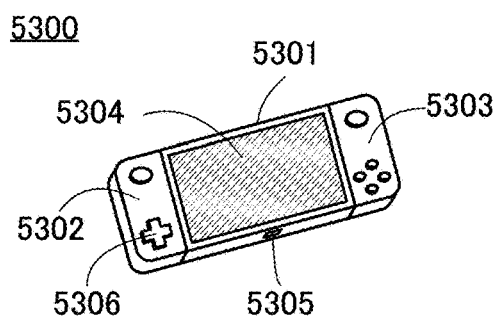

FIG. 54C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In that case, the housing 5302 and the housing 5303 can each function as an operating unit. Thus, a plurality of players can play a game at the same time. The memory device, the semiconductor device, or the like of one embodiment of the present invention can be incorporated into a chip provided on a substrate in the housing 5301, the housing 5302 and the housing 5303, for example.

Figure 54D:
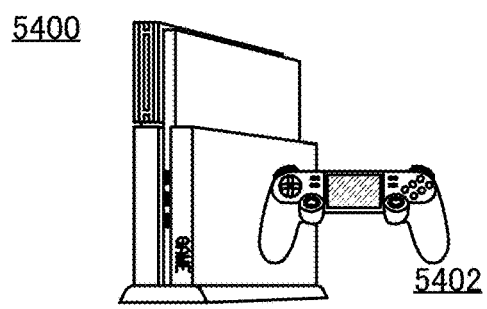

FIG. 54D illustrates a stationary game machine 5400 as an example of a game machine. A controller 5402 is wired or connected wirelessly to the stationary game machine 5400.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although the portable game machine and the stationary game machine are illustrated as examples of game machines in FIG. 54C and FIG. 54D, the game machine using the microcontroller of one embodiment of the present invention is not limited thereto. Examples of game machines using the microcontroller of one embodiment of the present invention include an arcade game machine installed in entertainment facilities (a game center, an amusement park, or the like) and a throwing machine for batting practice installed in sports facilities.

[Large Computer]

The memory device, the semiconductor device, or the like of one embodiment of the present invention can be used in a large computer.

Figure 54E:
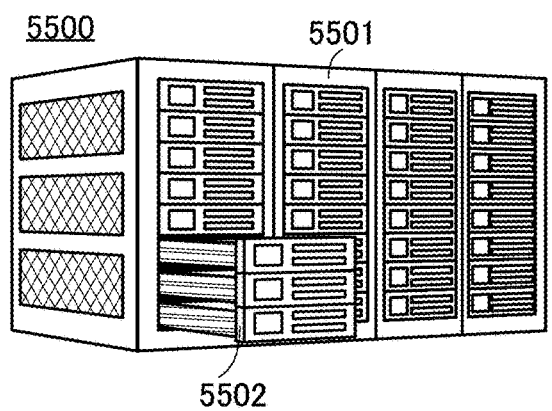
Figure 54F:
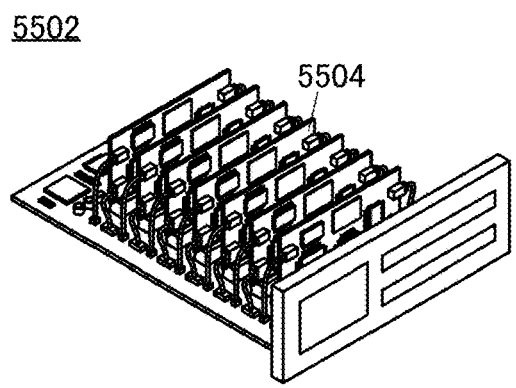

FIG. 54E illustrates a supercomputer 5500 as an example of a large computer. FIG. 54F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, and a microcontroller of one embodiment of the present invention can be mounted on the substrates. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although the supercomputer is illustrated as an example of a large computer in FIG. 54E and FIG. 54F, a large computer using the microcontroller of one embodiment of the present invention is not limited thereto. Examples of a large computer using the microcontroller of one embodiment of the present invention include a computer that provides service (a server) and a large general-purpose computer (a mainframe).

[Household Appliance]

Figure 54G:
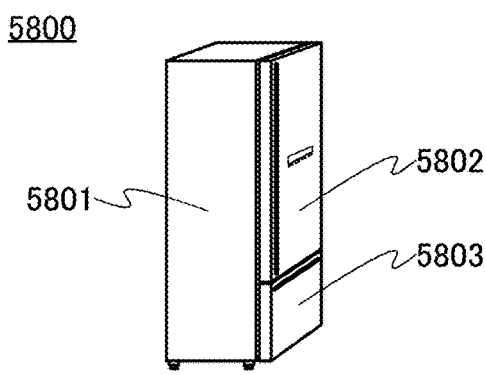

FIG. 54G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

Although the electric refrigerator-freezer is described as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, their effects, and the like described in this embodiment can be combined as appropriate with the description of another electronic device.

This embodiment can be implemented in an appropriate combination with the structures described in the other embodiments and the like.

REFERENCE NUMERALS

100 memory device, 110 memory cell array, 117 insulator, 118 insulator, 119 conductor, 120 memory string, 121 base, 122 conductor, 123 insulator, 124 insulator, 125 semiconductor, 126 insulator, 127 semiconductor, 128 conductor, 129 insulator, 130 conductor, 132 insulator, 134 conductor, 136 conductor, 137 conductor, 138 insulator, 141 opening, 150 insulator, 152 insulator, 156 insulator, 161 conductor, 162 conductor, 163 conductor, 164 conductor, 171 conductor, 172 conductor, 173 conductor, 174 conductor, 179 material, 180 material, 181 material, 182 material, 183 material, 184 conductor, 185 insulator, 186 insulator, 187 conductor, 188 insulator, 189 insulator, 200 semiconductor device, 2000 driver circuit, 2001 WSL driver, 2002 WBL driver, 2003 RSL driver, 2004 RBL driver, 2005 WWL driver, 2006 RWL driver, 2007 SEL driver

The invention claimed is:

1. A memory device comprising:
a first conductor;
a second conductor above the first conductor;
a third conductor above the second conductor;
a fourth conductor above the third conductor;
a fifth conductor above the fourth conductor;
a sixth conductor above the fifth conductor;
a seventh conductor;
a first insulator;
a second insulator;
a first semiconductor; and
a second semiconductor,
wherein an opening is provided through at least the second conductor, the third conductor, the fourth conductor, the fifth conductor, and the sixth conductor and reaches a top surface of the first conductor,
wherein the first insulator, the first semiconductor, the seventh conductor, the second insulator, and the second semiconductor are provided in this order from an outside in a first region of the opening that overlaps with the third conductor,
wherein the first insulator, the first semiconductor, the second insulator, and the second semiconductor are provided in this order from the outside in a second region of the opening that overlaps with the fourth conductor,
wherein the first semiconductor comprises a first portion in direct contact with a top surface of the second conductor and a second portion in direct contact with a side surface of the fifth conductor, and
wherein the second semiconductor comprises a first portion in direct contact with the top surface of the first conductor and a second portion in direct contact with a side surface of the sixth conductor.

2. The memory device according to claim 1, wherein the first insulator, the first semiconductor, the seventh conductor, the second insulator, and the second semiconductor are each provided as a concentric layer in the first region of the opening.

3. The memory device according to claim 1, wherein the first insulator, the first semiconductor, the second insulator, and the second semiconductor are each provided as a concentric layer in the second region of the opening.

4. The memory device according to claim 1, wherein the first semiconductor is a first oxide semiconductor.

5. The memory device according to claim 4,
wherein the first oxide semiconductor comprises indium, an element M, and zinc, and
wherein the element M is one or more selected from aluminum, gallium, yttrium, tin, and titanium.

6. The memory device according to claim 1, wherein the second semiconductor is a second oxide semiconductor.

7. The memory device according to claim 6,
wherein the second oxide semiconductor comprises indium, an element M, and zinc, and
wherein the element M is one or more selected from aluminum, gallium, yttrium, tin, and titanium.

8. The memory device according to claim 1, wherein in a cross-sectional view, the second insulator comprises a portion in direct contact with a side surface of the second conductor.

9. The memory device according to claim 1, wherein the first conductor is provided on a base.

10. A memory device comprising:
a first conductor;
a second conductor above the first conductor;
a third conductor above the second conductor;
a fourth conductor above the third conductor;
a fifth conductor above the fourth conductor;
a sixth conductor above the fifth conductor;
a seventh conductor;
a first insulator;
a second insulator;
a first semiconductor; and
a second semiconductor,
wherein an opening is provided through at least the second conductor, the third conductor, the fourth conductor, the fifth conductor, and the sixth conductor and reaches a top surface of the first conductor,
wherein the first insulator, the first semiconductor, the seventh conductor, the second insulator, and the second semiconductor are provided in this order from an outside in a first region of the opening that overlaps with the third conductor,
wherein the first insulator, the first semiconductor, the second insulator, and the second semiconductor are provided in this order from the outside in a second region of the opening that overlaps with the fourth conductor,
wherein the first semiconductor comprises a first portion in direct contact with a top surface of the second conductor and a second portion in direct contact with a side surface of the fifth conductor,
wherein the second semiconductor comprises a first portion in direct contact with the top surface of the first conductor and a second portion in direct contact with a side surface of the sixth conductor,
wherein the first conductor is configured to be a reading source line,
wherein the second conductor is configured to be a writing source line,
wherein the fifth conductor is configured to be a writing bit line, and
wherein the sixth conductor is configured to be a reading bit line.

11. The memory device according to claim 10, wherein the first insulator, the first semiconductor, the seventh conductor, the second insulator, and the second semiconductor are each provided as a concentric layer in the first region of the opening.

12. The memory device according to claim 10, wherein the first insulator, the first semiconductor, the second insulator, and the second semiconductor are each provided as a concentric layer in the second region of the opening.

13. The memory device according to claim 10, wherein the first semiconductor is a first oxide semiconductor.

14. The memory device according to claim 13,
wherein the first oxide semiconductor comprises indium, an element M, and zinc, and
wherein the element M is one or more selected from aluminum, gallium, yttrium, tin, and titanium.

15. The memory device according to claim 10, wherein the second semiconductor is a second oxide semiconductor.

16. The memory device according to claim 15,
wherein the second oxide semiconductor comprises indium, an element M, and zinc, and
wherein the element M is one or more selected from aluminum, gallium, yttrium, tin, and titanium.

17. The memory device according to claim 10, wherein in a cross-sectional view, the second insulator comprises a portion in direct contact with a side surface of the second conductor.

18. The memory device according to claim 10, wherein the first conductor is provided on a base.

* * * * *